(12) United States Patent
Katoh et al.

(10) Patent No.: US 6,173,433 B1
(45) Date of Patent: Jan. 9, 2001

(54) CIRCUIT DESIGN SYSTEM, IMAGE PROCESSING METHOD AND MEDIUM OF THE CIRCUIT DESIGN SYSTEM

(75) Inventors: Katsumi Katoh; Kaname Jinguji, both of Ibaraki (JP)

(73) Assignee: Nippon Telegraph and Telephone Corporation, Tokyo (JP)

(*) Notice: Under 35 U.S.C. 154(b), the term of this patent shall be extended for 0 days.

(21) Appl. No.: 08/940,123

(22) Filed: Sep. 29, 1997

(30) Foreign Application Priority Data

Sep. 30, 1996 (JP) .................................................. 8-280044
Jun. 25, 1997 (JP) .................................................. 9-168414

(51) Int. Cl.$^7$ .................................................. G06F 17/50
(52) U.S. Cl. .................................................. 716/1; 716/11
(58) Field of Search .................. 395/500.01, 500.02, 395/500.12; 364/468.28, 468.04; 716/1, 2, 11

(56) References Cited

U.S. PATENT DOCUMENTS

| | | | |
|---|---|---|---|
| 4,656,603 | * 4/1987 | Dunn | .................. 364/900 |
| 4,813,013 | * 3/1989 | Dunn | .................. 364/900 |
| 5,046,016 | * 9/1991 | Krill et al. | .................. 364/488 |
| 5,604,886 | * 2/1997 | Kawashima et al. | .......... 395/500.01 |

FOREIGN PATENT DOCUMENTS 599469  6/1994  (EP).
694 858  1/1996  (EP).

OTHER PUBLICATIONS

Scarmozzino, et al., "Rapid Design and Fabrication of New Photonic Integrated Circuits for Lightwave Systems", Proceedings of the SPIE, vol. 2613, Oct. 1995, no. pg#s.

Wulf, et al., "Computer Aided Design of Integrated Optical Circuits", *Frequenz*, vol . 45, No. 9/10, Sep. 1, 1991, pp. 202–206.

Koh, et al., "Modeling, Simulation and Verification of Photonic Integrated Circuits Using VHDL", Proceedings of the SPIE, vol. 2695, Jan. 30, 1996, USA, pp. 234–241.

"Integrated Software for RF/Microwave Design", *Microwave Journal*, vol. 39, No. 1, Jan. 1, 1996, pp. 188–189.

Ladouceur, et al., "A New General Approach to Optical Waveguide Path Design", *Journal of Lightwave Technology*, vol. 13, No. 3, Mar. 1, 1995, pp. 481–492.

Katoh, et al., Proceedings of the IEICE General Conference, C–3–1, p. Mar. 24–27, 1997, Kansai University, Suita, Japan.

* cited by examiner

Primary Examiner—Paul R. Lintz
Assistant Examiner—Leigh Marie Garbowski
(74) *Attorney, Agent, or Firm*—Fitch, Even, Tabin & Flannery

(57) ABSTRACT

The present invention enables waveguides to be simply laid out, wherein the correlationship between a curvilinear graphic connecting two points together and the positions of these two points is specified beforehand and stored in a RAM in the form of rule of virtual path generation, when a mouse is used to specify the connection terminals of two blocks on a display screen, a CPU receives an instruction for generation of virtual paths, and the CPU then references the rule of virtual path generation to automatically generate a virtual path connecting the connection terminals of the two blocks and to draw it on the display screen.

124 Claims, 60 Drawing Sheets

| RULE ITEM | CONTENTS |
|---|---|
| CONNECTION RULE BETWEEN TERMINALS AND PATH END POINTS | 1. ASSOCIATION BETWEEN CONNECTION TERMINALS OF BLOCKS AND END POINTS OF VIRTUAL PATH (POSITIONS OF END POINTS AND DIRECTION OF VIRTUAL PATH AT END POINTS) |
| GENERATION RULE OF PATH CIRCLES | 2. POSITION AND RADII OF END POINT PATH CIRCLES |
| SELECTION RULE OF VIRTUAL PATH CIRCLES | 3. METHOD FOR SELECTING FOUR VIRTUAL PATHS BY COMBINING ROTATIONAL DIRECTIONS OF END POINT PATH CIRCLES |

*FIG.4*

| RULE OF VIRTUAL PATH GENERATION | CLASSIFICATION OF RULE OF VIRTUAL PATH GENERATION ITEMS | CONTENTS OF RULE OF VIRTUAL PATH GENERATION |
|---|---|---|
| | 1. CONNECTION RULE FOR END POINTS (POSITIONS AND DIRECTIONS OF END POINTS) | a. POSITIONS OF END POINTS OF VIRTUAL PATH ARE ALIGNED WITH POSITIONS OF CONNECTION TERMINALS<br>b. DIRECTIONS OF END POINTS ARE OPPOSITE TO DIRECTIONS OF CONNECTION TERMINALS |
| | 2. RADII OF END POINT PATH CIRCLES | c. TWO RADII ARE EQUAL |
| | 3. CONDITION FOR SELECTING FOUR VIRTUAL PATHS BY COMBINING ROTATIONAL DIRECTIONS OF END POINT PATH CIRCLES | d. VIRTUAL PATH LENGTH IS MINIMUM |

*FIG.5*

| TARGET PATH CIRCLE | PATH CIRCLE EDITING ITEM |
|---|---|
| END POINT AND MIDDLE PATH CIRCLES | ADDITION |
| | REMOVAL |
| | MOVEMENT |
| | CHANGE RADIUS |
| | CHANGE ROTATIONAL DIRECTION |

FIG.6

| SHAPE | TARGET GRAPHIC FOR ASSOCIATION |
|---|---|
| REAL PATH | REAL PATH HAS A WIDTH AND IS NOT ALWAYS A CURVE GRAPHIC ELEMENT IS DISCONTINUOUS | VIRTUAL PATH |
| VIRTUAL PATH | VIRTUAL PATH DOES NOT HAVE A WIDTH AND IS BASED ON A CURVE GRAPHIC ELEMENT IS CONTINUOUS | BLOCK CONNECTION TERMINALS |

*FIG.7*

| | |
|---|---|
| BLOCK | BASE POINT AND DIRECTION POINTER TO CONNECTION TERMINAL LIST |
| CONNECTION TERMINAL | POINTER TO BLOCK TO WHICH THE CONNECTION TERMINAL BELONGS POSITION AND DIRECTION POINTER TO ASSOCIATED VIRTUAL PATH |
| VIRTUAL PATH | POINTER TO TWO CONNECTION TERMINALS TO WHICH THE VIRTUAL PATH BELONGS POSITIONS AND DIRECTIONS OF TWO END POINTS RULE OF VIRTUAL PATH GENERATION (INCLUDING INFORMATION ON ASSOCIATION WITH CONNECTION TERMINALS) POINTER TO ASSOCIATED REAL PATH |
| REAL PATH | POINTER TO VIRTUAL PATH TO WHICH THE REAL PATH BELONGS VIRTUAL PATH TO REAL PATH CONVERSION RULE |

*FIG.9*

| FLAG NAME | ON/OFF |
|---|---|
| PATH DISPLAY | 1/0 |
| OFFSET DISPLAY | 1/0 |
| IDENTICAL CONNECTION TERMINAL DISPLAY | 1/0 |
| I/O CONNECTION TERMINAL DISPLAY | 1/0 |
| NON-CONNECTION TERMINAL | 1/0 |
| VIRTUAL PATH CIRCLE | 1/0 |

*FIG.24* ent of the layout
of circuit elements on the display screen.

CIRCUIT DESIGN SYSTEM, IMAGE PROCESSING METHOD AND MEDIUM OF THE CIRCUIT DESIGN SYSTEM

BACKGROUND OF THE INVENTION

1. Field of the Invention

The present invention relates to an optical circuit design system for designing an optical circuit such as a silica- or $LiNbO_3$-based circuit, a semiconductor circuit, or MMIC (hereafter referred to as an "optical circuit") that is a circuit for propagating optical beams or microwaves, using the image processing of a computer, and to its image processing method and recording medium.

2. Description of the Prior Art

First, the characteristics of an optical circuit are described.

In an optical circuit, waveguides through which light propagates are generally formed on a planar substrate using a photolithographic process. Circuit elements formed can be classified into those which are functionally integrated (hereafter referred to as "functional circuit elements") and those which connect the functional circuit elements together (hereafter referred to as "wiring circuit elements"). The functional circuit elements implement functions such as optical branching, combining, filtering and switching and there are strong constraints among component graphics of these elements. The wiring circuit elements, however, have conditions such as the cross sectional shapes and refractive indices of the wiring waveguides, but their paths can be arbitrarily selected unless optical propagation loss can be maintained at a specified level.

The optical propagation loss depending on the shape of the optical waveguide can be classified into bending loss that depends on the curvature of the waveguide and transition loss that occurs at a position at which the curvature changes. Thus, with respect to the shape of the waveguide, a circular shape is more advantageous than shapes such as a spline, a Bezier curve, and a curve formed by combining trigonometric functions because its curvature remains unchanged to prevent transition loss. Consequently, the wiring circuit element often uses a combination of a straight line and a circular arc. The difference between the straight line and the circular arc can be neglected depending on the shape of the waveguide or the difference between a core and a clad in specific refractive index. In addition, in a wiring circuit element comprising a combination of a straight line and a circular arc, the straight line has a negligibly small optical propagation loss compared to the circular arc. Thus, such a wiring circuit element is normally evaluated using the radius and length of the circular arc. In a simpler form, such an element is designed so that the minimum radius of the circular arc has a specified value or larger.

Since the photolithographic process generally used in the LSI fabrication technique is used to produce an optical circuit as described above, a photomask to which a circuit pattern is transferred must be produced. Therefore, it is conventional to design an optical circuit or the like by inputting a circuit pattern with CAD, and editing the layout of circuit elements on the display screen.

The above optical circuit is characterized in that:

(1) curves are used as circuit elements, in that:
  (2) the connections of the circuit elements and the layout of the overall circuit are essentially important because light propagates through the circuit, and in that: Thus, and optical circuit design system has the following performance requirements.

(a) The system can efficiently handle curves to be edited.

(b) The system can design the layout of the overall circuit easily.

In addition, since the integration and scale of optical circuits and the design time have recently been increased, it is efficient to reuse existing drawings. As a result, (c) an optical circuit design system that effectively functions despite partial changes in the circuit is important.

Design systems used to design optical circuits to which this invention is applicable are used for LSIs, printed boards, machines, and civil engineering and construction. First, the current situation of such design systems and their applicability to the design of optical circuits are described.

Design systems for LSIs have already grown to a large technical field. Particularly, there have been many studies of the electric wiring method and many such methods have been put to practical use. The electric wiring in an LSI, however, comprises straight lines, wherein the intersections of the wiring are passed through throughholes to form a two-, three- or more-dimensional multilayer wiring. Thus, such a electric wiring is currently expressed as a one-dimensional layout and significantly differs from that in optical circuits that fundamentally prohibit intersections. Therefore, the design system for LSIs is difficult to apply to optical circuits. In addition, recent design systems for LSIs have an additional function for handling curves, but such a function simply inputs graphics of the elements of the circuit as parts and no such systems meet the performance (b) or (c) required for the optical circuit design system as described above.

The characteristics of design systems for printed boards are similar to those of design systems for LSIs but such systems do not include a layout wiring method that manipulates circular arcs frequently used in optical circuits.

Design systems for machines have a function for enabling the use of not only circular arcs but also curves such as splines and Bezier curves. In this sense, such systems can be used as design systems for optical circuits. Thus, the efficiency of inputting has been improved by using this method as a base and registering various standard circuit elements as parts beforehand. This is the current technical level on which optical circuits are designed. The conventional techniques, however, have the following problems with the edition of the layout of the overall circuit, as comprehensively described at the end of this section.

Some design systems for construction or civil engineering associate graphical elements with one another. For example, design systems are known which associate a graphic of a room with graphics of columns so that if the position of any column is changed, the shape of the graphic of the room is automatically changed. This association focuses only on particular graphic elements within the drawing and has objects different from those of the association between graphics which is used to lay out the overall drawing. This also means that required association depends on the shapes of graphic elements. In these points, these design systems cannot be applied to design systems for optical circuits easily.

An example of a method for designing an optical circuit using a design system for machines, which is currently most popular, and its problems are described below.

Current design systems for machines generally prepare functional circuit elements as standard circuit parts beforehand and inputs a layout by indicating the locations of these parts using a mouse. Wiring circuit elements (waveguides) are used to connect the laid-out parts together and drawn to design an optical circuit.

It should be noted that there are various constraints in connecting a waveguide between an output terminal of a circuit element and an input terminal of another circuit element. As an example of such constraints, light from an input terminal shall have a specific direction. As is apparent from FIG. 33, if a waveguide is connected which guides light from one circuit element 1000 to another circuit element 1007, it cannot be simply linearly connected.

More specifically, the direction 1003 of light from an output terminal of the circuit element 1000 must be aligned with the direction 1001 of light that passes through an optical waveguide 1004. To draw a connected waveguide that meets this constraint, the operator generates a circular arc with a certain curvature, connects one end of the circular arc to the output terminal of the circuit element 1000 in FIG. 33, and determines the position of the circular arc so that its direction is aligned with the direction of the output terminal. Likewise, a circular arc is connected to the other circuit element 1007. Finally, the ends of the two circular arcs are connected together by a straight line. In this case, the direction of the circular arcs must be aligned with the direction of the straight line.

In most cases, a single operation cannot successfully complete the drawing, and to complete the drawing, manual corrections must be provided by, for example, modifying the curvature or length of the circular arcs. Since whether the directions of the end of the circular arcs and the straight line are aligned is visually checked, an direction error may result when an optical circuit is really fabricated.

In addition, the end points of a circular circ have non-integers, so computations for the association for the position and direction of the end points are complicated. This is because current design systems do not include an established method for automating layout using publicly known circular arcs and splines.

In addition, the layout design of an optical circuit involves a large number of circuit elements and their positions must sometimes be changed during this process.

In such a case, the operator must re-connect the waveguide as described above, so the determination of the position of the waveguide has been a large problem in the design of optical circuits.

Finally, the problems with the prior art are listed.

Due to the lack of a method for automatically laying out graphics including curves (generally graphics comprising a group of multiple graphics) and an effective association method for compiling the layout of graphics including curves, current design systems input graphic elements independently of other already-input graphics while specifying their shapes, and associate only the graphic elements in part of the drawing with one another.

(a) Consequently, when part of the drawing is changed, the layout of at least all the adjacent graphics that must be inherently connected to that part or even the overall circuit must be changed, thereby requiring a large amount of time for edition.

(b) Due to the reason described in (a), it is often more efficient to generate a drawing by reusing existing drawings, so current design systems are wasteful in terms of the use of resources.

SUMMARY OF THE INVENTION

It is thus an object of this invention to provide an optical circuit design system capable of automatically determining a path for waveguides that connect circuit elements together using simple image processing, and its image processing method and recording medium.

It is another object of this invention to provide an optical circuit design system capable of contributing to the reduction of the operator's labor and to the improvement of locational accuracy in conjunction with the layout of waveguides, and its image processing method and recording medium.

This invention provides a circuit design system that represents as graphics multiple parts of a circuit and waveguides connecting the connection terminals of the parts to lay out the graphics on a display screen in order to lay out and design a circuit comprising the multiple parts and the waveguides, characterized in that the system comprises:

a storage means for storing information of a correlationship which is previously determined and shows correlationship among line information showing shape of a graphic of composed of a straight line and/or a curved line, positions and direction of two end points of the graphic which represents the waveguide an indicator for indicating the positions and directions of said two end points in the form of the positions and the directions of the connection terminal of said part;

an information processing means for obtaining the line information from the indicated positions and directions of the two end points based on the correlationship information stored in said storage device;

and image processor for generating the graphic indicated by the line information obtained; and a display means for associating the generated graphic with the graphic of the part for display.

According to this invention, when the positions and directions of the connection terminals of two parts are indicated, a path for the waveguide that is to be installed between the two connection terminals, that is, a propagation path for optical waves or microwaves is automatically determined. To do this, the circuit design system generates a plurality of possible paths as candidates for the propagation path when the positions and directions of two points are given. One of the plurality of candidates which has the shortest length is determined as the propagation path. This path is formed of a straight line and a circular arc. The determined propagation path is represented by a linear and a circular graphics and displayed as a waveguide connecting the two connecting terminals together.

The user lays out multiple parts on the display screen and automatically determines a path for the waveguide between the parts to generate a layout of this circuit. To connect multiple laid-out circuits together using waveguides, the user can indicate the positions and directions of connection terminals to automatically determine a path for the waveguides. Even after the path for the waveguides has been determined and displayed, the user can change the position of any connection terminal to determine and display a new path for the waveguides. The curvature and number of circular arcs constituting the path can be varied by the user unless the propagation through the information-propagating medium is affected.

This invention provides the standard (blocks parts) in which their shapes can be changed according to parameters and the user can change these shapes as required. In conjunction with the determination of a path for the waveguides, this invention also has a function for aligning the multiple parts on the required position and direction, thereby eliminating misalignment.

According to this invention, since the circuit for which a layout is determined has a layered structure, when the user indicates a desired layer, the layout of the circuits or parts in that layer can be viewed.

Furthermore, this invention has a function for removing from the overall layout all the graphics of the waveguides displayed on the display screen and re-displaying them. Thus, the user can obtain a layout drawing with only circuits or with waveguides and circuits as required.

BRIEF DESCRIPTION OF THE DRAWINGS

FIG. 4 is an explanatory drawing showing the contents of rules used to generate virtual paths according to the embodiment of this invention;

FIG. 5 is an explanatory drawing showing rule of virtual path generation according to the embodiment of this invention;

FIG. 6 is an explanatory drawing showing editing items used in the case of three virtual path circles;

FIG. 7 is an explanatory drawing showing the difference between a real path and a virtual path;

FIG. 9 is an explanatory drawing showing the contents of layout information on virtual paths;

FIG. 24 is an explanatory drawing showing a design process;

DETAILED DESCRIPTION OF THE PREFERRED EMBODIMENT

Figure 1:
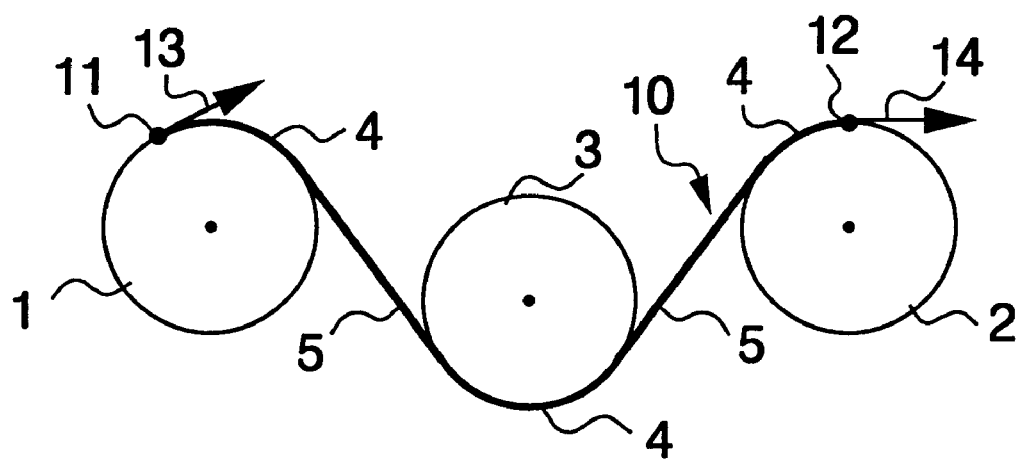
FIG. 1 shows the configuration of a virtual path generated according to an embodiment of this invention.

Embodiments of this invention are described below in detail with reference to the drawings.

This invention has been proposed to efficiently edit the layout of a drawing of a target design. Since, however, this invention provides novel functions, novel terms are used herein to describe these functions. Thus, to allow the description of the embodiments to be understood well and to prevent the terms from being ambiguous, important terms are defined first.

A block refers to a portion of a target drawing the shape of which is fixed during edition, specifically, parts of an optical circuits and a combination of these parts. A path refers to a portion of a route between blocks the shape of which is fixed, that is, waveguides. The path includes an real and a virtual paths. The real path represents a path formed by waveguides as in the prior art, but in this embodiment, means a path determined by automatic layout processing, which is described below. The virtual path means a plurality of candidate paths determined from the positions and directions of two blocks and rule of virtual path generation. One of the plurality of candidate paths which has the smallest length is determined as the real path.

A first characteristic of this embodiment is that when the positions of two blocks are determined and the connection of the waveguides are specified, the optical circuit design system automatically determines the real path.

A second characteristic is that once the real path has been determined, the shape of the real path connecting the connection terminals of the two blocks can be automatically changed when edition such as movement, rotation or re-shaping is executed on the blocks.

A third characteristic is that various manual operations and display screens related to the determination of the real path are improved, thereby significantly reducing the time required for layout design.

The basic concept of the automatic determination of an real path is described in the following sections.

a) Meaning of the classification into a block, a virtual path, and an real path.

b) Association between the connection terminal of block and the virtual path c) Roles and configuration of the virtual path d) Difference between the virtual path and the real path in characteristics and their association A block graphic is recognized as a fixed shape during automatic layout edition and has a block base point and a block base direction. Parameters such as length and width that indicate the shape of a standard circuit part are used to determine the shape of a block graphic, and this block graphic is drawn during layout design.

Next, the real paths connecting a plurality of blocks together are determined by the block position optimum editing processing of the optical circuit design system. A plurality of graphics (the blocks and the real paths) can be grouped as a new single block graphic. The new block graphic is formed of a plurality of curves (including straight lines) circumscribed around the above group of graphics and its geometry is determined from the geometry of the group of graphics. This operation is repeated to execute partial layout design until the overall drawing has been laid out and edited.

It should be noted that by executing grouping for partial layout design on the display screen of the optical circuit design system, the size of the grouped block graphics is reduced on the display screen, eliminating the need to prepare two drawings, that is, a partial and an overall layout drawings. In the optical design system according to this embodiment, when the internal configuration of the grouped blocks is to be viewed, it can be displayed on the display screen when the operator provides a corresponding instruction. Thus, the operator is released from an operation for displaying a detailed and an overall layout drawings as required, for example, an operation for retrieving the location at which the drawing is stored in the apparatus.

On the other hand, the real path is an object the shape of which is considered to be variable during automatic layout edition. The variable shape means that the real path can take any shape under specified conditions. The specified conditions include conditions that optical propagation loss has a specified value or less and that, for example, the curvature of curves has a specified value or more. To reduce optical propagation loss, however, a discontinued portion is provided between a straight line portion and a curve portion, a tapered portion is inserted into the path, or an optical propagation section is allowed to overlap an electrode section, thereby making the shape of the path unsuitable to automatic edition. Therefore, a virtual path that comprises a smooth curve and that can be used to uniquely determine the real path is introduced and automatically laid out before determining the position and shape of the real path.

b) Association between the connection terminals of blocks and virtual paths

A graphic of a connection terminal that inputs or outputs light to and from a block has as internal information at a position at which a graphic inside the block is connected to a graphic outside the block (hereafter referred to as a "connection position") and an direction indicating the advancing direction of light at that position (referred to as a "connection direction"). Since in an optical circuit, the directions of the connections of the circuit elements are always important, connection direction information is added to the layout position information on the connection terminals according to this invention.

In a virtual path, the positions of its end points and the direction at those positions are associated with the positions and directions of the connection terminals. As a simpler association method, for example, the positions and directions of the connection terminals are aligned with the position and direction of the virtual path, or the optical circuit is mixed with an electric circuit.

c) Roles and configuration of virtual paths

The object of the use of vertical paths is to automatically compute an real path between two associated connection terminals. To do this, this embodiment obtains a plurality of virtual paths based on the correlationship determined from the positions and directions of the connection terminals in order to select one of the plurality of virtual paths as an optimal one. The correlationship includes a constraint unique to the optical circuit, for example, a constraint that the curvature of waveguides must be within an allowable range. For this correlationship, this embodiment provides an association condition used to generate a virtual path from the positions and directions of the connection terminals and rules used to determine the optimal path under this condition.

These rules are called rule of virtual path generation. Since the optimal path is a straight line and/or a curved line without a width, the shape of waveguides with a width, that is, an real path is determined from the optimal path. A rule used to convert the optimal path into an real path is called a "virtual path-real path conversion rule."

Next, the configuration of a virtual path is described. According to this embodiment, the curve portion of the virtual path is a circular arc and a circle including the circular arc is called a "path circle." Path circles on which an end point of the virtual path is present are called "end point path circles," and the other path circles on which an middle portion of the virtual path is present are called "middle path circles." Thus, a single virtual path always has two end point path circles.

FIG. 1 shows the relationship between a path circle and a virtual path. In FIG. 1, a virtual path comprises a circular site 4 on each of two end point path circles (an end point path circle 1 and an end point path circle 2) and on one middle path circle 3; and two connection lines connecting the circular sites 4. The end points 1 and 2 of the virtual path are located on the circumference of the end point path circles 1 and 2, respectively.

Although the example of FIG. 1 includes one middle path circle 3, the number of middle path circles is generally not limited. The number and position of path circles (the end point and the middle path circles) are specified in the rule of virtual path generation. The radius of the path circle has an initial value specified in the rule of virtual path generation but can be set as required by the operator. In some cases, the virtual path cannot determined depending on the locational relationship between the path circles. In such a case, the optical circuit design apparatus determines that "there is no virtual path."

Figure 2A:
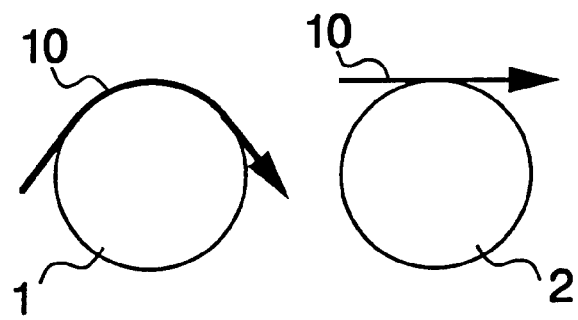
FIG. 2A and 2B are explanatory drawings showing the rotational directions of path circles defined according to the embodiment of this invention.
Figure 2B:
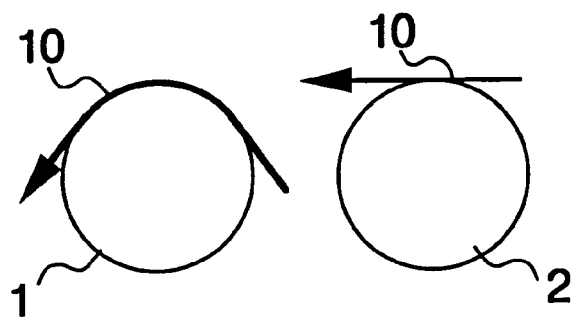
Figure 3A:
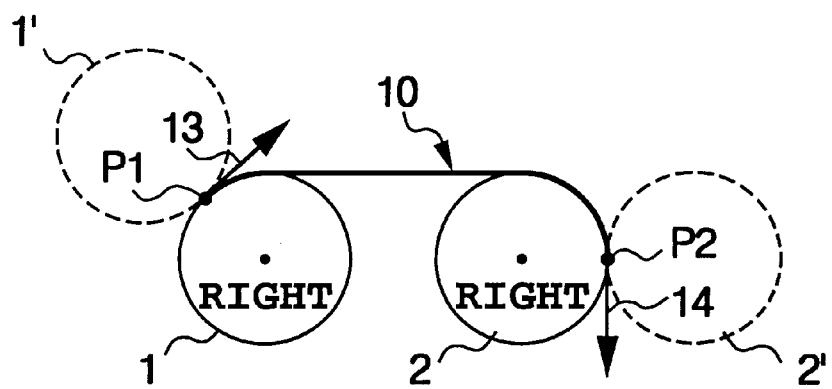
FIG. 3A to 3D are explanatory drawings showing possible combinations of virtual path circles according to the embodiment of this invention.
Figure 3B:
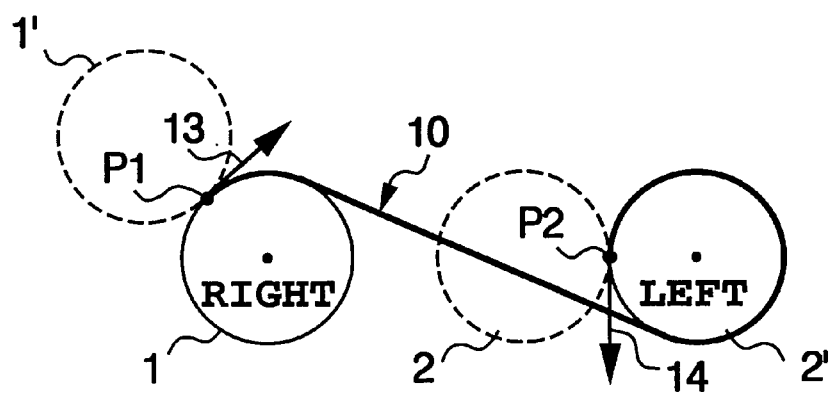
Figure 3C:
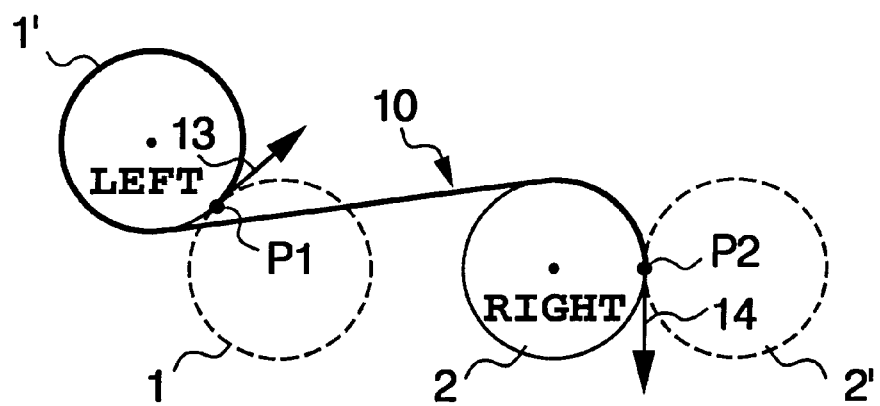
Figure 3D:
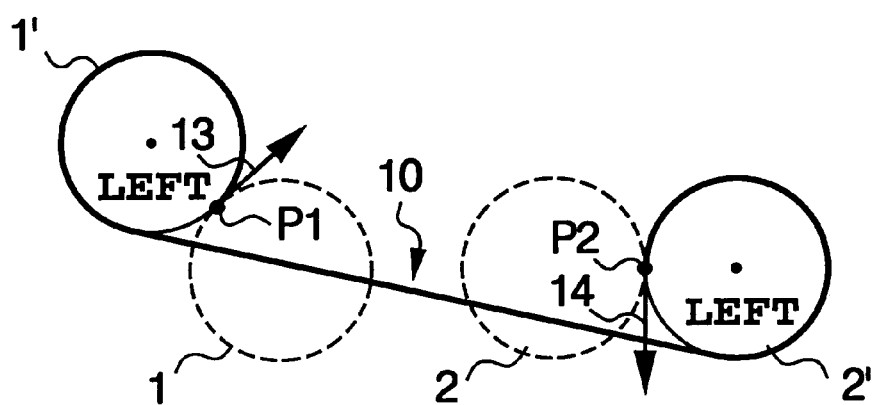

If one of the two end points of the virtual path 10 where light enters the virtual path is assumed to be a starting point, the other end point 12 of the virtual path is assumed to be an end point, and light is assumed to propagate on the virtual path in the direction from the starting point 11 to the end point 12 (the virtual path must be a smooth continuous curve), the rotational direction of the path circles can be defined from the advancing direction of light, as shown in FIG. 2A and 2B. That is, the direction in which the virtual path on a path circle rotates along the circumference of the path circle clockwise is assumed to be a "clockwise (or rightward) path circle" and the opposite direction is assumed to be a "counterclockwise (or leftward) path circle." The path circle is either a rightward or a leftward path circle.

Next, the rule of virtual path generation used to generate a virtual path is described.

The rule of virtual path generation have information required to generate a virtual path. One of the rule of virtual path generation which defines the association between a connection terminal and a virtual path (hereafter referred to as a "connection rule between terminals and path end points") can be used to determine the position of the two end points of the virtual path and the direction of the virtual path at these positions. One of the rule of virtual path generation which specifies the number, position, radius, and rotational direction of path circles can be used to uniquely determine the shape of the virtual path.

If the connection rule between terminals and path end points and the number and radius of path circles are given, a plurality of virtual paths can be present by changing the combination of the path circles in the rotational direction. FIG. 3A to 3D shows cases in which the number of path circles is two, that is, cases in which only two end point path circles are present. In the example in FIG. 3A to 3D, path circles 1, 1' having a starting point P1 and path circles 2, 2' having a starting point P2 are present, so combining these path circles results in 4 virtual paths at maximum as shown in FIGS. 3A to 3D.

Thus, by adding to the rule of virtual path generation, a rule that the length of the virtual path has the minimum value or that the total of the rotation angles of the circular portions of the virtual path has the minimum value, (hereafter referred to as a "selection rule of path circles"), one of the virtual paths can be determined as an optimal path.

FIG. 4 shows an example of the virtual path a circle generation rules wherein there are only two path circles, that is, end point path circles. In this example, the virtual path circle generation rules are composed of a table describing three rules. These are the connection rule between terminals and path end points, the generation rule of path circles, and the selection rule of virtual path circles. The connection rule between terminals and path end points indicates the association between a connection terminal of a block and an end point of a virtual path as described above. More specifically, this invention includes an equation that determines the position of an end point of the virtual path from the position of the end point of the block, as well as a function that invokes this equation, and this rule describes values that are provided to this function. In addition, this invention includes an equation that determines the direction of an end point of the virtual path from the direction of the end point of the block, as well as a function for this equation, and this rule describes values that are provided to this function. According to this embodiment, to allow it to be understood well, the equations and the functions are specified in such a way that the position of the end point of the block is identical to the position of the end point of the virtual path and that the direction of the end point of the virtual path is opposite to the direction of the block. According to this embodiment, the radii of the two end point path circles are identical, but they can be separately specified.

The generation rule of path circles describes values that determine the positions of the end point path circles. When the direction of the end point of the block is set to contact the end point path circle at the position of the end point, the center of the end point path circle lies on a line perpendicular to the direction and the distance between the end point and the center is equal to the radius of the end point path circle. Consequently, the center of the end point path circle can be determined from the position of the end point of the block and the radius of the end point path circle. An equation and function or a drawing instruction is defined and the generation rule of path circles describes values that are provided to this function.

The selection rule of virtual path circles defines equations that select an optimal path, that is, an equation that calculates the lengths of four virtual paths and an equation that identifies the minimum value of the calculated lengths, as well as a function for the equations, and describes values that are provided to this function.

Various constraints, for examples, a limit on the angle of the direction may be added to the above equations and stored in the form of a program executable by computers so that they can be executed in creating a virtual path. The contents of the rule of virtual path generation described above are only an example, and these rules are stored in a storage device (described below) in the form that can be referenced or processed by computers.

FIG. 5 shows an example in the form of a text for reference.

An increase in number of path circles is described below.

While a virtual path can be automatically generated if there are two path circles, this cannot deal with more complicated path shapes. Thus, if the user desires to generate a more complicated virtual path, the editing items for path circles shown in FIG. 6 are executed by the optical circuit design system.

Editing items for path circles in FIG. 6 are specified on the assumption that changes are sequentially made to a simple virtual path with, for example, two end point paths. The contents of the editing items are arbitrary as long as the virtual path can be uniquely determined. Detailed contents are described below with reference to an example of specific design.

d) Difference between a virtual path and an real path in characteristics and association between them An real path is an real design graphic, while a virtual path is a virtually introduced graphic. FIG. 7 shows the difference between these paths in characteristics. Since the real path is a graphic representing a waveguide, it has information on the width as well as information on the layout positions. In particular, when having offsets, the graphic elements of the real path are discontinuous and unsuitable to automatic layout edition. Thus, the processing time is reduced by computing the path using the virtual path instead of the real path.

On the contrary, the virtual path does not have a width because it is a curve used for computations. In addition, since it is handled as a combination of circles and straight lines, linear graphics for display are continuous.

First Embodiment

Figure 8:
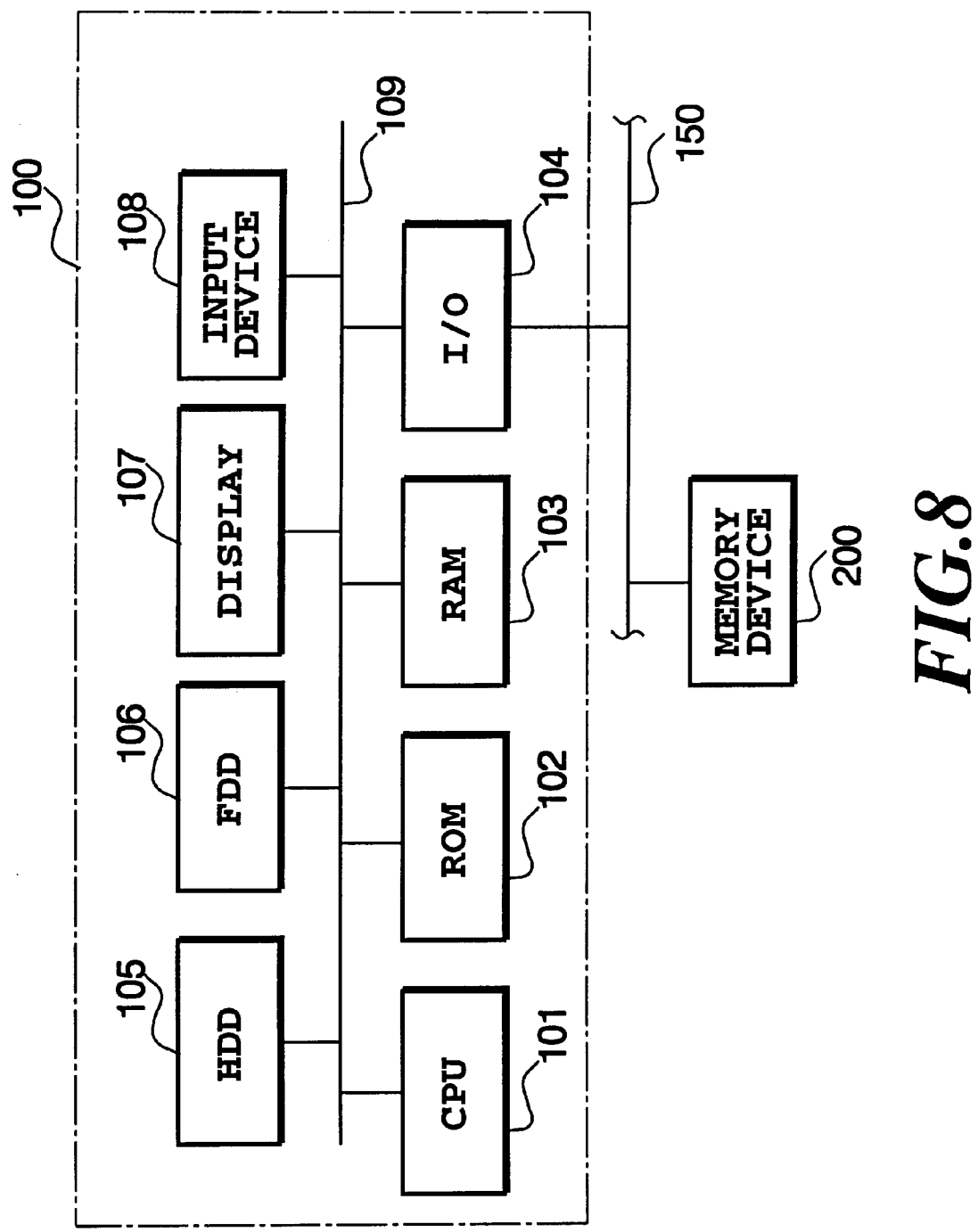
FIG. 8 is a block diagram showing a system configuration according to the embodiment of this invention.

Based on these points, a specific optical circuit design system. FIG. 8 shows the configuration of an optical circuit design system. In FIG. 8, 100 is an image processor comprising a general-purpose personal computer or a workstation incorporating image processing software.

The image processor 100 comprises a CPU 101, a ROM 102, a RAM 103, an input/output (I/O) interface 104, a hard disk drive (HDD) 105, a floppy disk storage device 106, a display 107, and an input device 108 including a mouse and a keyboard.

The CPU 101 executes system control on the circuit of the above configuration such as reads and writes from and to the HDD 105 and the display of information on the display 107 in response to an operating system. This control is already known and its detailed description is omitted. The CPU 101 designs an optical circuit in response to an image processing program according to this invention and various computation programs for the design of an optical circuit. The image processing program executes on the display, image processing for the edition of graphics. The image processing includes known processing such as the movement, rotation, mirroring, deletion, copying, and pasting of graphics. Thus, those portions of the processing which relate to this invention are described in detail, but known portions are simply described so as not to obstruct the understanding of this invention.

The computation programs execute computations for determining the path of optical waveguides according to this invention and various computations for grouping. As described below, these computation programs are activated for each function automatically or in response to an instruction from a popup menu on the display screen and executed by the CPU 101.

The ROM 102 stores a system activation program, a system program used to control the CPU 101 in order to control, for example, a display font, and various data. The RAM 103 has a working storage and a display image storage. The working storage temporarily stores I/O information for the CPU 101, for example, data input from a keyboard, data read from the HDD 105 for computations by the CPU 101, data temporarily stored in the middle of computations, the results of computations, character data on which display is based, format data for display, and data for storage in the HDD 105 or a storage device 200, which is described below.

The image storage stores images to be displayed on the display 107 and processed images. The images for display are transferred and displayed in synchronism with the display cycle of the display. A circuit for transferring the images for display may be a computer controlled by to the CPU 101 or a direct memory access controller.

The communication interface 104 is connected to a Local Area Network (LAN) 150 to transfer information between the image processor and the storage device 200.

The HDD 105 stores the operating system, image processing program, various computation programs, display font, various data used by the operating system, plural rules used to compute a virtual path, and information on a completed layout drawing and additional information. HDD 105 also stores block graphics displayed on the display screen and fixed graphic images in a circuit diagram.

The FDD 106 receives a floppy disk to read and write information from and to it. According to this embodiment, FDD 106 is used to install from the HSS 105, an optical circuit design program comprising the image processing and computation programs and related data.

The display 107 preferably display colors. The resolution is arbitrary. The display 107 displays images for display. The operator lays out and designs an optical circuit by displaying a layout drawing on the display screen of the display 107, laying out block graphics on the layout drawing, and connecting the block graphics with an real path. Information (collectively referred to as "layout information") comprising the positions of the block graphics located on the layout drawing, information on the circuit parts included in the block graphics, information on virtual paths, information on an real path is stored in the RAM 103 or the HDD 105 and updated in response to the movement, generation, or deletion of block graphics.

The input device 108 has a pointing device such as a mouse and a keyboard. When a click button is operated, the mouse indicates a specific position on the display screen, shows locational information, and allows commands or textual or numerical information to be input for information displayed at the indicated position on the display screen.

The LAN 150 connects the storage device 200 or a printer (not shown) to the image processor 100. The storage device 200 stores completed layout drawings for storage and data files for mask patterns generated based on the completed layout drawings.

Next, the contents of data used to design an optical circuit are described with reference to FIG. 9.

Block information includes locational information on a base point and base direction information. The base point is used as a base to describe the shapes of internal circuit parts and the positions of connection terminals. Block graphics are generated based on the base point and reduced or enlarged as required according to the reduction/enlargement rate of the layout drawing. The identification numbers assigned to the blocks are also included in the block information, as in the prior art. When a plurality of blocks are grouped, the block information is also grouped.

Connection information include a pointer to the block to which the connection terminal, that is, information on the address at which information on that block is stored; information on the relative position and direction of the connection terminal; and information on a virtual and an real paths to be connected. This pointer is used when information for association is required; it is used to change virtual path information when the virtual path is changed due to the movement of the block graphic or to change the display from the virtual path to the real path.

Virtual path information includes a pointer to information on two connection terminals to connect to; information on the two end points of the virtual path and each direction; virtual path rules; a pointer to an associated real path. The rule of virtual path generation include information on association with connection terminals.

Real path information includes a pointer to a corresponding virtual path and virtual-path-to-real-path conversion rules. This pointer is used to change the display from the real path to the virtual display.

Block information, connection terminal information, virtual path information, and real path information is separately stored in the RAM 103. Furthermore, this information is updated in response to a change in a related graphic, for example, a change in display position or shape.

This embodiment has characteristic image processing functions as well as the automatic virtual path computation function described above. These characteristic image processing functions are described below.

Figure 10:
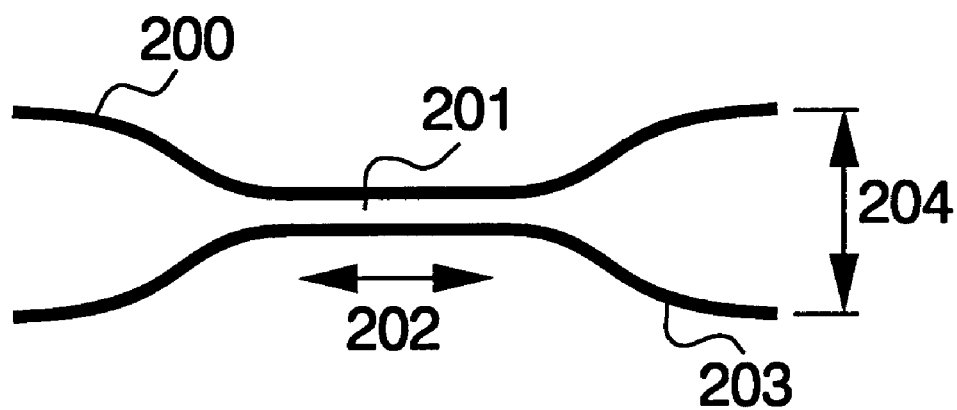
FIG. 10 is an explanatory drawing showing parameters of a standard circuit part.

First, a block grouping function is described. The maximum block is a standard circuit part. The standard circuit part is composed of a plurality of sets of information representing the shape of the part (shape information), and the shape information is classified into fixed information and information that can be changed by the user's settings. FIG. 10 shows a directional coupler as an example of a standard circuit part of an optical circuit. In the example in FIG. 10, the shape information comprises information on the circular radius of an S curve 200, a gap 201 in a coupling section, the length 202 of the coupling section, the width 203 of a waveguide, and the interval 204 of an I/O port.

Figure 11:
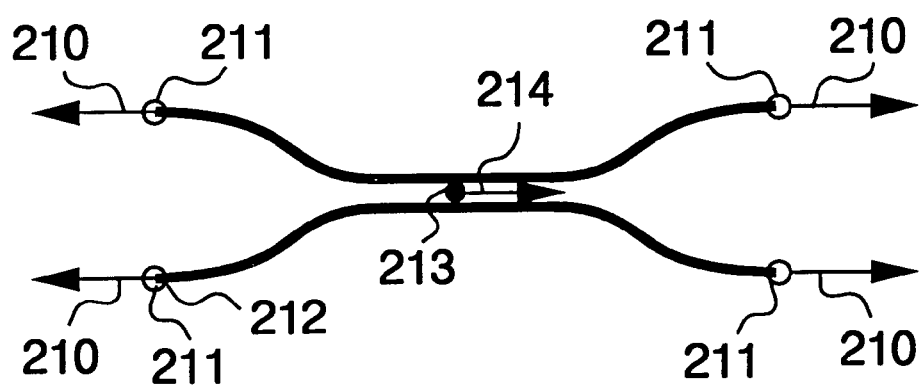
FIG. 11 is an explanatory drawing showing a graphic of a standard circuit part.

A connection terminal 211 is located at both ends of the directional coupler as shown in FIG. 11. the position of a connection terminal 211 is a relative position to a block base point 213. For reference, in FIG. 11, the direction of the connection terminal is shown by reference numeral 210 and the direction of the block base point 213 is shown by reference numeral 214 as the direction of the block.

Figure 12:
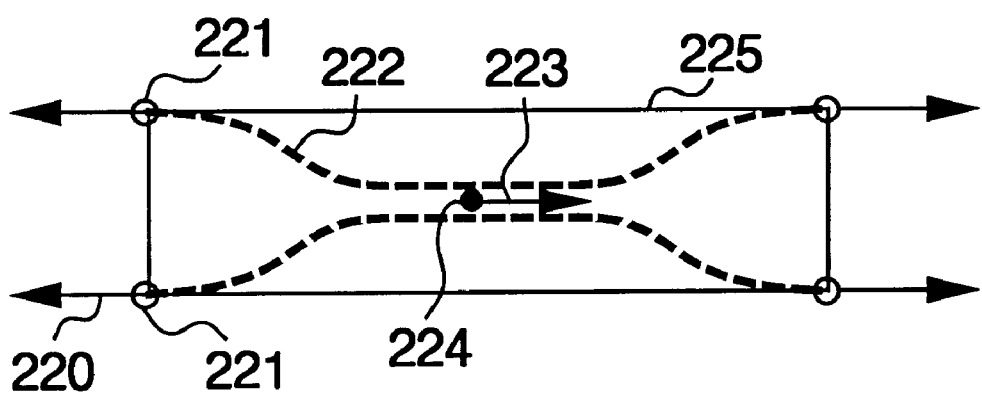
FIG. 12 is an explanatory drawing showing a block graphic.

The block graphic externally contacting the shape of the part in FIG. 12 can be determined from the information on the standard circuit part in FIG. 10 and information on the connection terminal in FIG. 11. In this case, a block graphic 225 can be generated by connecting four connection terminals 221 with straight lines and placing the graphics of the connection terminals 221 at the intersections of the straight lines. For reference, a graphic 222 within the block is shown by dotted lines and a connection terminal direction 220, a block base point 224, and a block base direction 223 are illustrated. Although the graphics of the block graphic 225 and the connection terminal 221 are required on the layout drawing, a graphic of the connection terminal direction 220 may be displayed.

Figure 15:
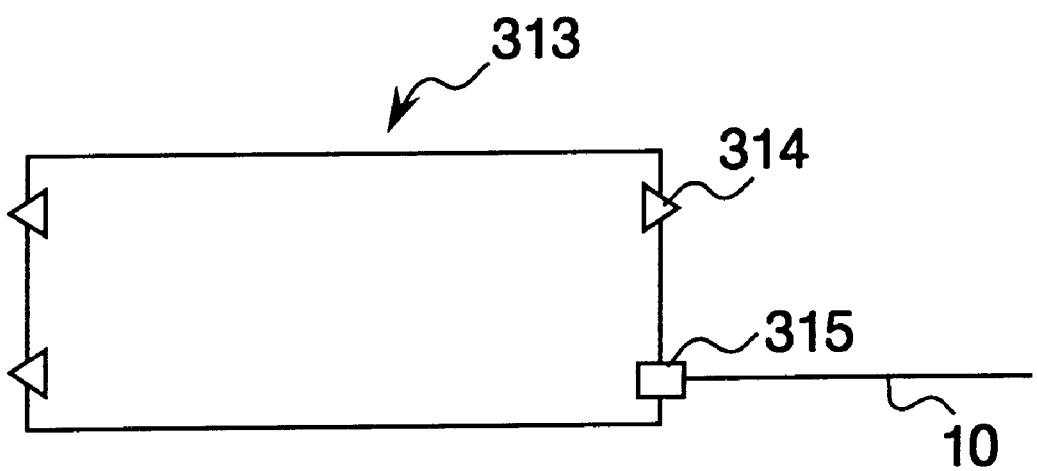
FIG. 15 is an explanatory drawing showing graphics of connection terminals.

According to this embodiment, in addition to a block graphic 313, a connection terminal is represented as a triangular graphic 314 if the virtual path has not been connected yet and this triangular graphic also represents the direction of a connection terminal, as shown in FIG. 15. If the virtual path is connected to the connection terminal, the terminal is represented by a rectangular graphic 315. By switching the shape of the connection terminal depending on whether or not the virtual path has been connected as described above, the connection/disconnection condition of the path can be determined without displaying the virtual or the real path. When viewing the layout of a plurality of block graphics on the drawing to move a specific graphic on the display screen, the operator can position the graphic more easily if the virtual or the real path is not displayed.

Figure 13:
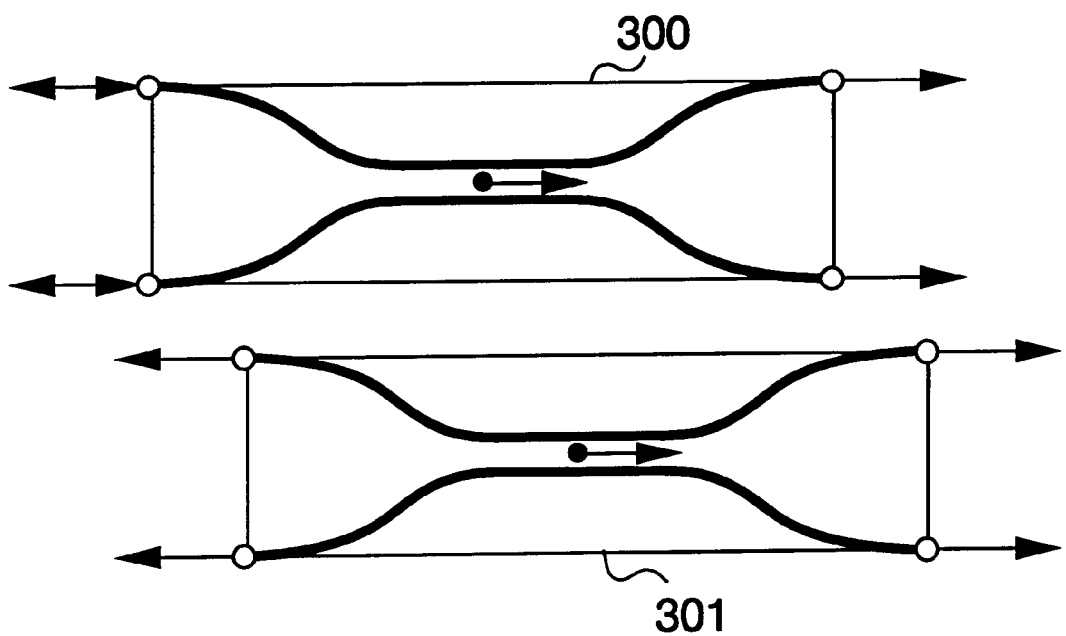
FIG. 13 is an explanatory drawing showing grouping.

To display two block graphics on the display screen for grouping as shown in FIG. 13, block graphics 300 and 301 to be grouped are specified. To do this, the block graphics to be grouped can be enclosed by a rectangular frame. Existing image processors include this function. When the operator moves the mouse while holding down the click button at an arbitrary position, a rectangular frame with the opposite angles comprising the position of the mouse cursor when the click button was pressed and the position when the cursor was stopped after movement appears on the display screen. When the operator releases the click button, the size of the rectangular frame is determined. By including the block graphics to be grouped in the rectangular frame, these blocks can be indicated to the image processor 100. Another method is to move the mouse cursor to the block graphics to be grouped and then to press the click button to indicate these blocks. In either method, the image processor 100 must be informed beforehand that the blocks are to be grouped.

Figure 14:
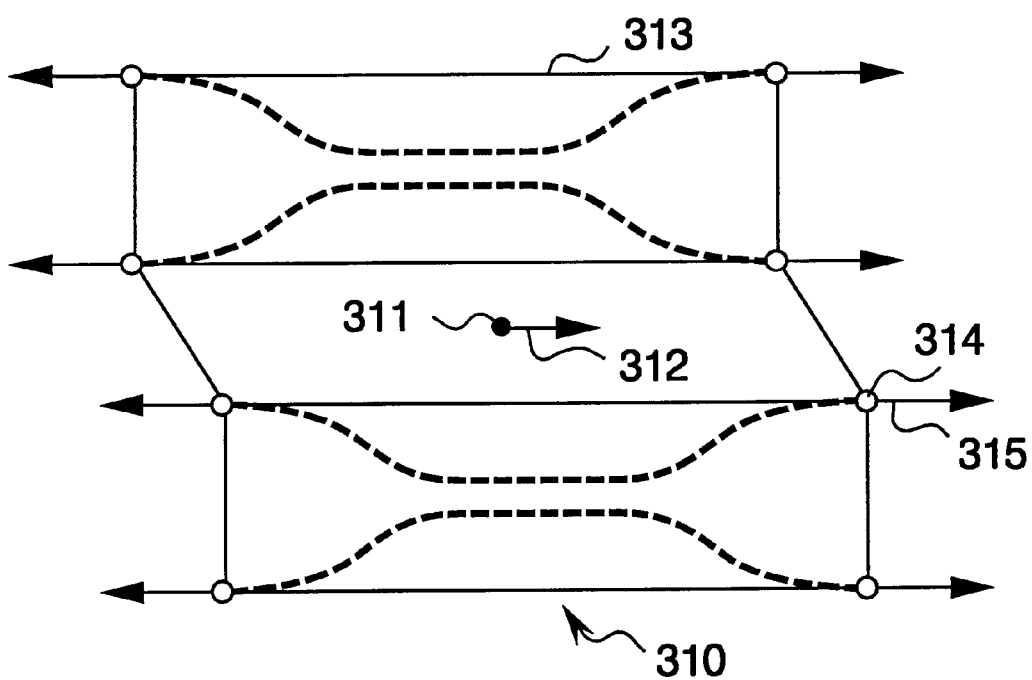
FIG. 14 is an explanatory drawing showing grouped blocks.

When the operator instructs the image processor 100 to execute grouping, the processor generates a graphic in which the connection terminals are connected together with curves including straight lines in such a way that the curves externally contact the original graphics (see FIG. 14), and adds to this graphic a graphic 311 indicating the reference position, a graphic 312 representing the direction of the block base, a graphic 314 of the connection terminal, and a graphic 315 representing the direction of the connection terminal in order to generate a new block graphic 313 for display. The connection terminal 314 of the new block graphic 313 may be changed according to the condition of the connection of the virtual path, as shown in FIG. 15.

Figure 16:
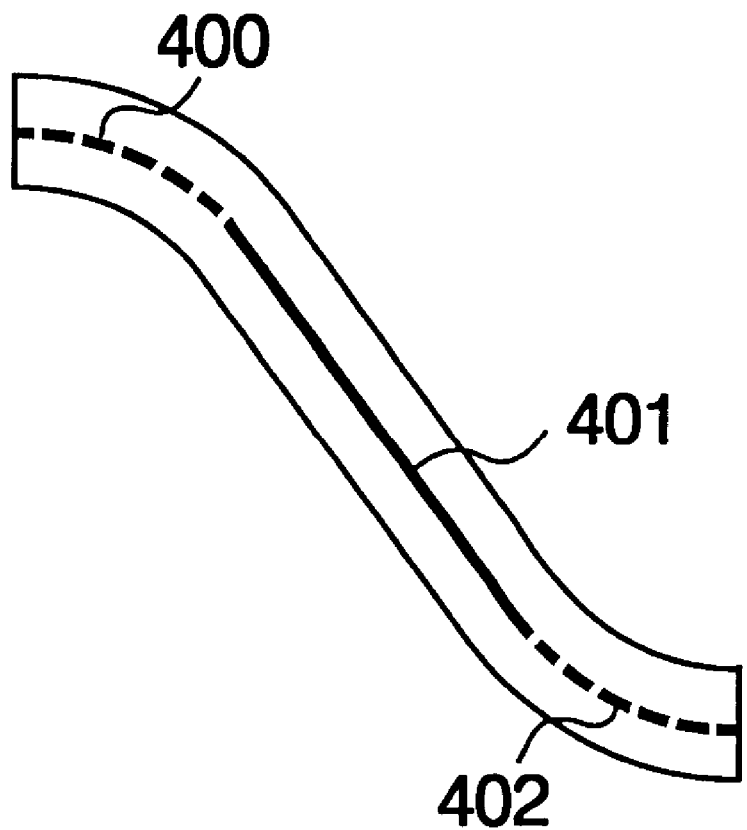
FIG. 16 is an explanatory drawing showing the shape of a real path.

An real path offset addition function is described. Light does not always travel along the centerline of a waveguide and is offset therefrom where the waveguide is bent. When a waveguide with a width, that is, an real path is generated by assuming the virtual path to be the centerline of the waveguide as shown in FIG. 16, light travels along the centerline in a straight line portion 401. It, however, offsets from the centerline in circular portions 400 and 402 and in an extreme case, leaks from the waveguide.

Figure 17:
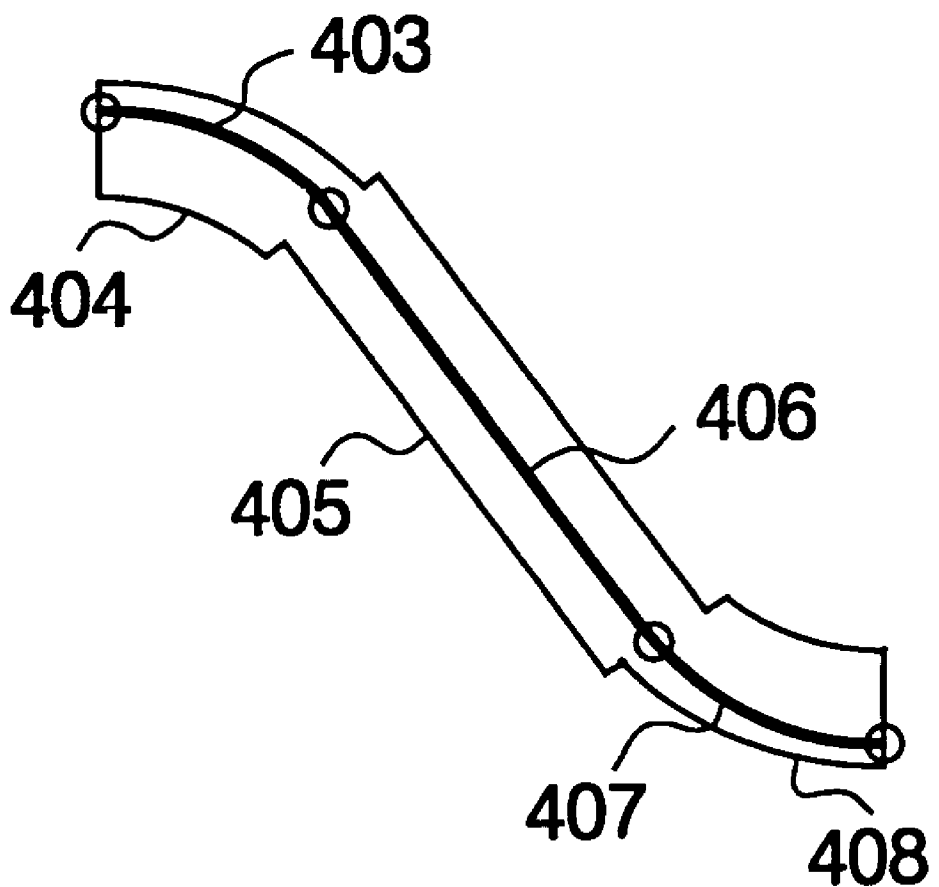
FIG. 17 is an explanatory drawing showing the shape of a real path with offsets.

To eliminate such a disadvantage, the offset of the advancing direction of light from the centerline is examined, and the circular portions 404 and 408 of the real path are disposed so as to be offset a specified width from the straight portion 405 so that light travels along the virtual path, as shown in FIG. 17. The amount of offset between the straight portion 405 of the real path and the circular portions 404 and 408 thereof is called "offset." FIG. 18 shows the advancing direction of light, that is, the virtual path when an offset is provided, and FIG. 19 shows the condition of the offset.

Figure 18:
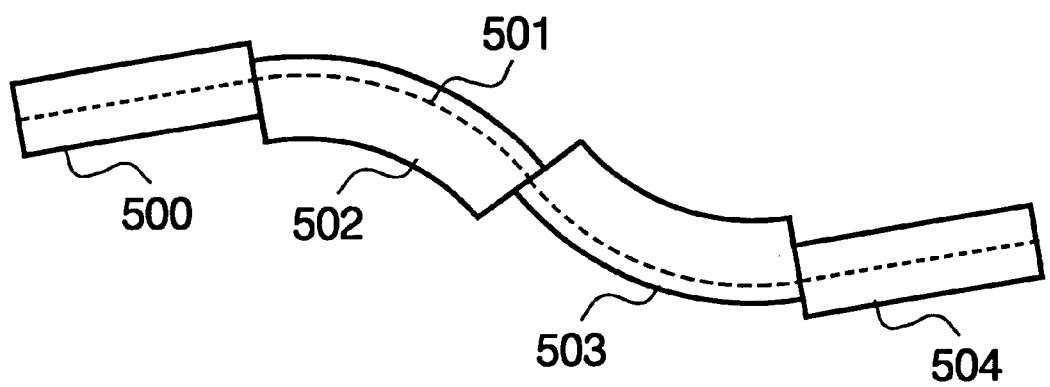
FIG. 18 is an explanatory drawing showing the shape of a real path with offsets.
Figure 19:
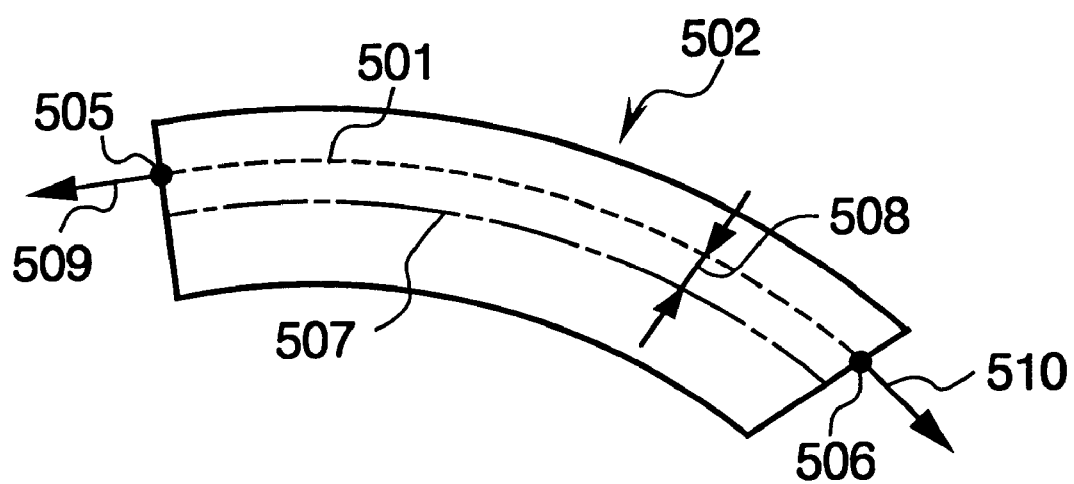
FIG. 19 is an explanatory drawing showing the shape of a real path with offsets.

In FIG. 18, reference numerals 500 and 504 designate straight portions of the real path. Reference numerals 502 and 503 denote circular portions of the real path. Reference numeral 501 indicates the virtual path. FIG. 19 shows the details of the circular portion 502. In FIG. 19, reference numeral 508 designates the offset between the virtual path 501 and the centerline of the real path. If such an offset is provided, a circular portion of the real path is assumed to be a single block, and locational information on end point positions 505 and 506 and information on directions 509 and 510 can be obtained.

The characteristic image processing function has been described, and the operation of the optical circuit design system in FIG. 8 is described below. When the image processing program in the HDD 105 is activated, the program is loaded in the RAM 103 and then executed by the CPU 101. The CPU 101 first causes a basic screen for layout design, which is shown in FIG. 20, to be displayed on the display screen of the display 107.

Figure 20:
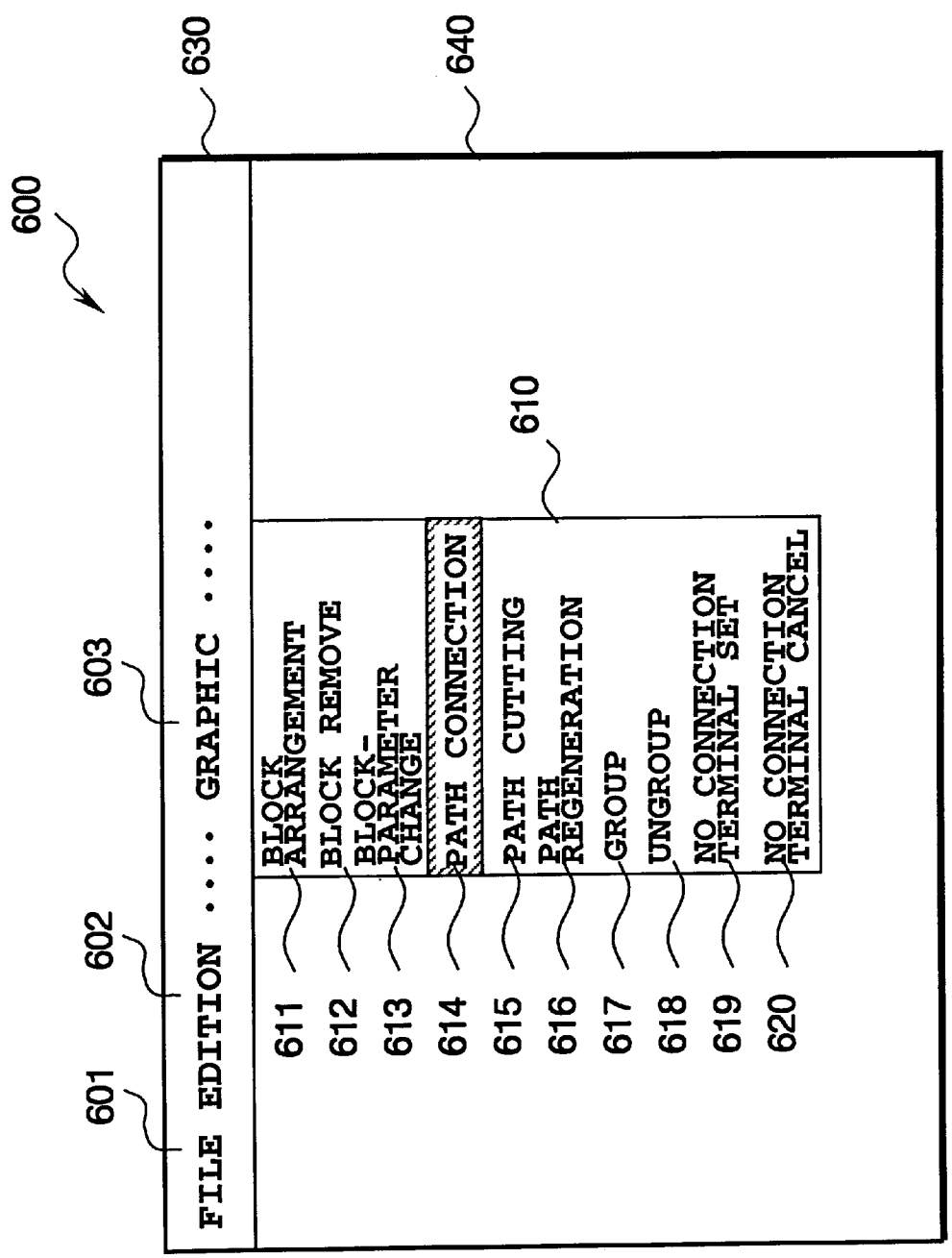
FIG. 20 is an explanatory drawing showing the contents of a menu screen.

The basic screen 600 in FIG. 20 is described. In FIG. 20, reference numeral 630 denotes a menu bar including a file item 601, a editing item 602, and a graphical processing item 603 as menu items. By using the mouse to indicate a particular menu item and operating the click button, a group of submenu items called a popup menu which belong to that particular menu item appears. By specifying a particular submenu item using the mouse, processing associated with this submenu item is executed. FIG. 20 shows a popup menu 610 in the graphical processing menu item 603 being selected. As in the prior art, the file menu item 601 has submenu items such as storage processing for storing generated layout drawings and layout information in the HDD 105 or the storage device 200 and processing for printing layout drawings.

The editing menu item 602 has submenu items specifying the copying, rotation, mirroring, deletion, and pasting of graphics. Conventional image processors include such processing, so it need not be described. The graphic menu item 603 according to this invention has submenu items 611 to 620 specifying block layout, block deletion, parameter change, path connection, path cut, path re-generation, grouping, ungrouping, non-connection terminal mode set, and non-connection terminal mode cancellation.

Reference numeral 640 designates a region within which a layout drawing is displayed. Within this region, the operator moves block graphics to specific positions and connect the blocks together with a virtual path.

Figure 28:
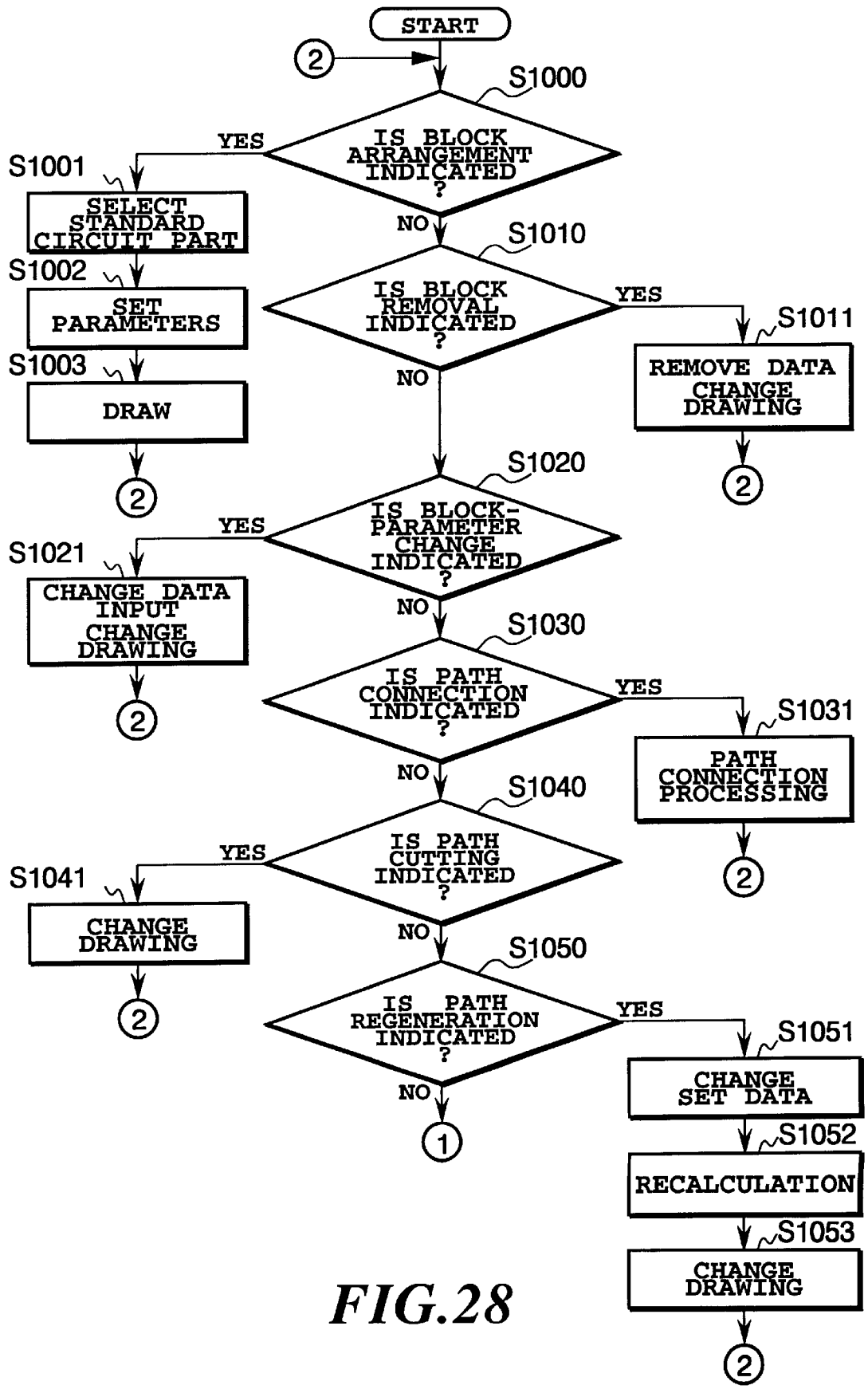
FIG. 28 is a flowchart showing a processing procedure executed by a CPU 101 in FIG. 8.
Figure 29:
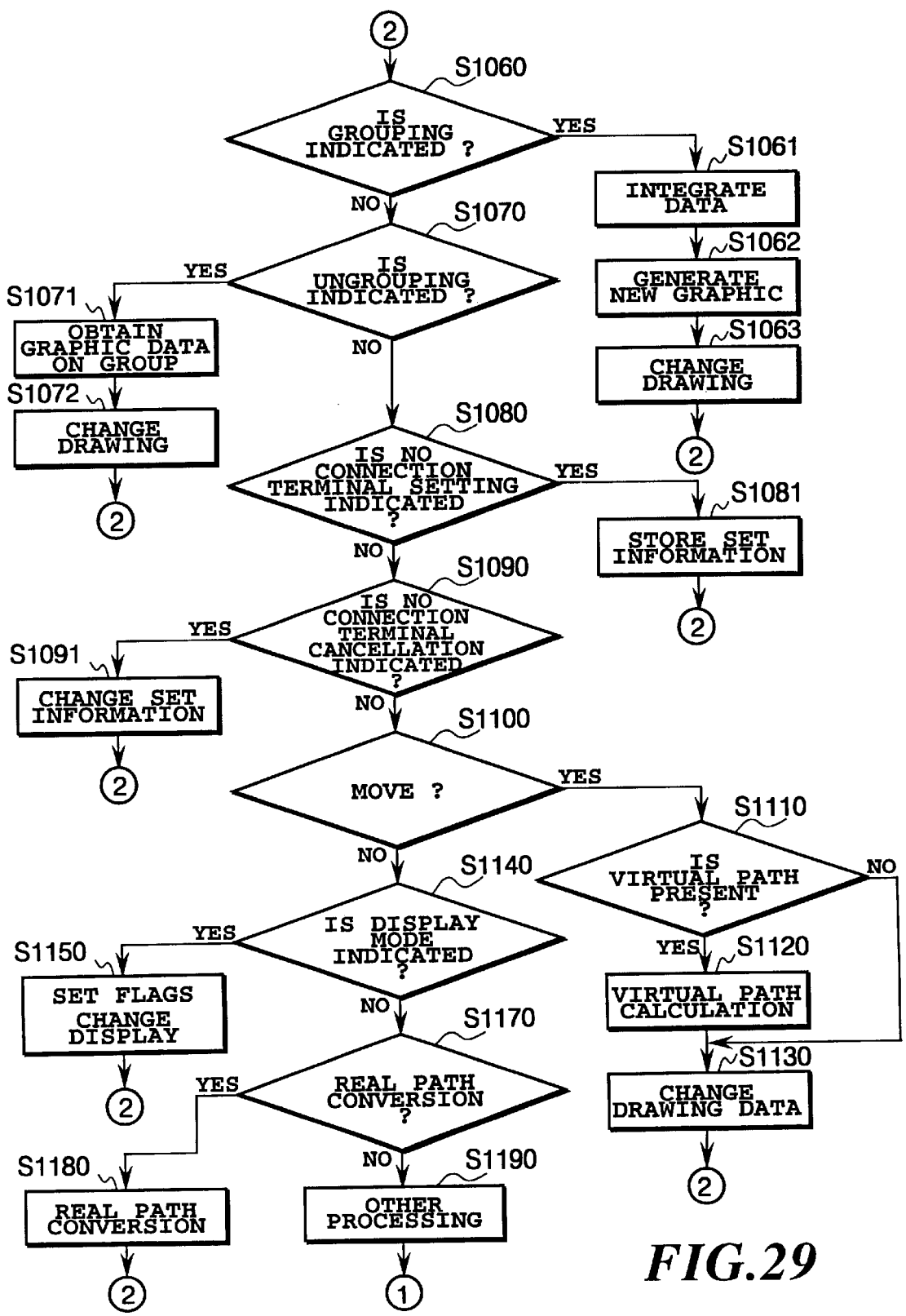
FIG. 29 is a flowchart showing a processing procedure executed by the CPU 101 in FIG. 8.
Figure 30:
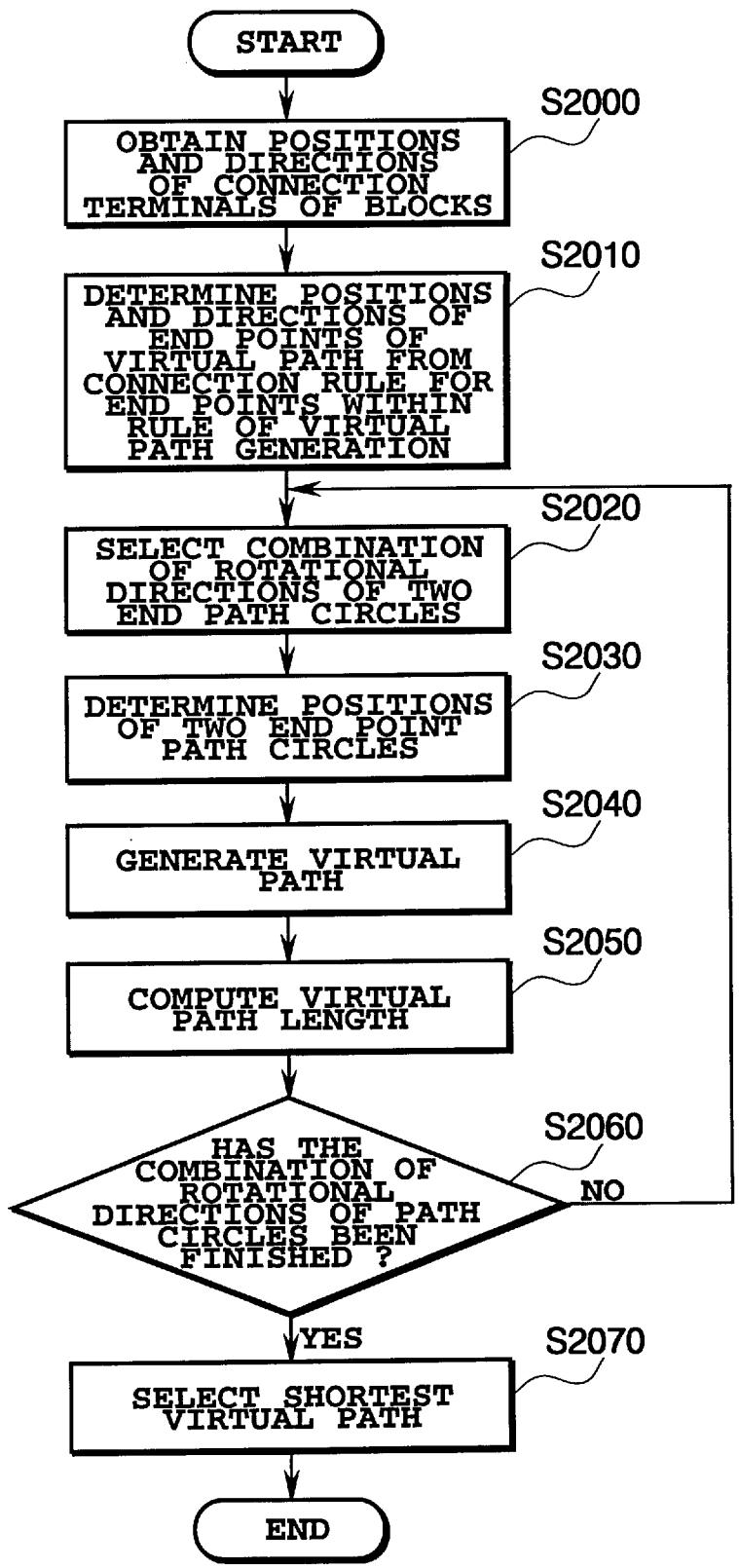
FIG. 30 is a flowchart showing a processing procedure until the generation of virtual paths.

The submenu items 611 to 620 are described below. FIGS. 28 to 30 show the processing procedure of an image processing program for executing the processing indicated by these submenu items. The processing procedure is described in a program language readable and executable by the CPU 101 and stored in the HDD 105. For explanation, the processing procedure is described in terms of functions and divided into well-known processes. Those skilled in the art may easily generate an image processing program that is stored in the HDD 105 by referencing this processing procedure and the description herein.

The block layout submenu item 611 instructs a target block to be generated. When the operator uses that mouse to select the submenu item 611, the CPU 101 generates a block according to the processing procedure of the image processing program shown in FIG. 28. The CPU 101 first recognizes from the position indicated by the mouse that the block layout procedure has been indicated (Yes in step 1000).

Figure 21:
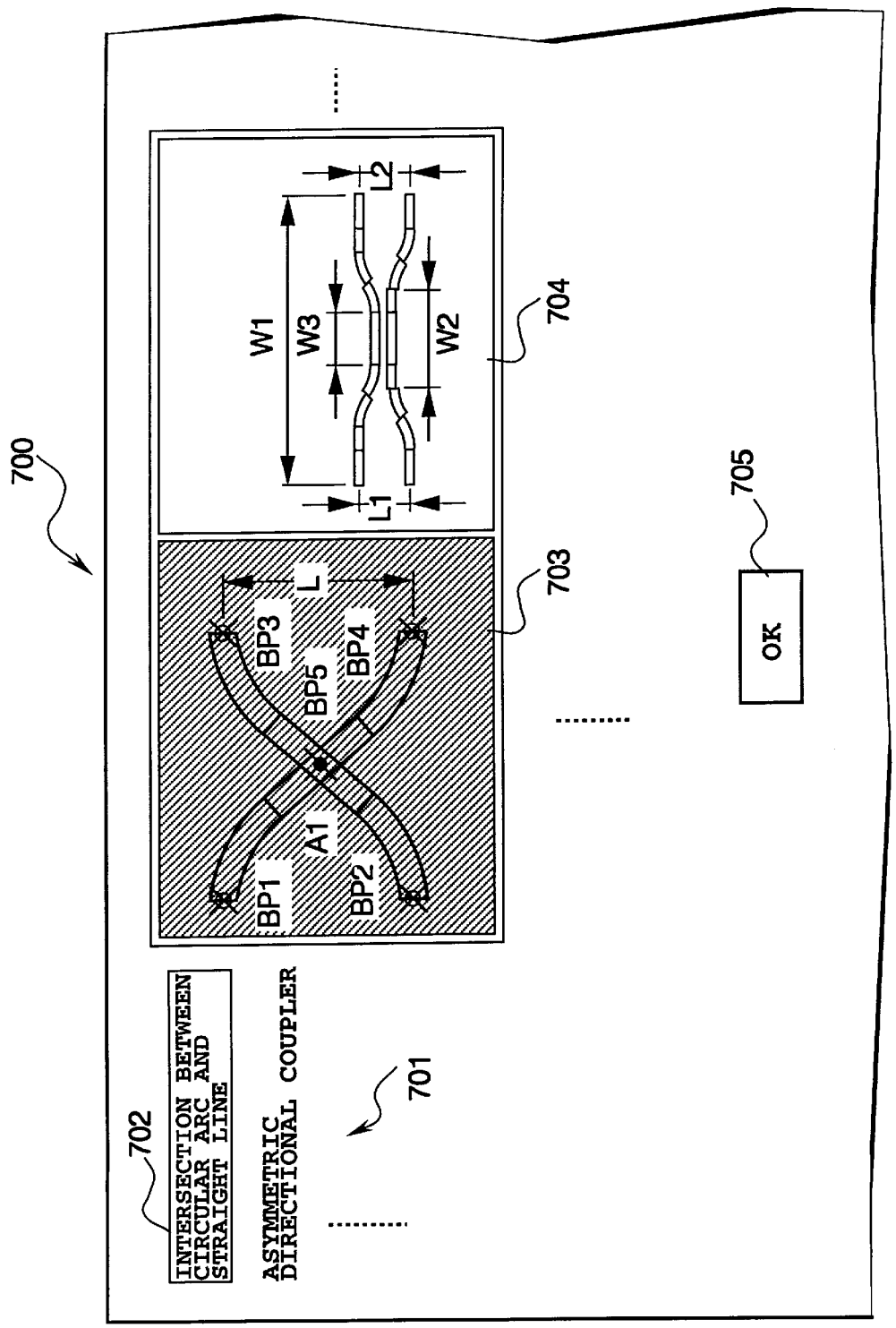
FIG. 21 is an explanatory drawing showing a window screen allowing standard circuit parts to be selected.

The CPU 101 then displays a standard circuit part selection screen 700, which is shown in FIG. 21. In FIG. 21, reference numeral 701 designates a standard circuit part name display column displaying the names of standard circuits parts that can be generated as blocks. The operator uses the mouse to select a desired standard circuit part name and then uses the click button to communicate the determination of the selection to the CPU 101.

Figure 22:
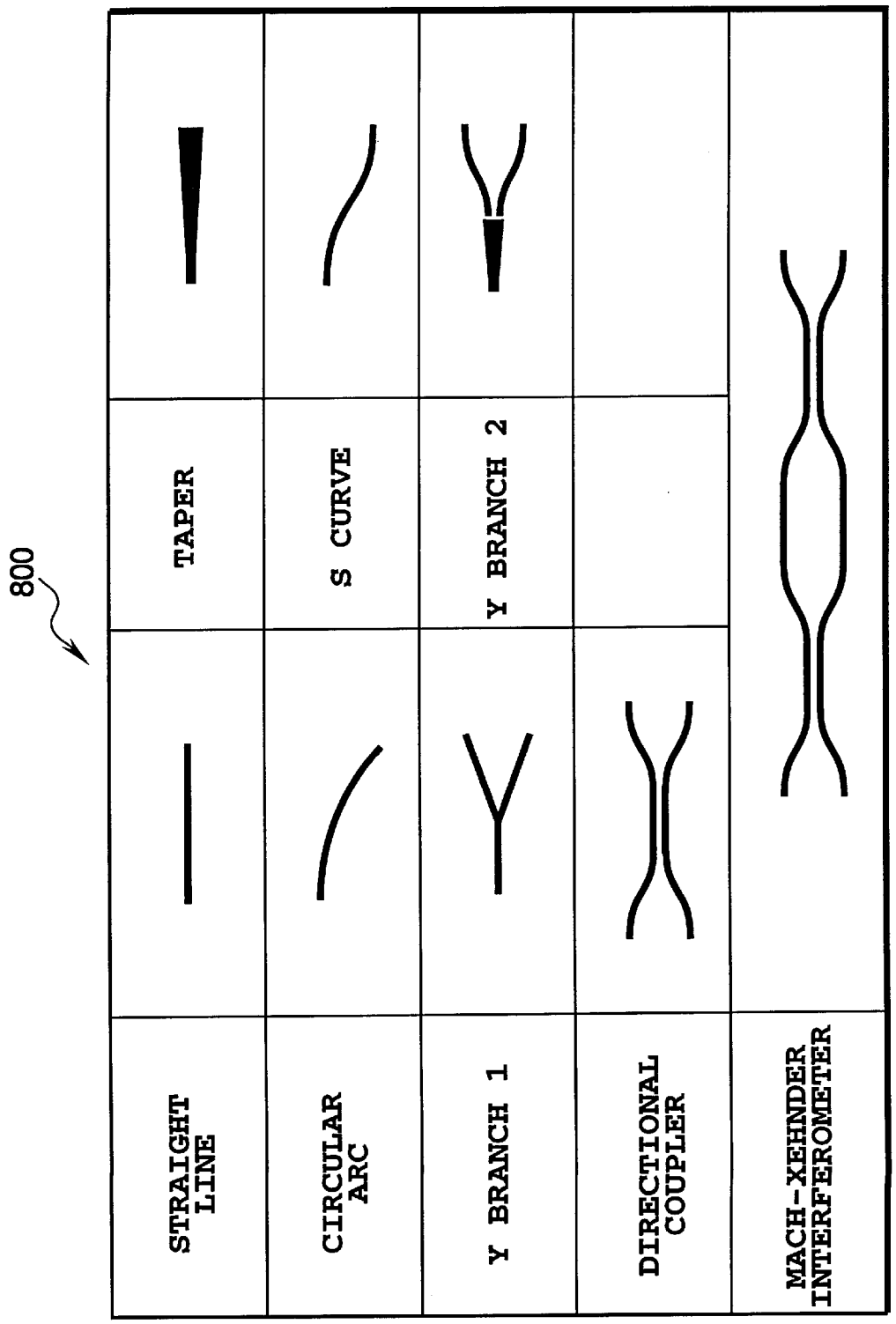
FIG. 22 is an explanatory drawing showing the types and shapes of standard circuit parts.

Reference numerals 703 and 704 designate graphics showing the shapes of standard circuits corresponding to standard circuit part names and the identification numbers of geometries. The initial values of these graphic images and geometries are stored in the HDD 105. The standard circuit part name selected by the operator is highlighted, for example, with black and the corresponding graphic image is also highlighted. FIG. 21 shows a standard circuit part represented by a graphic with reference numeral 703 being selected. FIG. 22 shows selective standard circuit part names and the corresponding circuit parts in the form of a list 800 for reference. It should be noted that a linear and a circular portions of a waveguide are also provided as standard circuit parts. According to this embodiment, an optical real path can be obtained by combining a virtual path generated by an automatic virtual path computation function, which is described below, with a block of waveguide the position of which is manually indicated.

When the operator uses the mouse to operate a determination indication button 705 on the display screen, the CPU 101 finishes a standard circuit part selection processing at step S1001 in FIG. 28 and transfers to a parameter setting processing at step S1002.

Figure 23:
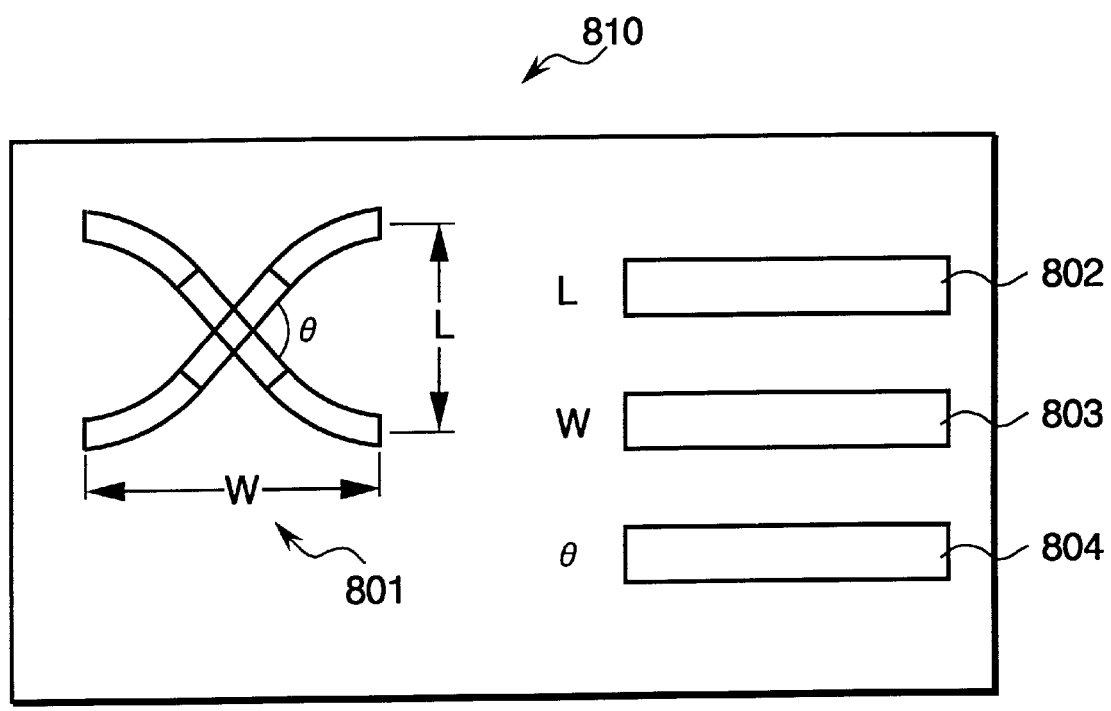
FIG. 23 is an explanatory drawing showing the types of flags storing display modes.

In the parameter setting processing at step S1002, the window screen shown in FIG. 23 is displayed. In FIG. 23, reference numeral 801 indicates a graphic of a selected standard circuit part and the initial values of parameters for the geometry of the standard circuit part are displayed in display sections 802 to 804. In the example in FIG. 23, width L has a fixed value but when one of 2, length W and crossing angle θ is modified, the value of the other parameter is automatically determined from the modified value. For example, if both values of length and crossing angle include a decimal fraction, an optical circuit can be fabricated and inspected more easily when one of the values is rounded as an integer. The relationship between parameter values is specified in the form of equations or functions beforehand (including constraints on the optical circuit).

The operator uses the mouse to indicate a value input position and inputs a modified value from the keyboard. When the determination button (not shown) is operated, the parameter processing is finished and the CPU 101 stores the determined parameter value and stores block information such as the position and direction of connection terminals initially given, in a specified region of the RAM 103 (step S1002). The CPU 101 subsequently generates an image of the block graphic on the RAM 103 using the above drawing method based on the parameter values, and displays it in a specific position of the display screen (step S1003).

The operator uses the well-known graphic movement function of the image processor to move the displayed block graphic to a desired position. Based on the position of the base point of the block after movement, the locational information within the relevant block information of the RAM 103 (see FIG. 9) is updated. Recognizing from the change in the position of the base point of the block that the movement of the block has been indicated, the CPU 101 determines from the block information whether a virtual path is present by examining the presence of virtual path information. In this case, there is no virtual path, so the display position of the block graphic the movement of which has been modified is changed (step S1110 to step S1130).

Figure 25A:
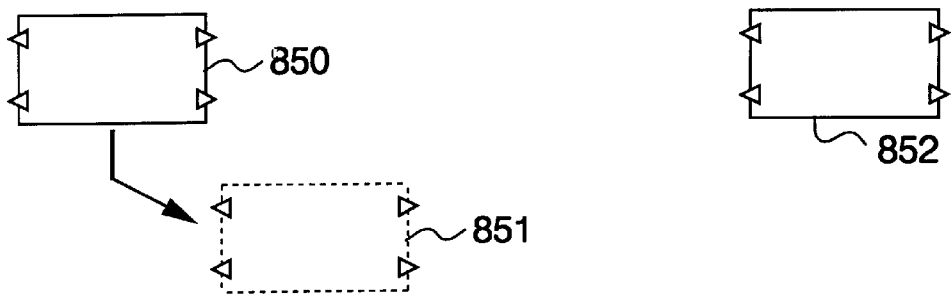
FIG. 25A to 25C are explanatory drawings showing design process.

The operator selects the block layout submenu item 611 on the display screen (see FIGS. 20A and 20B) as described above, selects the second desired standard circuit part to be laid out, and sets the parameter values (step S1000 through step S1001 to step S1002). This causes the secondly generated block graphic to be displayed on the display screen and the block information to be stored in the RAM 103 (step S1003). This state of display is shown in FIG. 25A. The generated block graphic is shown by reference numerals 850 and 852.

If the generated block graphic is to be deleted from the display screen, the operator uses the mouse to indicate the block graphic to be deleted. Then, the operator selects a submenu item 612 in FIG. 20. The CPU 101 then deletes the display image of the indicated block graphic on the indicated RAM 103 to delete the indicated block diagram on the display screen (step S1010 to step S1011).

Figure 25B:
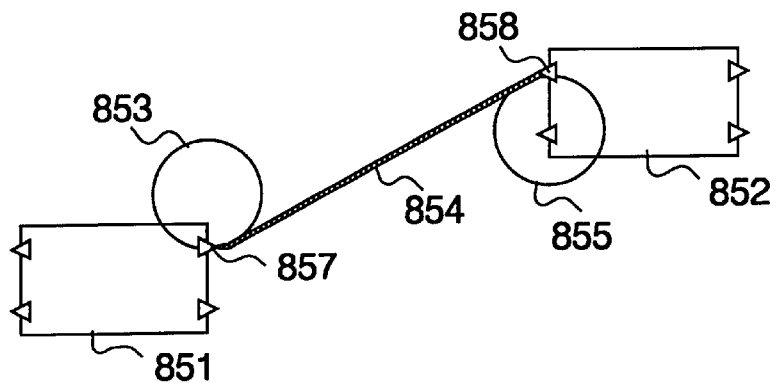
Figure 25C:
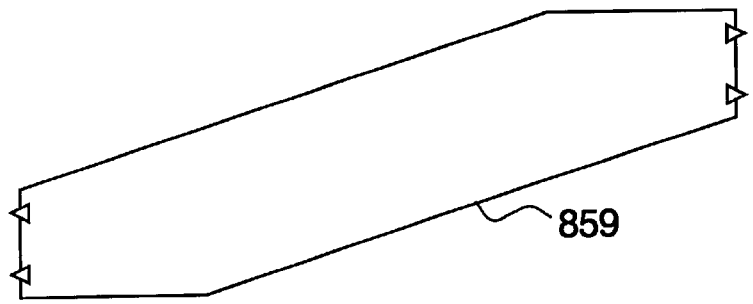

Then, after moving a block graphic 850 in FIG. 25 to the position of the block graphic shown by reference numeral 851, the operator uses the mouse to indicate the block graphics of connection terminals 851 and 858 and selects a submenu item 613 for path connection in FIG. 20. The CPU 101 then sets a plurality of virtual path circles according to the rule of virtual path generation on the RAM 103 to generate a plurality of virtual paths. FIG. 25(B) shows the number of virtual path circles being set at 2.

As described above, the CPU 101 determines as an optimal path, one of the four virtual paths which has the smallest length, and displays it on the display screen (step S1030 to step S1031).

FIG. 30 shows the detailed procedure of path connection processing at step S1031. The path connection procedure shown in FIG. 30 indicates the case in which the number of virtual paths is set at 2. In FIG. 30, to enable a virtual path to be generated, connection terminals for two associated blocks are provided by the operator specifying them. The CPU 101 obtains the positions and directions of the specified connection terminals from the connection terminal information (see FIG. 9) on the RAM 103 (step S2000).

Based on the connection rule (see FIG. 5) between connection terminals and virtual paths within the rule of virtual path generation on the RAM 103, the CPU 101 determines the positions and directions of the end points of a virtual path. The rule of virtual path generation in FIG. 5 specify that a) the positions of the end points of a virtual path be aligned with the positions of connection terminals and that b) the directions of the end points of a virtual path be opposite to the directions of connection terminals. Thus, the positions and directions of the end points of the virtual path which meet this rule of virtual path generation are determined. The rotational direction of end point path circles is clockwise or counterclockwise, one combination of the rotational directions of two end point path circles is selected (see FIG. 2, step S2010 to step S2020).

The rule of virtual path generation in FIG. 5 further specify that c) the radii of two end point path circles be equal, so the positions of the end point path circles are determined as shown in FIG. 3 with the rotational directions of the path circles considered (step S2030).

Figure 33:
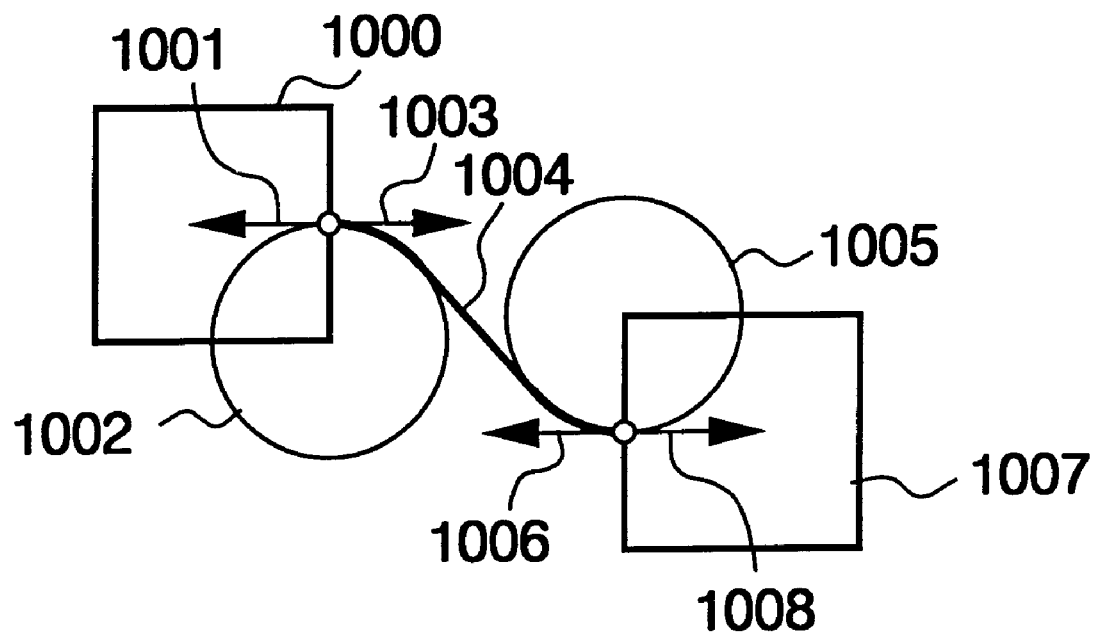
FIG. 33 is an explanatory drawing showing the relationship between a virtual path and end point path circles and blocks.

A predefined equation is used to determine the common tangents and contacts of the two end point path circles, and a virtual path is generated using the common tangent connecting the two contacts together, the connection terminals of the block, and the circular arc of the end point path circle extending up to the contact. No virtual path is generated depending on the locational relationship between the two end point path circles. If the rotational directions of the two end point path circles are the same, the common tangent is a common circumscribed line, whereas if they are different, it is a common inscribed line. FIG. 33 is an image drawing of the generated virtual path. The common tangent in FIG. 33 is a common inscribed line. In FIG. 33, reference numerals 1000 and 1007 designate blocks and reference numerals 1002 and 1005 denote the directions of the end points of a virtual path 1004. Reference numerals 1003 and 1006 indicate the directions of the connection terminals.

The virtual path obtained is evaluated. Since, according to the rule of virtual path generation in FIG. 5, the condition for selecting one of virtual paths obtained by combining the rotational directions of end point path circles is that a virtual path with the smallest path length be selected, the length of the determined virtual path is computed (step S2040). Alternative evaluation methods include the minimum sum of the rotational angles of the circular portions of the virtual path and the interference of the virtual path with other graphics (overlapping). Thus, each time the virtual path length is obtained, it is compared to the presently smallest virtual path length. If the former is smaller than the latter, the previously obtained virtual path lengths used for comparison will be changed to this value.

If any combinations of the rotational directions of the end point path circles are unfinished, the generation of a virtual path and the computation of its length are executed on these unfinished combinations (the loop processing in step S2020 to step S2060).

Once the computation and comparison of the virtual path length have been finished on all the combinations, the CPU 101 obtains an optimal virtual path with the smallest length. To draw the optimal virtual path obtained, data is temporarily stored in the RAM 103 (step S2070).

Using the above processing, the operator can lay out the two blocks and automatically position the virtual path connecting the blocks together. After the layout of the virtual path, when the operator moves the block graphics, the processing procedure of the CPU 101 proceeds from step 1100 to step 1110 in FIG. 29 to confirm that the virtual path is present. Thus, the positions of the blocks after movement are used to execute new computations for the virtual path in order to determine and display a virtual path suitable to the block positions after movement (step S1120 to step S1130). This releases the operator from conventional complicated operations for manually creating a real path by changing figure of a graphic of a curved line and/or a straight line each time the positions of blocks are changed.

If the generated virtual path or an real path into which the virtual path has been converted is to be deleted from the display screen, the mouse can be used to specify a submenu item 615 on the display screen in FIG. 20. The CPU 101 recognizes the specification at step S1040 in FIG. 28 and deletes the specified virtual path from the display data. One of the deletion methods is to substitute the image data of the virtual path with an image of the background (step S1040 to step S1041).

According to this embodiment, the menu items (not shown) and the submenu items in FIG. 20 enable a plurality of display modes to be set. The display modes include a path display mode in which the display is switched between a virtual path and an real path, the need for offset setting, the need for connection terminal display, a non-connection terminal (described below) set/release mode, and the need for virtual path circle display, and the set display mode is stored on the RAM 103 as flag bit information indicating 1 or 0 (step S1030 to S1031).

Each time the display mode is changed during the selection of the menu items, the CPU 101 examines the flag information to display the graphics depending on the mode indicated by the flag information (step S1140 to S1150).

The user may set the display mode depending on the purpose of the layout drawing. The display mode enables various virtual paths to be laid out and designed. For example, on visually detecting that the curvature of a bent portion of an automatically generated virtual path is too large, the operator may specify this virtual path and instructs the virtual path circles to be displayed. Then, the path circles that have been used to compute the virtual path are drawn on the display screen, so the sizes of the virtual path circles can be visually checked.

Next, the operator specifies a submenu item 616 on the display screen in FIG. 20. A window screen then appears displaying the values of the current radii of the virtual path circles. While comparing the display of the virtual path circles to the values of the radii of the circles displayed on the window screen, the operator changes the values of the radii on the window screen to desired values. In response the indication of the determination of the change, the CPU 101 deletes the window screen and updates the values of the radii in the rule of virtual path generation with the changed values. The changed values are also used to re-calculate the virtual path rule. The previous virtual paths on the display screen are deleted and a virtual path newly obtained is displayed (step S1050 though steps S1051 and S1052 to step S1053).

The above layout design processing is a partial design of the overall layout, and the overall layout cannot be fitted within the display screen of the display 107 if the number of circuit parts is too large. Thus, this embodiment group the laid-out block graphics and the virtual path graphic between them as a single large block graphic, and subsequently enlarges it to a size suitable to the display screen.

The overall optical circuit can be laid out and designed by displaying this grouped block graphic.

In addition, if the operator desires to see the inside of a grouped block within the overall layout, the internal circuit can be displayed by providing a relevant instruction. To do this, the operator uses the mouse to specify blocks to be grouped and then specifies a submenu item 617 on the display screen in FIG. 20. The CPU 101 then recognizes the indication of grouping at step S1060 in FIG. 29 and integrates the specified blocks (this integration processing has been described with reference to FIGS. 12 to 14). The CPU 101 subsequently deletes the specified block graphics and displays a block graphic obtained by the integration (step S1061 to step S1062). The block and virtual path information within the layout information on the RAM 103 is also integrated.

When the internal layout of a block is to be viewed, the operator uses the mouse to specify the block graphic and specifies a submenu item 618 in FIG. 20.

In response to this specification, the CPU 101 recognizes the indication of ungrouping at step S1070 in FIG. 29, obtains from the RAM 103 the information on the internal layout that has been grouped, and uses this information to generate and display the block and the virtual path graphics displayed prior to ungrouping. At this point, if any block displayed prior to ungrouping is connected to another block, it is connected to the second block after ungrouping.

This embodiment can specify a particular connection terminal in a block graphic to temporarily treat it as a non-connection terminal. If a non-connection terminal mode is to be set, the use specifies a target connection terminal and specifies a submenu item 619 in FIG. 20. This causes information indicating the non-connection mode to be set within the connection information on the specified connection terminal (step 1080 to step 1081). A graphic of connection terminal will not subsequently be displayed for the connection terminal for which this mode has been set.

On the other hand, the non-connection terminal mode is to be canceled, the operator may specify a submenu item 620 for non-connection terminal cancellation in FIG. 20. The CPU then changes that part of the connection information which indicates the non-connection mode to information indicating cancellation (step S1090 to step S1100). The non-connection mode may be canceled for all the non-connection terminals or operator-specified blocks.

After this processing and when layout design has been finished, the use specifies a submenu item in FIG. 20 (not shown) to indicate conversion into an real path. In response to this indication, the CPU converts the virtual path graphic into an real path graphic. At this point, if the real path conversion rule (in this case, the flag information) indicates an offset setting, the CPU 101 generates a waveguide graphic while considering offsets and displays it instead of the virtual path (step S1170 to step S1180).

In this case, the overall curvilinear portion of the virtual path may be batch-processed or only the specified curvilinear portions may be provided with an offset. Corresponding offset information is added to the virtual path information.

After the above processing has been completed, the CPU 101 executes the same processing as in the prior art in printing the completed layout drawing or saving it in the storage device 200 as a file.

The operation of the inside of the image processor 100 has been described. Then, the edition by the operator is described with reference to FIGS. 31 and 32.

The edition of a single block is first described and the edition of multiple blocks is then explained.

Figure 31:
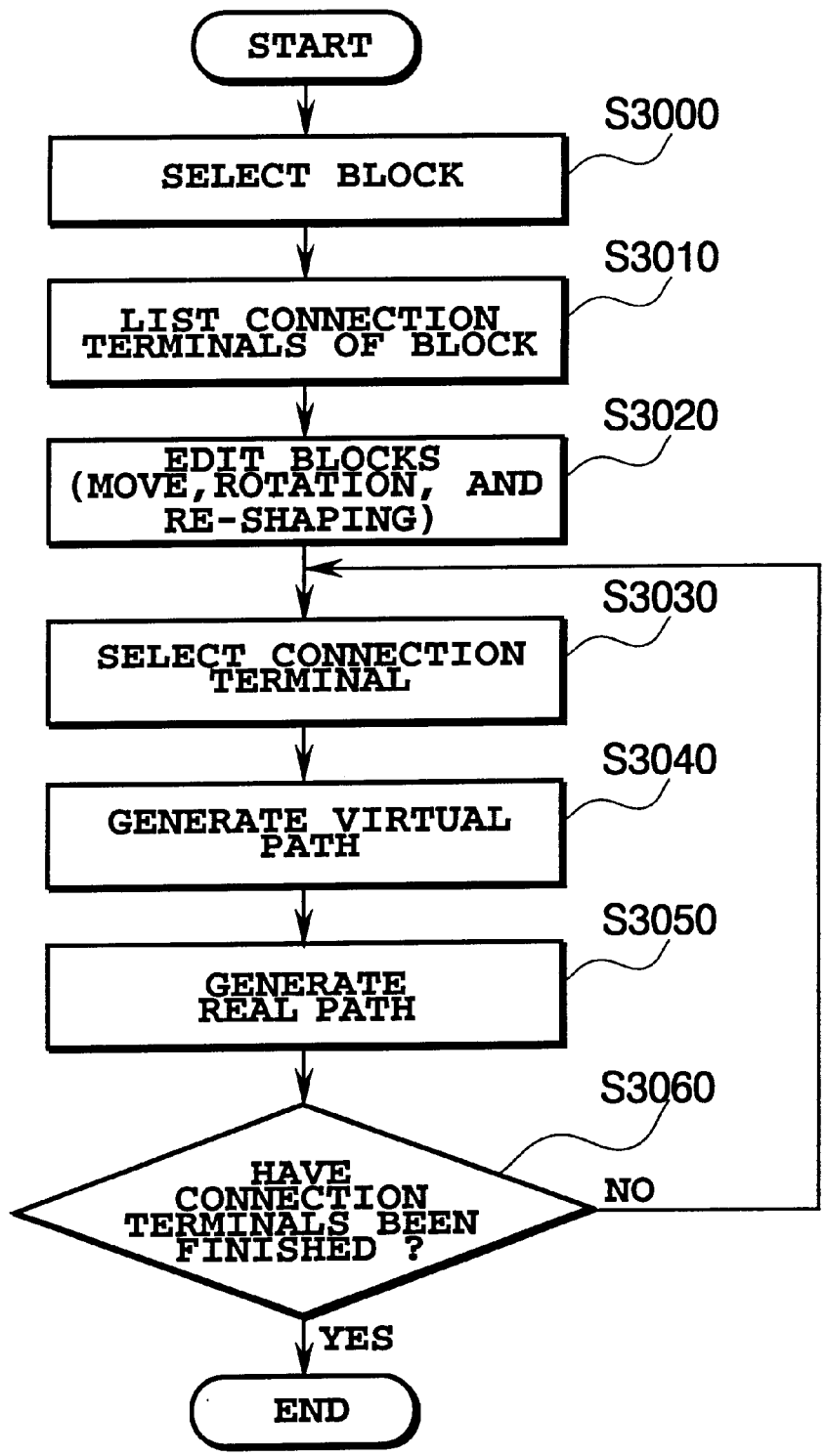
FIG. 31 is a flowchart showing a processing procedure for editing a single block.

FIG. 31 shows an example of the flow of the edition of a single block. Since blocks having no connection with the other blocks (having no connection terminal connected to the virtual path) may be edited using a known method, all the connection terminals are assumed to be connected to the other blocks through the virtual path.

(1) One block is selected (step S3000).

(2) The connection terminals of the selected block are listed (step S3010 executed by the CPU 101).

(3) The mouse is used to execute editions such as the movement, rotation, and re-shaping of the block (step S3020).

(4) One of those connected terminals which are to be connected is selected using the mouse (step S3030).

(5) A virtual path that is associated with the connection terminal is generated (step S3040 executed by the CPU 101).

(6) An real path that is associated with the virtual path is regenerated (step S3050; the recreation is indicated by the operator and the path is generated by the CPU 101).

(7) If the processing up to the creation of an real path has not been finished for all the listed connection terminals, steps S3030 to S3050 are repeated, and otherwise, the process is finished.

Next, an example of the edition of multiple blocks is explained.

Figure 26:
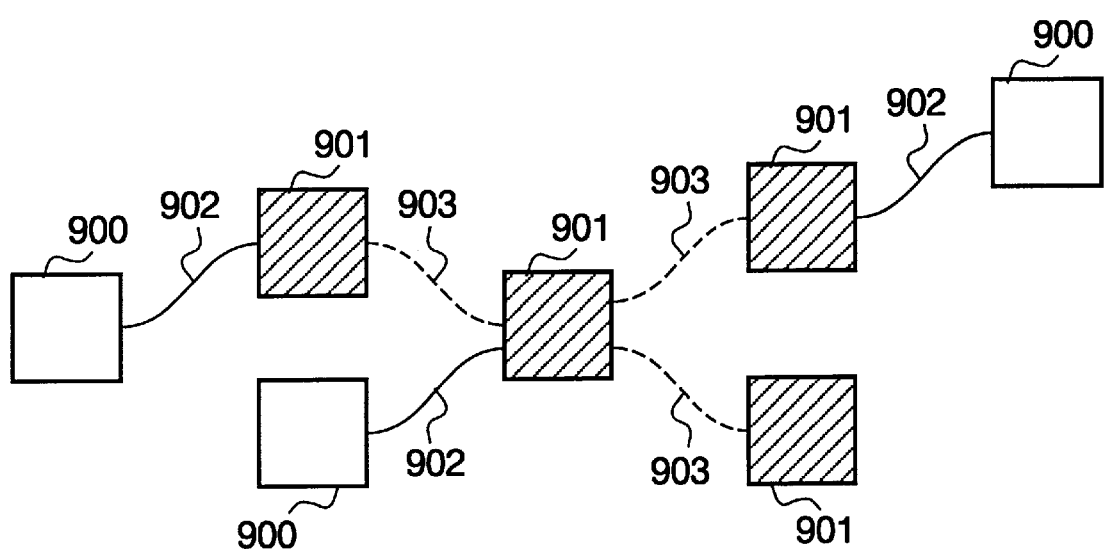
FIG. 26 is an explanatory drawing showing an editing process.
Figure 32:
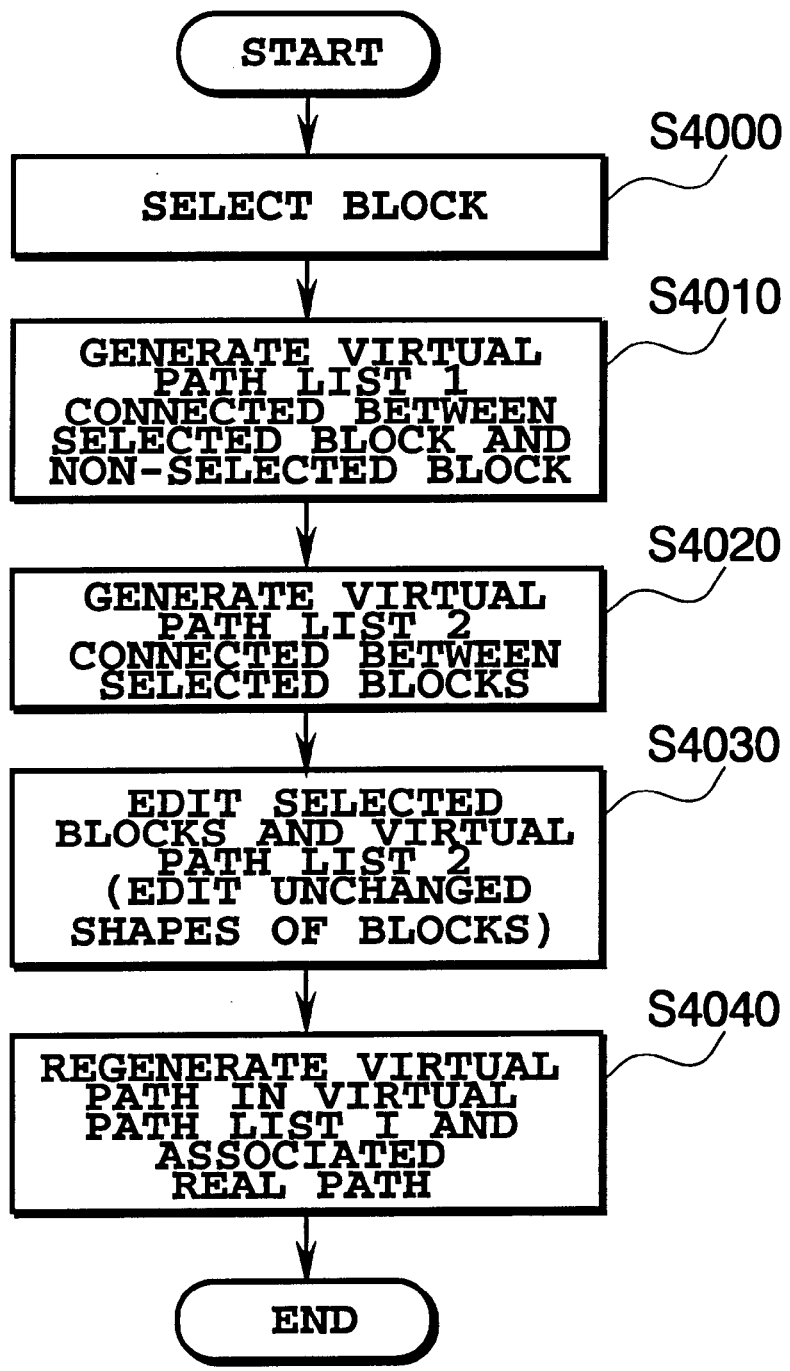
FIG. 32 is a flowchart showing a processing procedure for editing multiple blocks.

FIG. 26 shows an example of the edition of multiple blocks and FIG. 32 shows a operation procedure for editing multiple blocks.

If multiple selected blocks can be separated into a plurality of groups of blocks that are not connected together via the virtual path, each group of blocks may be subjected to the following processing. Thus, all the multiple selected blocks are assumed to be connected together via the virtual path.

(1) Multiple blocks are selected (step S4000).

(2) A virtual path list 1 is generated including virtual paths 902 each connected between a selected block 901 that is shaded in FIG. 26 and a non-selected block 900 (the list is generated by the CPU 101, step S4010).

(3) In FIG. 26, a virtual path list 2 is generated including virtual paths connected between selected blocks 901 (the list is generated by the CPU 101, step S4020).

(4) The mouse is used to execute editions such as movement and rotation for both the selected blocks and the virtual path list 2 (step S4030).

(5) Since the editions in step S4030 change the positions and/or directions of the end points in one of the virtual path lists, all the virtual paths in this virtual path list are regenerated (executed by the CPU 101, step S4040).

An example of the optimization of the layout using the base direction of the block as an editing parameter is described below.

Figure 27A:
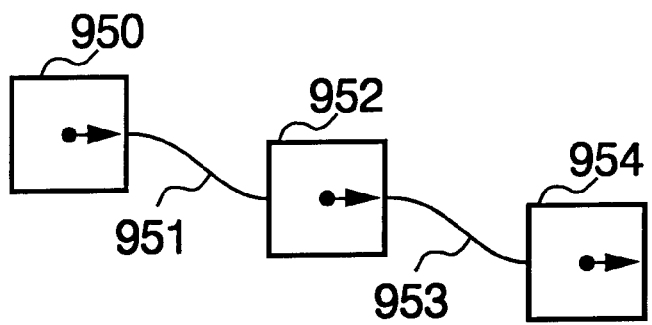
FIG. 27A and 27B are explanatory drawings showing an editing process.
Figure 27B:
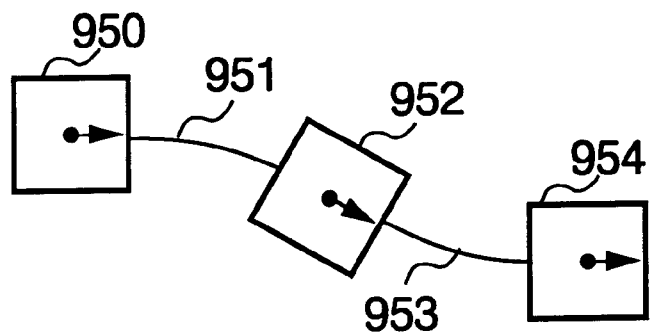

FIG. 27A and 27B show an example of block edition using block base direction optimization.

In FIG. 27A, the base direction of blocks 950, 952, and 954 is assumed to be the horizontal direction in the sheet of the drawing. A virtual path 951 is assumed to be connected between the block 950 and the block 952, and a virtual path 953 is assumed to be connected between the block 952 and the block 954. The orientation of all the end points of all the virtual paths is assumed to be the horizontal direction.

In the layout in FIG. 27A, each virtual path comprises an S curve. In FIG. 27B, a predefined mathematics function is used to rotate the blocks so that the sum of the lengths of the virtual paths 951 and 952 will be minimized.

In this manner, once the operator has visually determined an optimal layout and positioned the blocks according to that layout, then the system will automatically generate virtual paths. This embodiment has minimized the propagation loss present in the virtual paths. It will be appreciated that the operation of this embodiment is very easy.

Since the end points of circular arcs or S curves do not generally have integral values, much time and labor are required to manually execute such optimization using a computer and simpler operations according to this invention substantially improve design efficiency. A group of graphics in which part of the graphics to be edited are optimized using a particular evaluation method as in this embodiment can be assumed to have a fixed shape during subsequent editions.

Other Embodiments

1) The virtual path generation method using two virtual path circles as described above can be extended to generate virtual paths using a large number of path circles.

Figure 34:
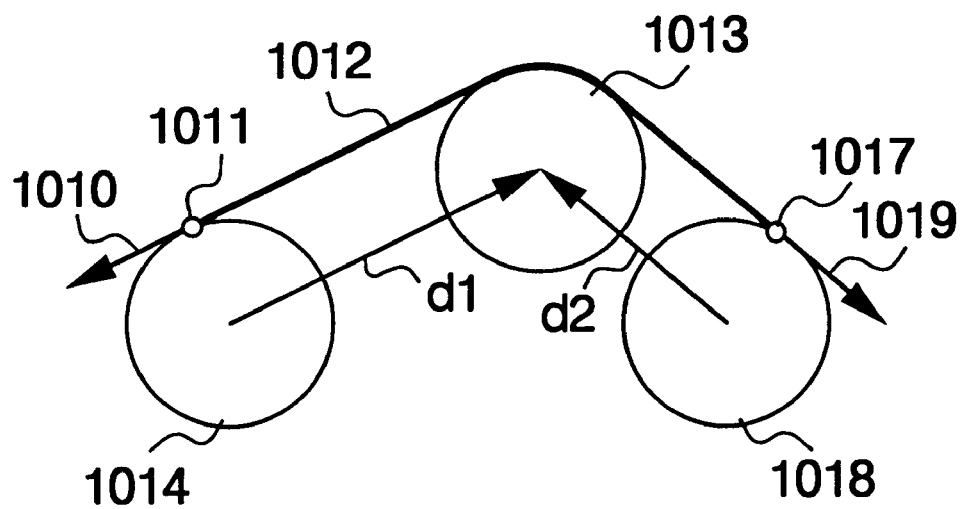
FIG. 34 is an explanatory drawing showing the relationship between three virtual path circles and virtual paths.

FIG. 34 shows an example of virtual path generation using three paths. In this example, the rotational directions of two end point path circles 1002 and 1005, which are shown in FIG. 33, (1014 and 1018 in FIG. 34, in which light travels from the path circle 1014 to the path circle 1018) are clockwise. This example also includes a middle path circle 1013. In FIG. 34, the middle path circle can be added by moving the end path circle 1010 in direction d1 in parallel (opposite to the direction 1010 of an end point of the virtual path 1011), moving the end path circle 1018 in direction d2 in parallel (opposite to the direction 1019 of an end point of the virtual path), and placing the middle path circle where the two end point path circles 1010 and 1018 are aligned with each other. The middle circle cannot be added when the two end path circles are not aligned with each other. In this case, no virtual paths are assumed to exist in this example.

Figure 35:
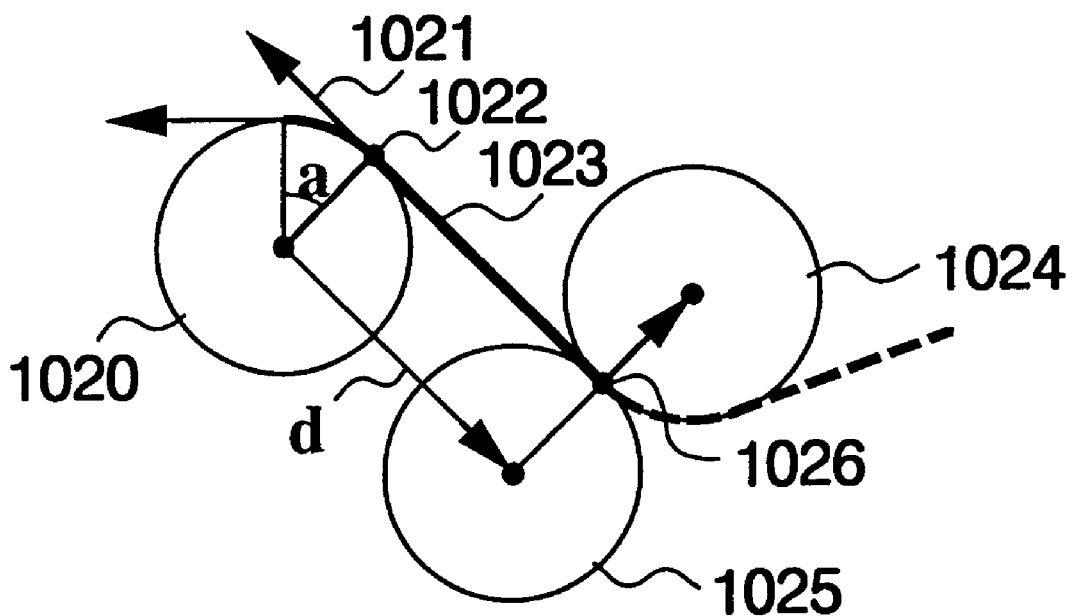
FIG. 35 is an explanatory drawing showing the relationship between three virtual path circles and virtual paths.

FIG. 35 shows an example in which a middle path circle is added by moving end point path circles and changing rotational directions. In FIG. 35, a middle path circle is added by rotating an end point path circle 1020 through angle (a). in the direction opposite to the rotational direction of an end point path circle 1020, then moving the end point path circle 1020 distance (d) in the direction opposite to the direction 1021 of the end point obtained after rotation, and point-symmetrically moving the path circle 1020 around the position 1026 of an end point of an end point path circle 1025 obtained after movement, and placing the middle path circle 1026 in this position. In this case, the rotational direction of the end point path circle is inverted upon the point-symmetric movement, so the rotational direction of the middle path circle 1026 is opposite to the initial end point path circle 1020 (counterclockwise in FIG. 35). Reference numeral 1023 designates a virtual path generated by these virtual path circles.

Figure 36:
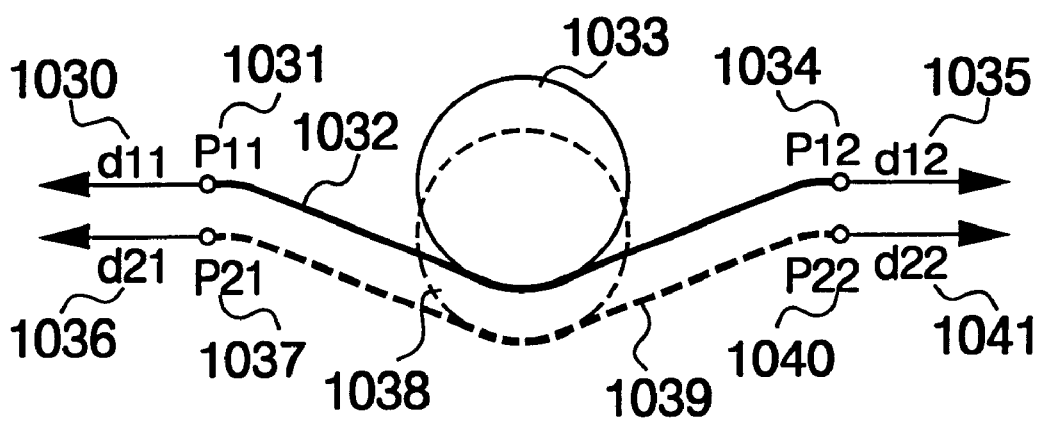
FIG. 36 is an explanatory drawing showing a processing for determining the position of a middle path circle.

2) In 1), the position of the middle path to be added is determined by the association in which the end point path circles are moved in parallel. Other associations are described. FIG. 36 shows another embodiment of the association of a plurality of virtual paths.

A virtual path 1039 is generated from a virtual path 1032 that is used as a base. The length of the virtual path 1039 is assumed to be larger than that of the virtual path 1032 by a specified value. The positions of the two end points 1031 and 1034 of the virtual path 1032 are indicated by P11 and P12, respectively, and their directions are indicated by d11 and d12, respectively. In addition, the positions of the two end points of the virtual path 1039 are indicated by P21 and P22, respectively, and their directions are indicated by d21 and d22, respectively. The four points P11, P12, P22, and P21 each constitute a vertex of a rectangle in this order. d11 and d21 are assumed to be equal to the direction from P12 to P11 while d12 and d22 are assumed to be equal to the direction from P11 to P12.

Figure 37:
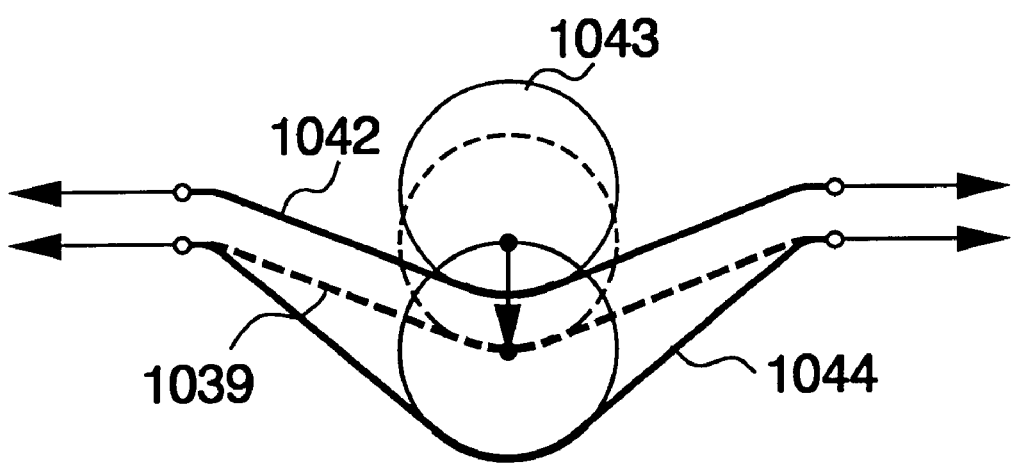
FIG. 37 is an explanatory drawing showing a processing for determining the position of a middle path circle.

The virtual path 1032 is assumed to be composed of two end point path circles (not shown) that rotate clockwise; and a middle path circle 1033 that rotates counterclockwise and the center of which is identical to the center of P11 and P12. The virtual path 1039 is generated by first meeting the condition for the end points of the virtual path 1039 shown in FIG. 37 to generate a virtual path 1042 with the same shape as the virtual path 1032, then moving a middle path circle 1043 on a virtual path 1042 in the direction from P11 to P21 until the length of the virtual path 1039 becomes larger than that of the virtual path 1032 by a given value in order to obtain a virtual path 1043. The movement in this case can be determined easily because the length of the virtual path can be computed in an arbitrary shape. Although, in this embodiment, the position and shape of the virtual path 1032 and the conditions for the end points of the virtual path 1039 are set at particular values, they can be implemented in an arbitrary layout because the virtual path can deformed easily and its length computed as long as the path circle method is used. They can be also implemented as long as the association of the virtual path involves geometric amounts such as lengths and directions.

Several examples of virtual path generation methods have been explained, but many other virtual path generation methods can be contemplated using other combinations of path circles. A virtual path generation method can be adopted as long as the rule of virtual path generation allow a single virtual path to be uniquely determined by block connection terminal information, specifically, when the positions and directions of the connection terminals are given.

Figure 38:
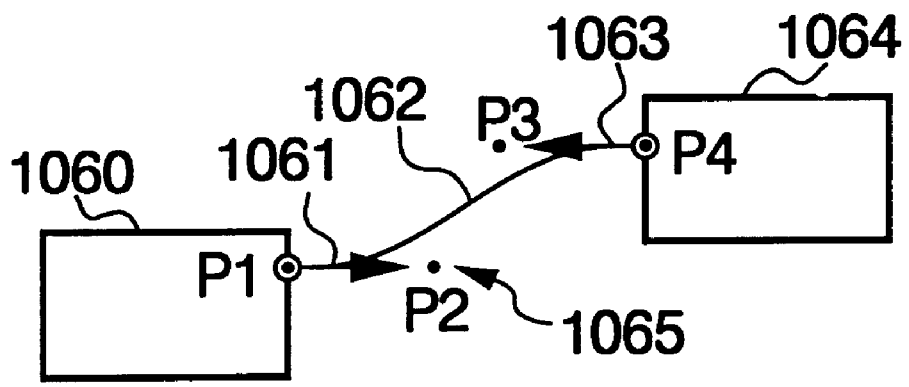
FIG. 38 is an explanatory drawing showing an example of a spline curve used as a virtual path.

3) FIG. 38 shows one embodiment using a spline. This embodiment uses as the shape of virtual paths a spline curve, which is a publicly known method. In FIG. 38, the position and shape of the virtual path are determined by aligning the end points P1 and P4 of the virtual path with the positions of associated connection terminals and matching the directions from P1 to P2 and from P4 to P3 with the directions of the connection terminals. In this method, the virtual path can be computed easily even if the positions and directions of the connection terminals are changed. In addition, since the minimum curvature of the spline curve can be calculated by changing the lengths of segments P1P2 and P3P4, the maximum value of propagation loss per unit length can be calculated to evaluate the virtual path.

4) Although the above examples use two or three virtual path circles, the number of virtual path circles can be varied. In this case, the rule of virtual path generation can be displayed to set the number of virtual path circles on the display screen. The above virtual path drawing method can be applied depending on the number of set virtual paths.

5) Although this embodiment uses the specified directions of the end points of the virtual path and of the connection terminals of the blocks, they can be matched with, for example, the advancing direction of light. The directions can be provided as required by the user.

6) In this embodiment, if there are a plurality of virtual paths, the CPU 101 may determine whether there is any block or determined real or virtual path intersecting any of these virtual paths. If there is an intersection, that virtual path may be removed from the selection candidates. The intersection may be determined by using known mathematics processing to determine whether the curve of the virtual path intersects a block graphic, the curve of a virtual path, or the curve of a real path.

As described above, the circuit design system has the following effects.

(1) Fast graphic edition is enabled.

(2) Layout edition is enabled.

(3) The layout and edition of graphics with a circular arc that causes a smaller amount of optical propagation loss can be carried out quickly and easily.

(4) An already input drawing can be re-edited and reused easily.

(5) Since graphics generated in a different language or method can be loaded easily as blocks, an ample amount of mathematics libraries and the results of computations optimized by a faster computer can be used easily as a design method.

In addition, due to the capability of automatically and quickly lay out and edit graphics including a curve, this invention is applicable not only to CAD for optical circuits but also to many other fields. For example, this invention can be used in the design of LSIs or printed boards where curvilinear graphics are used as wiring, or in the field of machinery, construction, and civil engineering where parts of a group of graphics are fixed, where the fixed graphics are connected with graphics of curved lines, and where part or all of the group of graphics are laid out and edited. This invention is not limited to particular embodiments, but can be implemented in all the fields to which this design system is applicable.

Second Embodiment

A second embodiment is described in which a directional compaction function and a new image editing function are added to the first embodiment. Compaction generally means the compaction of an area but directional compaction, which is described below, means that when indicated blocks are to be moved in indicated directions, the positions of the blocks after movement and their traveling distances are automatically determined so that the sum of the lengths of the paths connected by these blocks will be minimized.

The directional compaction is described below.

a-1 Formulation of Paths

Since the real path can be determined relationally from the virtual path in the invention, the virtual path is treated with in the following description of the directional compaction and the virtual path is called path simply. Although the directional compaction processes a plurality of paths as targets of evaluation for compaction, the compaction of one path is first described and the compaction of a plurality of paths is then described.

The directional compaction fixes the starting point of a path and moves the end point of the path in a given specific direction.

Figure 39A:
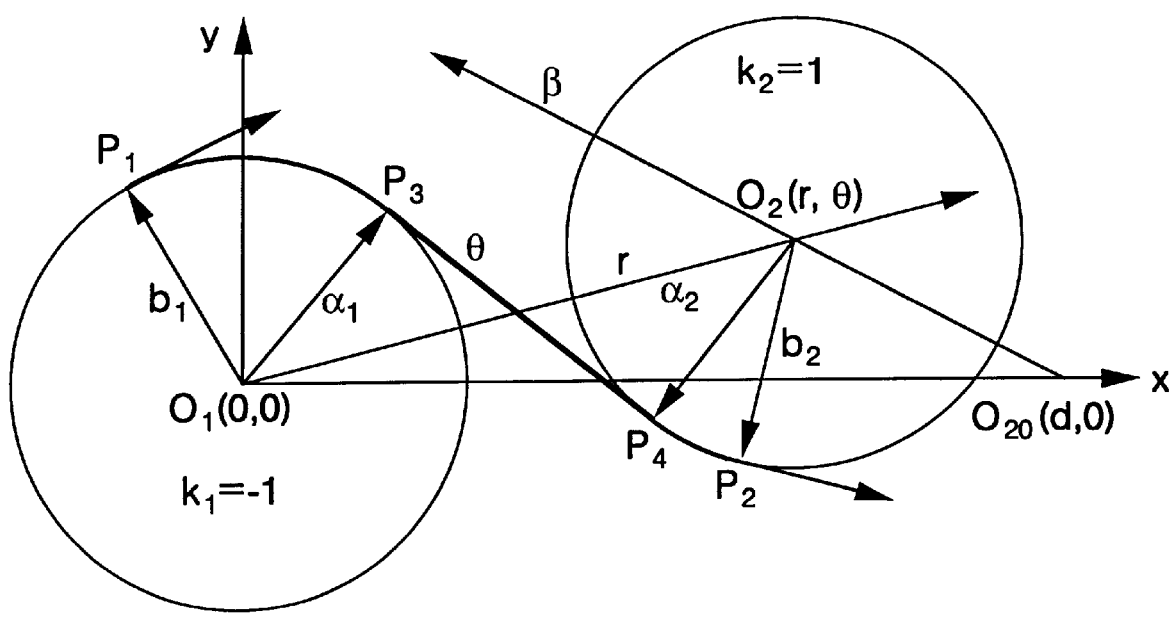
FIG. 39A and 39B are explanatory drawings for describing the contents of a directional compaction processing.
Figure 39B:
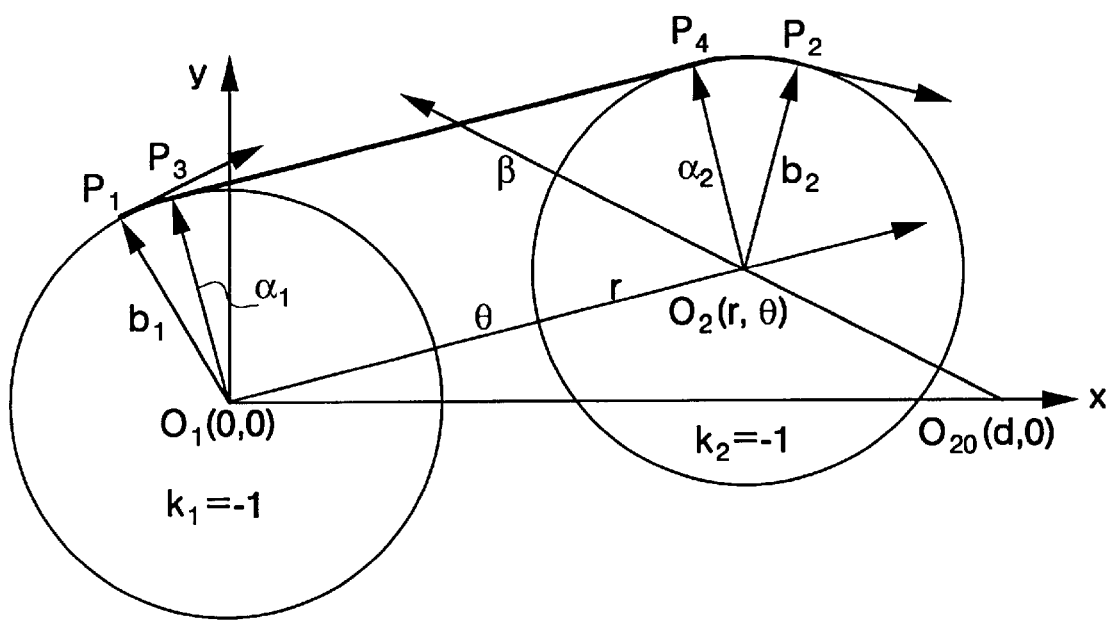

FIG. 39A and 39B show a coordinate system and related parameters in the directional compaction. In FIG. 39A shows designates the case in which a starting point path circle is different from an end point path circle, whereas FIG. 39B shows the case in which a starting point path circle is equal to an end point path circle.

The center of the starting point path circle is referred to as O1 and the center of the end point path circle is referred to as O2. The position of O1 is assumed to be a coordinate origin (0, 0) and the initial position of O2 is represented as O20 and the polar coordinate of this position is referred to as (d, 0). Paths that are subjected to the directional compaction are represented as P1, P3, P4, and P2, and the position of O2 that has been arbitrarily moved in direction β is represented as (r, θ). The other parameters are listed below.

R: Radius of starting or end point path circle

P1, P2: Staring and end points of path

P3: Contact between starting point path circle and common tangent between starting and end point path circles P4: Contact between end point path circle and common tangent between starting and end point path circles b1, b2: Direction O1P1 and direction O2P2 a1, a2: Direction O1P3 and direction O2P4 k1, k2: Rotational directions of starting and end point path circles (counterclockwise: 1, clockwise: −1). In FIG. 2A, the starting and the end point path circles have different rotational directions and k1=−1 and k2=1. In FIG. 39B, the starting and the end point path circles have different rotational directions and k1=−1 and k2=−1.

When the interior angles of the circular portions of starting point path circle O1 and end point path circle O2 are referred to as $\Theta_1$ and $\Theta_2$ (zero or positive), path length L is expressed by the following expression.

$$L = R(\Theta_1 + \Theta_2) + 2r\sin\alpha \qquad \text{[Equation 1]}$$

The following equations can also be given.

$$\Theta_1 = NA(k_1\theta - \alpha - k_1 b_1) \quad \text{[Equation 2]}$$

$$\Theta_2 = NA(-k_2\theta - \alpha - k_2 b_2 + \pi) \quad \text{[Equation 3]}$$

Where NA(a) is a function for setting an angle a to a value between 0 (zero) and $2\pi$. If $a = a_0 + 2n\pi$ ($0 \leq a_0$ ($2\pi$, n=0, ±1, ±2 ...), then NA( ) = $a_0$ In addition, a designates the absolute value of the angle between direction O1O2 and direction O1P3, so the following equation can be given.

$$\cos\alpha = \begin{cases} 2R/r & (k_1 \neq k_2, r \geq 2R) \\ 0 & (k_1 = k_2) \end{cases} \quad \text{[Equation 4]}$$

Thus, path length L expressed by Equation 1 is a function of r and $\theta$.

On the other hand, since the following relationship is established, $$r = \frac{d\sin\beta}{\sin(\beta - \theta)} \quad r \geq \begin{cases} 2R & (k_1 \neq k_2) \\ 0 & (k_1 = k_2) \end{cases} \quad \text{[Equation 5]}$$

path length L can be considered to be a function of r and $\theta$.

a-2 Path Length Minimization

The minimization of a single path is first described and the minimization of a plurality of paths is then described. In the following discussion, $0 < \beta < \pi$. In the other cases, the minimum path can be similarly determined easily using symmetry.

(i) Single Path

The minimum value of path length L that is a function of $\theta$ is described.

Path length L in Equation 1 has a minimal value in that the derivative of the function in the parenthesis of NA( ) is zero, so this value is a candidate for the minimum value of path length L.

In addition, path length L has discontinuous points due to the characteristic of the function NA( ). That is, this length is discontinuous when, in Equation 2, the value in the parenthesis of the function NA( ) is an integral multiple of $2\pi$. Consequently, considering that $\Theta_1$ and $\Theta_2$ do not exceed $2\pi$, L has at maximum two discontinuous points related to the starting and the end point path circles, respectively. In addition, if k1 k2, L is more discontinuous when r=2R based on Equation 4.

Thus, if k1=k2, L has two discontinuous points at maximum, while if k1 k2, L has four discontinuous points at maximum. These points are all candidates for the minimum value of L.

(i-1) minimal Values of Path Length

Path length L has the following minimal values based on Equation 1.

If k1 k2, the following equation can be given.

$$\theta = \begin{cases} \beta - \Phi & (k_1 = -1, k_2 = 1, \Phi < \beta) \\ \beta + \Phi - \pi & (k_1 = 1, k_2 = -1, \Phi < \pi - \beta) \end{cases} \quad \text{[Equation 6]}$$

However, the following equations can also be given.

$$\Phi = a\cos\left(\frac{1}{\sqrt{K^2 + 1}}\right) \quad \text{[Equation 7]}$$

$$K = \frac{d\sin\beta}{2R} \quad \text{[Equation 8]}$$

Next, if K1=K2, the following equation can be given.

$$\theta = \begin{cases} \beta - \frac{\pi}{2} & \left(\frac{\pi}{2} < \beta < \pi\right) \\ \beta + \frac{\pi}{2} & \left(\frac{3\pi}{2} < \beta < 2\pi\right) \end{cases} \quad \text{[Equation 9]}$$

(i-2) Path Discontinuity

Next, the discontinuity of the path resulting when its end points are moved is explained. The discontinuity of the path is caused by the discontinuity of the function NA( ) for $\Theta_1$ and $\Theta_2$ in Equation 2. That is, when the following equations are established, $$k_1\theta_{1d} - \alpha - k_1 b_1 = 0 \quad \text{[Equation 10]}$$

$$-k_2\theta_{2d} - \alpha - k_2 b_2 + \pi = 0 \quad \text{[Equation 11]}$$

Figure 40A:
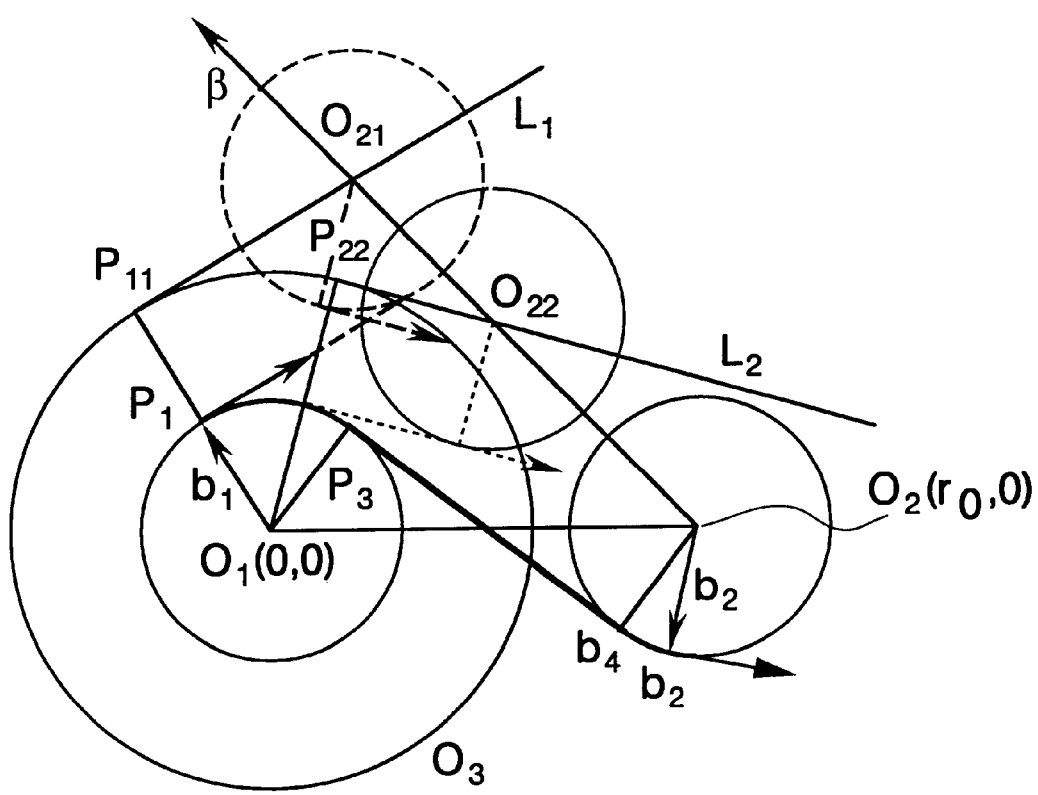
FIG. 40A and 40B are explanatory drawings for describing the contents of the directional compaction processing.
Figure 40B:
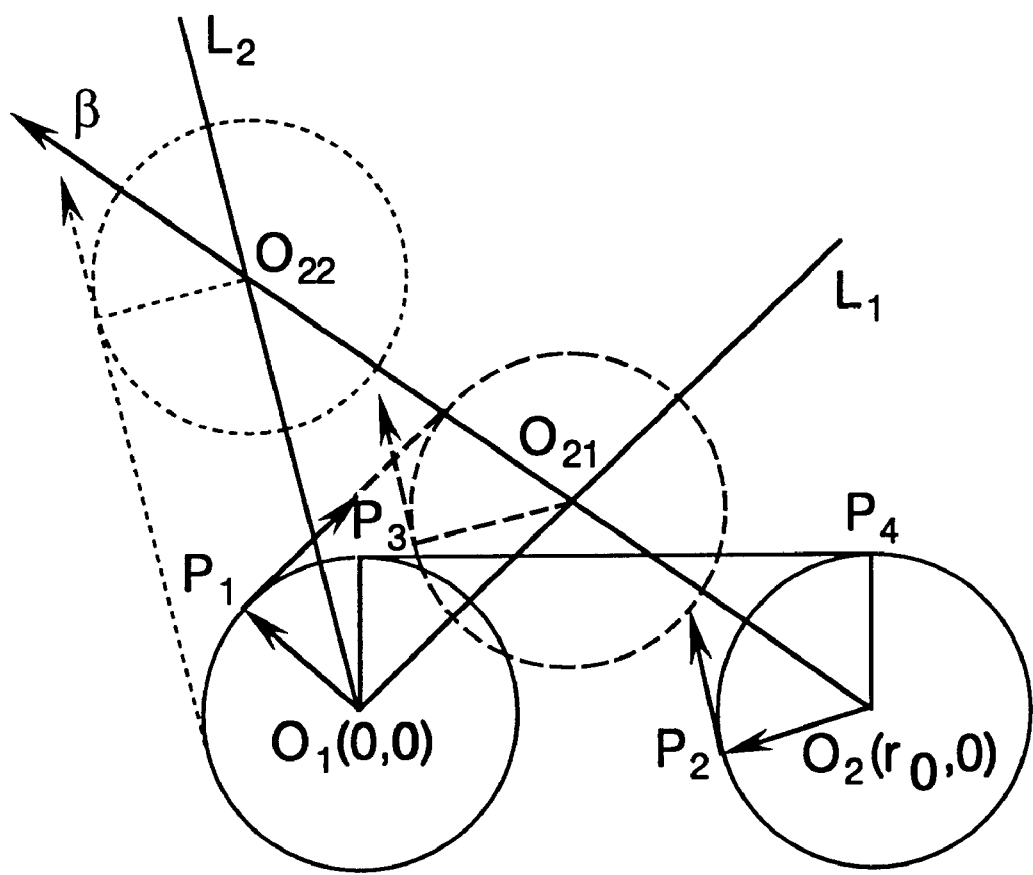

$\Theta_1$ and $\Theta_2$ are discontinuous. These equations are established when P3 is aligned with P1 and when P4 is aligned with P2. FIG. 40A and 40B show this relationship. In FIG. 40A and 40B, L1 indicates the locus of the center of the end point path circle for which $\Theta_1$ is discontinuous and L2 indicates the locus of the center of the end point path circle for which $\Theta_2$ is discontinuous.

In the following discussion, L1 or L2 designate a discontinuous half line of the starting point path circle and the discontinuous half line of the end point path circle, respectively, and the intersections between two half lines and the moving line of the center of the end point path circle are referred to as discontinuous points on the starting and the end point path circles, respectively. These candidate points can be given by the following equation. The discontinuous point on the starting point path circle is expressed by the following equation.

$$\begin{cases} \theta = a\tan\left(\frac{\sin\beta - K\cos b_1}{\cos\beta + K\sin b_2}\right) & (k_1 \neq k_2) \\ \theta = b_1 + k_1\frac{\pi}{2} & (k_1 = k_2) \end{cases} \quad \text{[Equation 12]}$$

The discontinuous point on the end point path circle is expressed by the following equation.

$$\begin{cases} \theta = a\tan\left(\frac{\sin\beta + K\cos b_2}{\cos\beta - K\sin b_2}\right) & (k_1 \neq k_2) \\ \theta = b_2 + k_2\frac{\pi}{2} & (k_1 = k_2) \end{cases} \quad \text{[Equation 13]}$$

The above both points are discontinuous.

$$\theta = \begin{cases} \beta - \Phi \\ \beta + \Phi - \pi \end{cases} \quad \text{[Equation 14]}$$

The following equation, however, is established.

$$\Phi = \text{asin} (K) \quad \text{[Equation 15]}$$

This point is called a circumscription-restricting discontinuous point.

(i-3) Summary of Minimization

When one of the end points of the path is fixed and the other end point is moved in a specific direction (see FIG. 41), the path length L is minimum at one of a maximum of three candidate points for the minimum path length including a minimal point with a minimal path-length value (Equation 9), a discontinuous point on the starting point path circle (Equation 12), and a discontinuous point on the end point path circle (Equation 13) if the rotational directions of the two path circles are equal. In addition, if the rotational directions are different, the minimal point with a minimal path-length value is expressed by Equation 6 and path length L is minimum at one of a maximum of five candidate points including two circumscription-restricting discontinuous points (Equation 14). The minimum value of the path length can be determined by computing the path length at each candidate point and selecting a minimum value.

Figure 41:
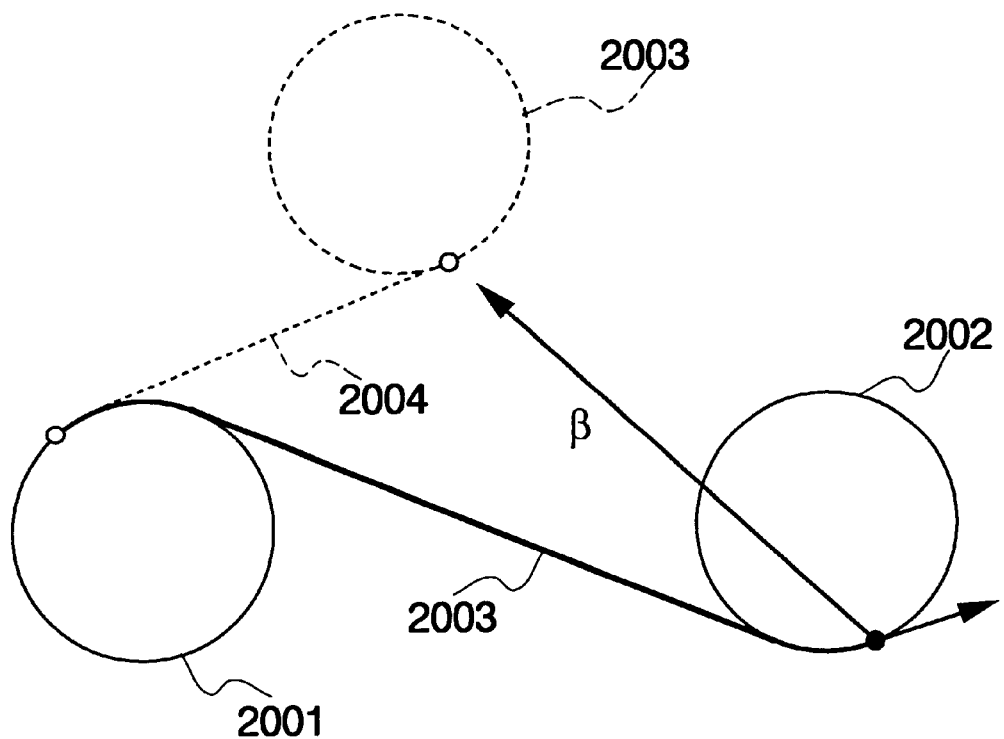
FIG. 41 is an explanatory drawing for describing the contents of the directional compaction processing.

In FIG. 41, reference numeral 2004 indicates the position of a minimum path and reference numeral 2003 denotes an end point path circle. A starting point path circle 2001 remains fixed.

(ii) A plurality of Paths

Next, the compaction of a plurality of paths is described.

If a plurality of paths are to be compacted, the movement is determined so that the sum of the lengths of all the target paths after the blocks have been moved. In the case of a single path, there are a maximum of five candidates for the minimum path length and the path length is minimum at one of these points. Thus, when the sum of the lengths of all the target paths at each of the candidate points is determined and one of the candidate points is selected at which the sum is minimum, there is a very high probability that the path length is minimum at this point. The five candidate points for a single path, however, can be used when the rotational directions of the starting and the end path point circles are predetermined. If these candidate points are applied to a different path, the length of the path may be smaller in a rotational direction different from the original rotational direction. Thus, when candidates for a single path are applied to a different path, the path length is computed for all the four rotational direction at each candidate point. Consequently, if there are N paths to be compacted, a maximum of 20N path lengths may be calculated for a maximum of five candidate points.

The operation of the system for implementing the directional compaction function is explained. The system configuration in FIG. 8 for the first embodiment can be used for the second embodiment.

Figure 42:
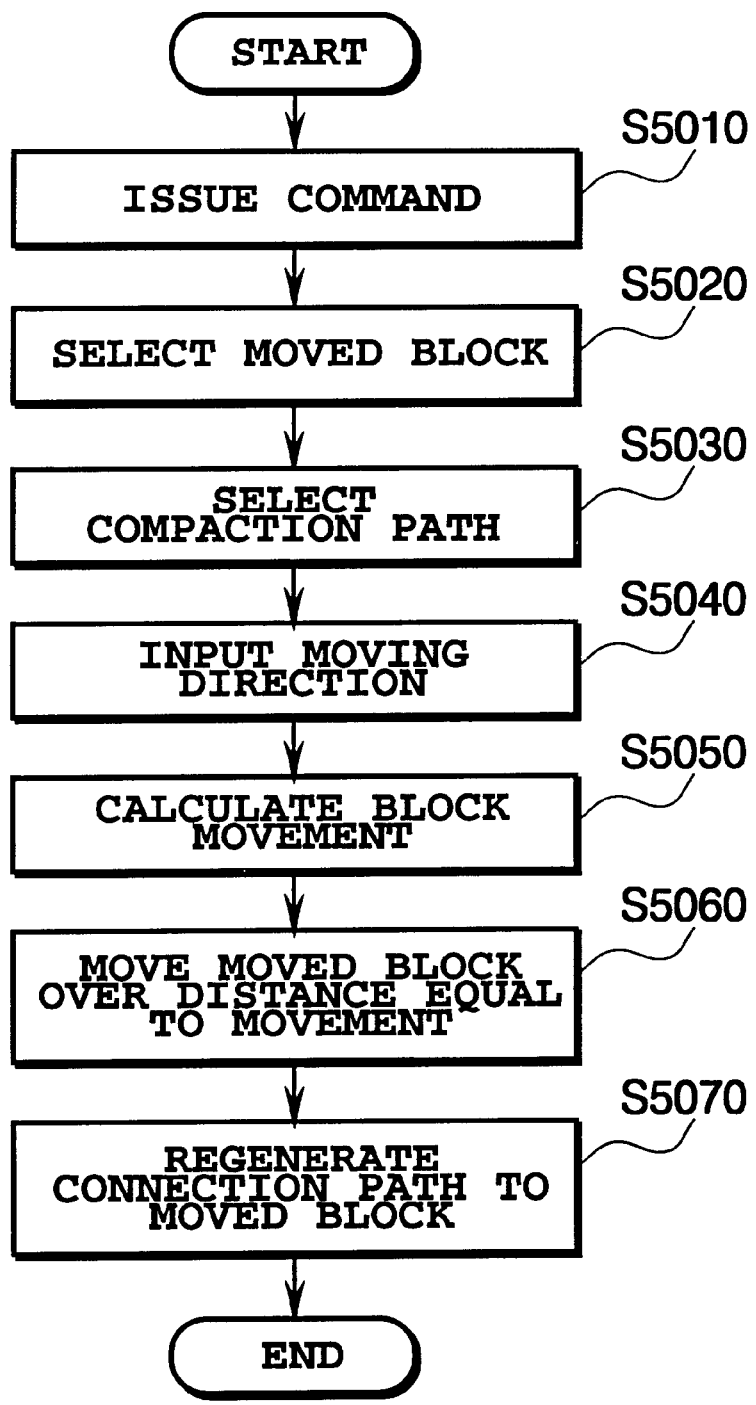
FIG. 42 is a flowchart showing the contents of the directional compaction processing.

FIG. 42 shows a main processing procedure for directional compaction executed by the CPU 101. This processing procedure is stored in the HDD 105 and executed by the CPU 101 in response to an instruction from the input device 108.

The operator uses the input device 108 to indicate a directional compaction mode. This causes a command for directional compaction to be issued (step S5012). The operator then uses the input device 108 to specify and select blocks on the display 107 to be processed (step S5020). The positions of selected blocks and paths as well as input directions are temporarily stored in the RAM 103.

The operator subsequently uses the input device 108 to indicate a path in the block to be moved, that is, a linear graphic according to this invention and to input a direction in which the path is to be moved (step S5030 to step S5040). To simplify the series of operations of the input device 108, the second embodiment provides a plurality of graphical user interfaces (GUIs described below). The operator can select a plurality of sets of blocks and paths to be processed. The end point in the selected block is assumed to be the end point P2 on the starting side. Thus, the end point P1 (FIG. 39) of the selected path in the block to which the path is connected is the end point. Using the above compaction method for one or more selected paths, the CPU 1 computes the movement of the end points on the starting side of the plurality of selected paths, and based on the results of the computation, all the specified blocks are moved (step S5050 to step S5060). In other words, the locational data on the blocks is converted into data indicating the positions obtained after the movement.

Finally, the CPU 101 regenerates the path connected to the blocks obtained after the movement and displays it on the display 107 (step S5070).

Figure 43:
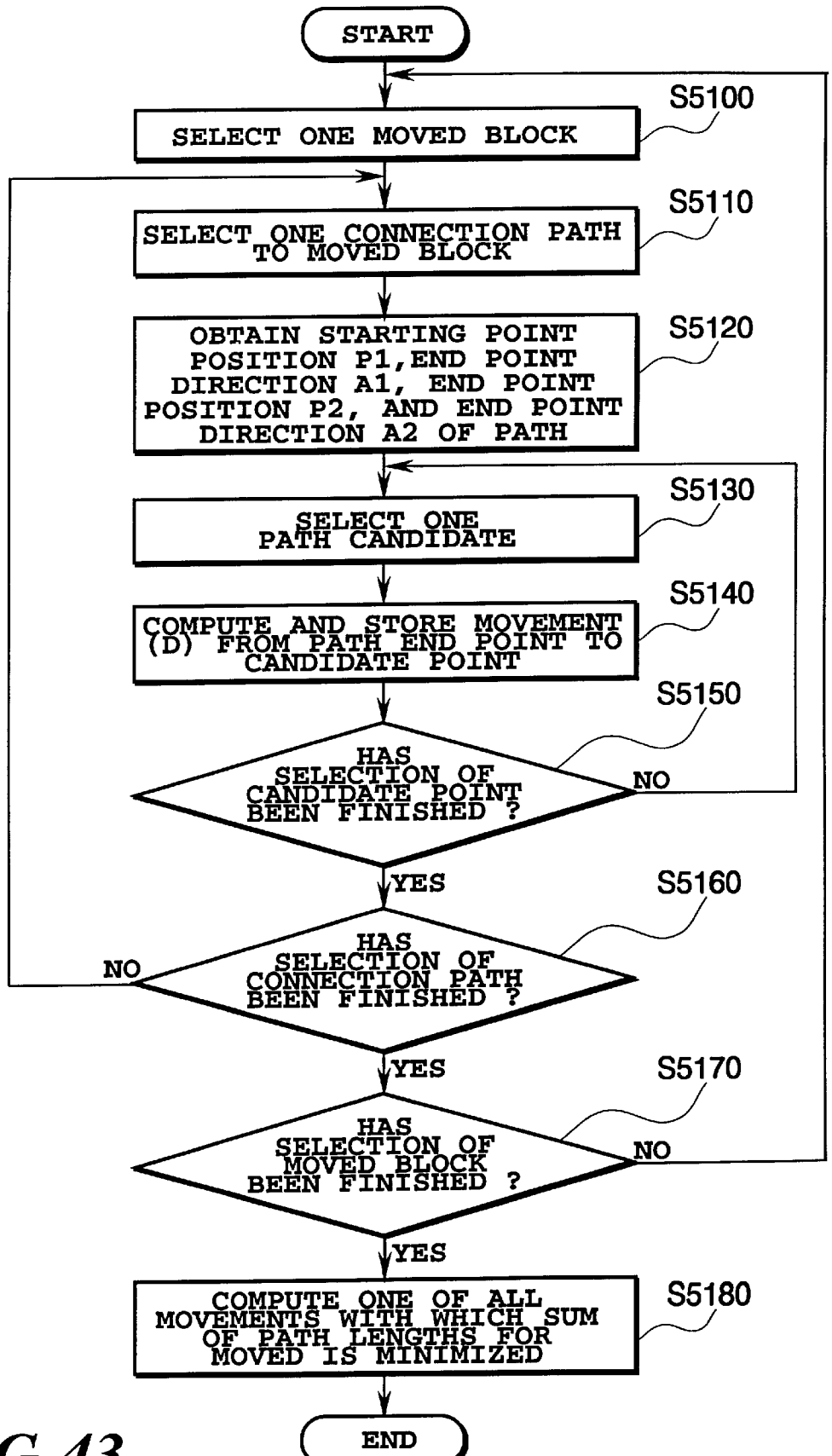
FIG. 43 is a flowchart showing the contents of the directional compaction processing.

FIG. 43 shows a detailed procedure for calculating the movement in step S5050 in FIG. 42.

In FIG. 43, the CPU 101 selects one of the plurality of selected blocks and also selects one of the plurality of paths which is associated with this block, as the one to be processed. The CPU 101 obtains the starting position (fixed) P1, starting point direction a1, end position (moved) P2, and end point direction a2 of the selected path from the locational information in the HDD 105. The CPU 101 then computes the positions of a plurality of candidate points to which the path is moved and selects one of them for calculations (step S5100 to step S5130). It then calculates distance between the position of the candidate point and the position of the current ending end point (step S5140). The results of this calculation is stored in 103.

After calculating the moving distance for one candidate point, the CPU 101 computes the moving distance for another candidate point (step S5130 to step S5140). After calculating the moving distance for all the candidate points (YES in step S5150), the CPU 101 selects another of the selected paths (step S5150 through step S5160 to step 5110) and computes the moving distance for all the candidate points for all the paths for the single block (loop processing from step S5110 to step S5160). After finishing the calculation of the movement for the one block, the CPU 101 selects another block to compute the moving distance for all the candidate points for each of the above paths. After finishing the calculation of the moving distance for all the selected blocks (YES in step S5170), the CPU 101 advances the procedure to step S5180 to select one of the candidate points with which the sum of the path lengths is minimized.

Figure 44:
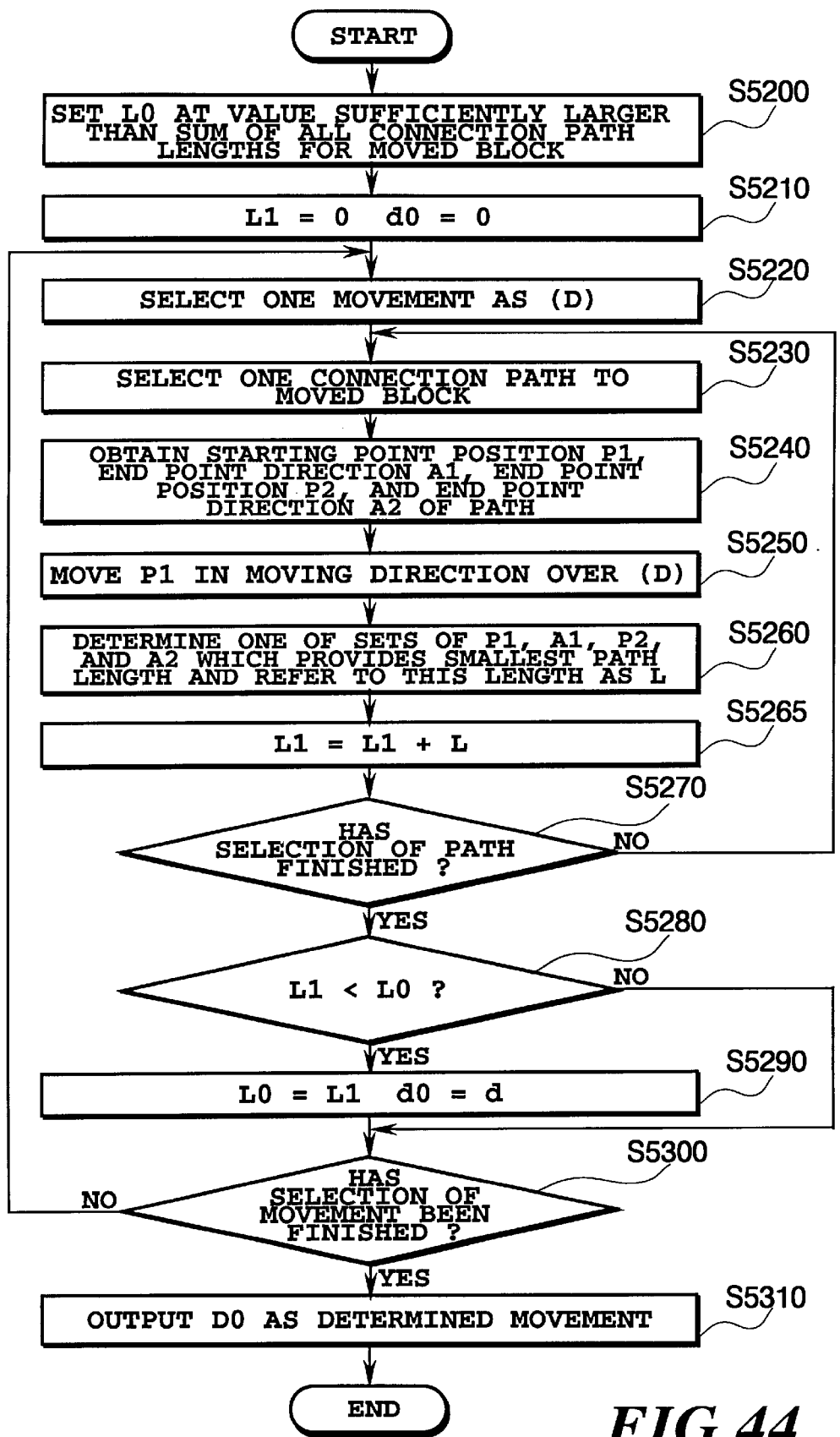
FIG. 44 is a flowchart showing the contents of the directional compaction processing.

FIG. 44 shows a detailed procedure in step S5180. In FIG. 44, variables used for calculations are first initialized (step S5200 to step S5210). Variable L0 stores the minimum value of the sum of the detected moving distances. When a new minimum value is detected, the value stored in variable L0 is updated. A sufficiently large value is set as the initial value of variable L0. Variable L1 stores the results of the addition of arbitrarily combined moving distances.

d0 stores the movement of the block to be finally determined. The initial values of variable L0 and D0 are set at 0.

It is assumed that the values of distances calculated in the above processing and stored in the RAM 103 includes those for one selected block and two selected blocks. The CPU 101 selects the value of the moving distance of one arbitrary candidate point for either path and virtually generates for the two paths a condition such as that shown in FIG. 39, where the path with the ending end point P2 is moved over the value of a selected moving distance (extension/reduction). The calculation method according to the first embodiment can then be used to calculate the lengths of the two paths obtained after moving their ending end point P2 over a selected distance, that is, the length (path length) between the starting end point P1 and the ending end point P2 after movement.

Once the two path lengths have been calculated, their sum is computed. The above processing is executed in the loop processing from S5220 to S5270. The sum of the path lengths after movement is assigned to L1 (step S5265) and compared to variable L1. Since variable L1 is set at a sufficiently large value by the initialization in step S5200, the value of variable L1 is smaller than that of variable L0. As a result, a positive determination is obtained in the comparison in step S5280.

The above operation allows the value of variable L1 to be set as the current minimum value L0 of the sums of distance values (step S5290). In addition, the value (d) of the moving distance used is simultaneously set at variable d0 as a virtual determined value. On the other hand, if the value of variable L0 is smaller than that of variable $L_1$, the minimum value L0 of the sums of distance values and virtual determined value d0 are not updated (step S5280 to step S5300).

The CPU 101 transfers the procedure to steps S5300 to S5220 to change the value of the moving distance to be selected and to calculate the sum of the path lengths obtained after movement (the value of L1). It then compares sum L1 to variable L0. When the sum of the path lengths (L1) is compared to variable L0 for all the moving distances in this manner (YES in step S5300), the value of variable d0 becomes the value of the moving distance obtained when the sum of the path lengths is minimized (step S5310). Based on the moving distance obtained, the positions of the blocks to which they will be moved and the resulting graphic of the path are generated and displayed.

If a plurality of blocks are selected, the above directional compaction is sequentially executed to determine the positions of all the blocks and the shape of the path obtained after movement before displaying the block and the path.

As described above, according to the second embodiment, when the directional compaction function is used to specify blocks to be moved and moving directions, the moving distances of the blocks are automatically determined without the operator's specifying positions to which they are to be moved.

The ending end point in the block is subsequently moved in the specified direction, and a path id generated and displayed at that position. In addition, since the automatically determined moving distances leads to a minimum sum of path lengths, the optical propagation loss from the path, that is, waveguides is minimized. Compared to the visual layout of a plurality of blocks, this automatic layout is efficient and enables the blocks to be positioned accurately. In addition, the operator is released from manually inputting positions to which the blocks are to be moved.

The directional compaction described above can arbitrarily specify the moving directions of the blocks. Practically speaking, to use the mouse to specify the moving directions, the operator must indicate two positions on the display screen. The visual specification of the positions is likely to result in errors.

Figure 45:
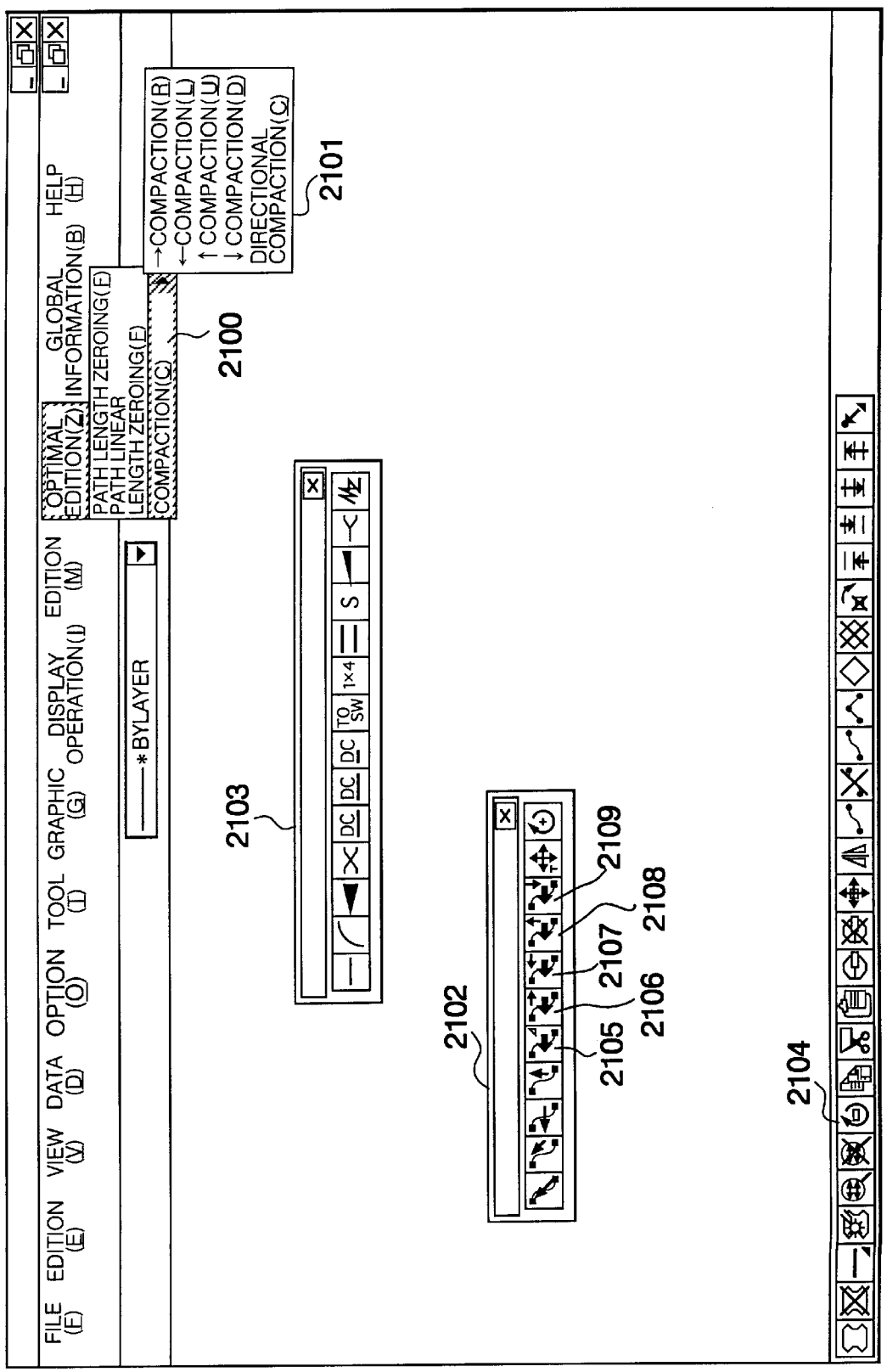
FIG. 45 is an explanatory drawing showing a popup menu and icons used for directional compaction.

The second embodiment provides two GUIs that specify particular moving directions, that is, the horizontally rightward and leftward and the vertically upward and downward directions. One of them is a popup menu and the other is icons. FIG. 45 shows an example of a display of a popup menu (called a "pulldown menu" or a "dropdown menu") and icons.

In FIG. 45, reference numeral 2100 designates a popup menu for optimal editing processing. When the mouse cursor is moved to "Compaction" and the click button of the mouse is pressed, a popup menu 2101 appears showing the types of moving directions used in directional compaction. As shown in FIG. 45, this menu enables not only the two horizontal directions and the two vertical directions but also another arbitrary direction (indicated by "Directional Compaction) to be specified. If the operator has specified any of the rightward, leftward, upward, and downward directions, then he or she will specify blocks and a path for directional compaction. If the operator has specified "Directional Compaction," then he or she will use the mouse to indicate two positions in order to input a direction.

Reference numeral 2102 indicates a window including multiple icons, and reference numeral 2105 denotes an icon that indicates the moving direction indicated by the two points specified by the mouse. Reference numeral 2106 designates an icon indicating the horizontally rightward movement. Reference numeral 2107 designates an icon indicating the vertically upward movement. Reference numeral 2108 designates an icon indicating the vertically downward movement. The window 2102 can be dragged to a desired position using the mouse. Since the icons 2106 to 2108 each include an arrow showing a moving direction, the icon to be used in moving a block can be determined by referencing the directions of the arrows and the direction in the circumferential frame of the window. In addition, since the window 2102 can be moved, the moving direction can be determined easily by the operator moving the window 2120 near the block to be moved and then operating the icon.

For the convenience of the operator, the second embodiment allows the processing modes defined in the popup menu to be indicated by the icons. Reference numeral 2103 designates a window including icons for specifying the type of a part in sizing standard parts.

Reference numeral 2104 denotes a window including icons for indicating a change in image processing or contents of display. The window 2104 includes icons for a current up, a current down, a top display, and a bottom display operations, which are described below.

Figure 46:
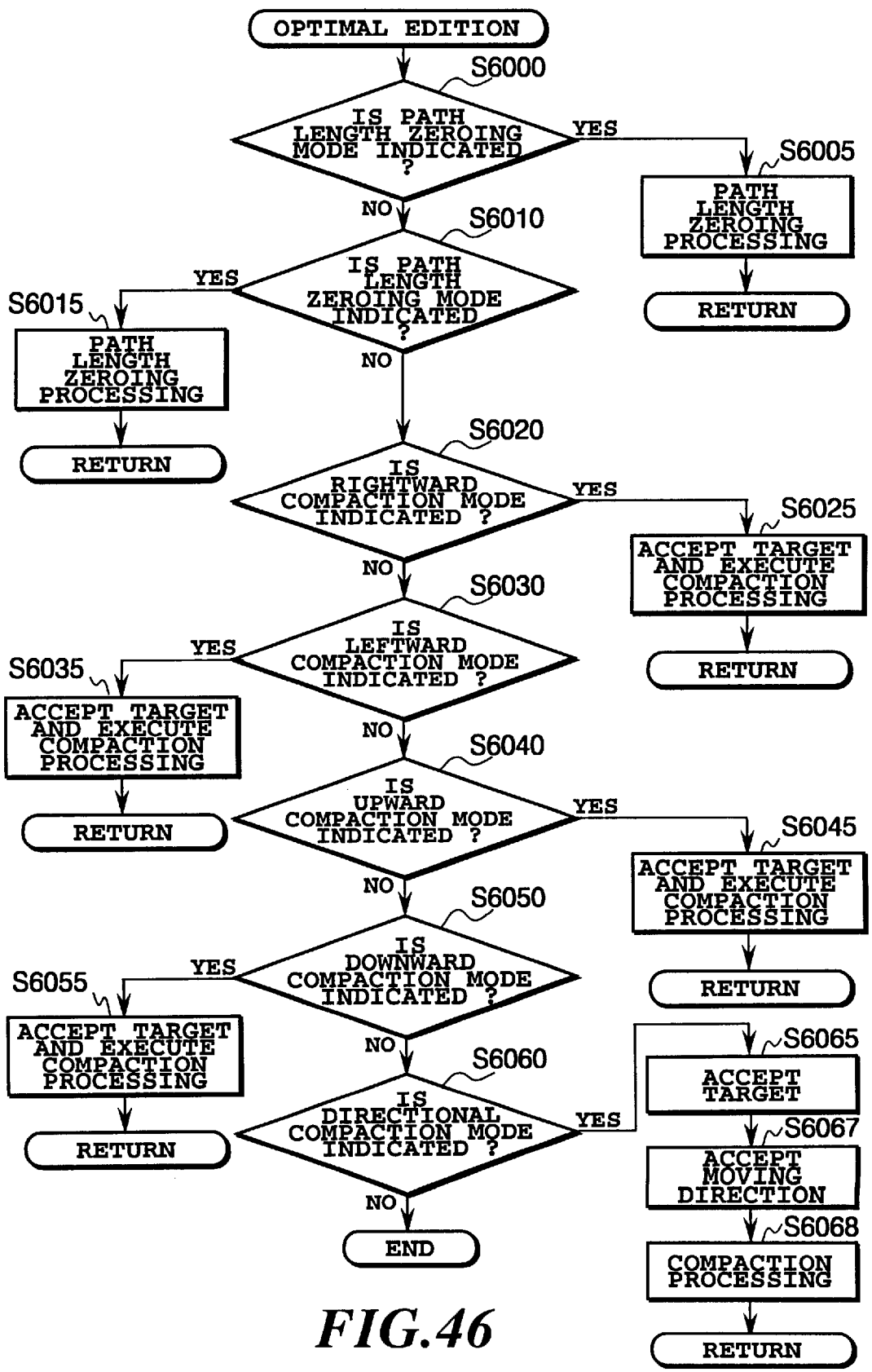
FIG. 46 is a flowchart showing the contents of the popup menu in an optimal editing mode.

A GUI that accepts instructions from popup menus and icons is used in, for example, an operating system called "Windows 95 (trademark) and well known. However, it is novel to apply such an interface to the inputting of directions for directional compaction, so the detection of operation of the popup menu or an icon and the moving operation of a window are described with reference to FIGS. 46 and 47. The path length and the path linear length zeroing functions provided in the popup menu 2100 in FIG. 45 are also described. The path length zeroing means a function for generating a path from starting end point without a circular arc reaching the straight portion of the path. In addition, the path linear length zeroing means a function for generating a path comprising only a circular arc. This embodiment automatically lays out blocks under the condition that the length of the circular or linear portion of the path is zeroed.

The operator operates the mouse, that is, the input device 108 to specify the popup menu 2100 in order to display the submenu 2101, and then, for example, specifies the horizontally rightward compaction. The operator subsequently operates the mouse to specify blocks for directional compaction via the mouse cursor. Based on the specified portion of the cursor, the CPU 101 detects the indication of the horizontally rightward compaction mode (step S6020) and subsequently loads graphical information for directional compaction from the HDD 105 onto the RAM 103.

The directional compaction is executed as described above to move the specified blocks and then to display a new path in the position established after the movement (step S6025). At this point, information indicating the moving direction as horizontal right is passed to the directional compaction program. Similar processing is executed for the horizontally leftward and the vertically upward and leftward directions. This embodiment enable an arbitrary direction to be specified. If the submenu 2101 in the popup menu 2100 has been used to specify the arbitrary direction specification mode, the operator specifies blocks for directional compaction and then uses the mouth to indicate two points in order to input that direction (step S6065 to step S6057). To input a direction, numerical values can be used to input an angle.

On the other hand, when the operator operates the mouse to specify the icon 2105 in the window 2102, the CPU 101 identifies the specified icon to detect that the horizontally rightward compaction mode has been indicated, and advances the procedure from step S6000 through step S6030 to step 6035 to execute the directional compaction processing in the specified direction (step S6035).

If the path length zeroing mode is specified by the popup menu or the icon within the window 2102, the CPU 101 receives a specified path for processing and executes the path length zeroing processing (step S6000 to step S6005). Specifically, a connection terminal of the specified block is moved to the position of the starting-point connection terminal, and drawing (rotation) is then carried out in such a way that the direction of the connection terminal of the block is aligned with the direction of the starting-point connection terminal. This determines the position of the block in the case in which the length of the path is zeroed and the display is also moved.

If the path linear length zeroing mode is indicated, the CPU 101 accepts an indicated path for processing and then executes the path linear length zeroing processing. Specifically, the circular portion and block on the ending point side are moved along the straight line so that the end of the circular arc on the starting point side will be aligned with the end on the ending point side. At this point, the directions of the ends of the two ends are aligned. By executing such semi-automatic layout processing, the operator can simply execute optimal block layout to, for example, allow one path to contact another path or a block or to reduce the redundancy of the length of the path.

Figure 47:
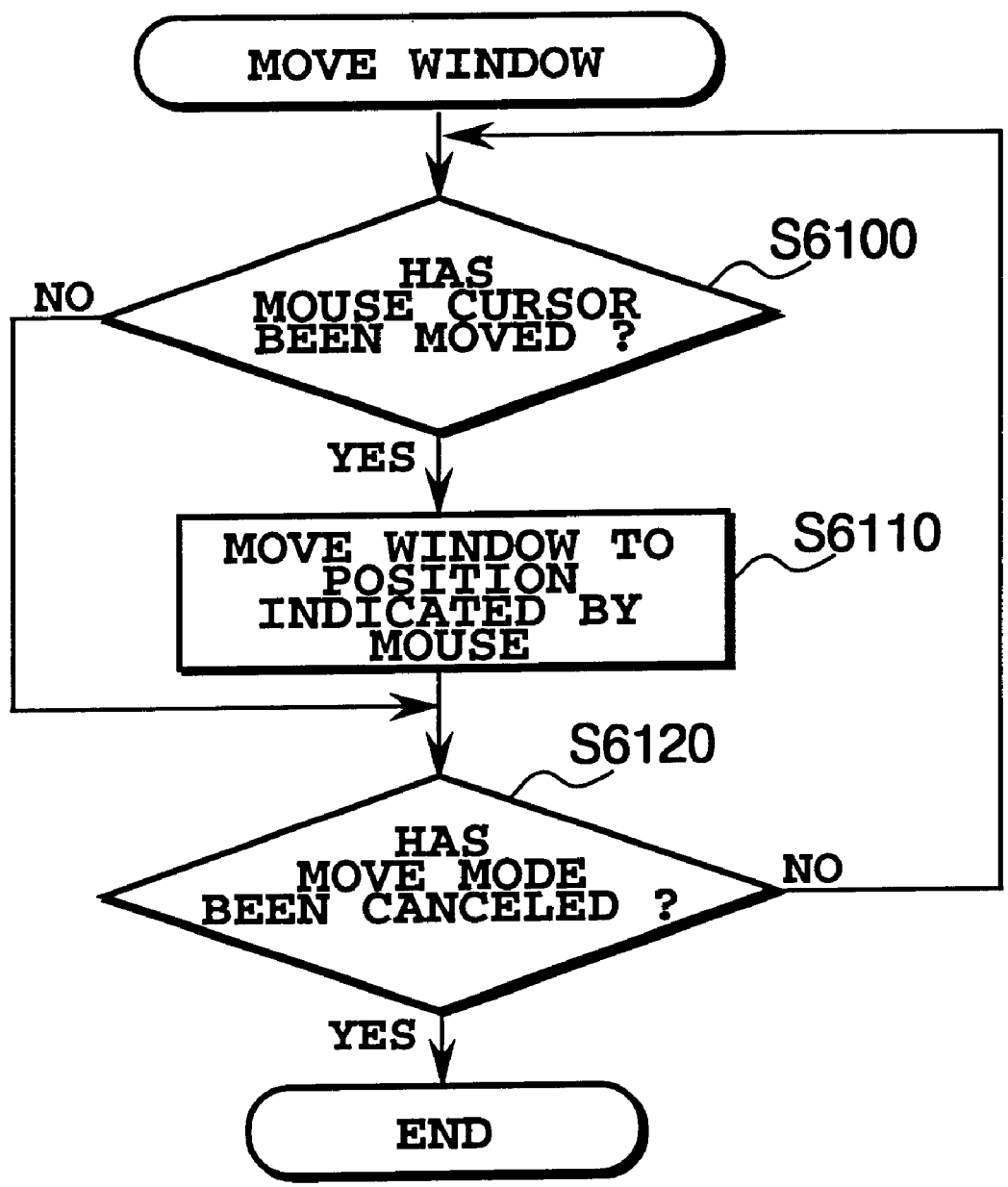
FIG. 47 is a flowchart showing a procedure for moving the window.

In addition, when the operator operates the mouse to specify the window 2102 as required, the processing procedure in FIG. 47 is activated and the window screen is moved along with the movement of the mouse cursor (step S6100 to step S6110). Then, the operator can specify an icon near the block for directional compaction. In addition, the distance over which the mouse cursor is moved to the icon for operation becomes shorter.

Figure 48:
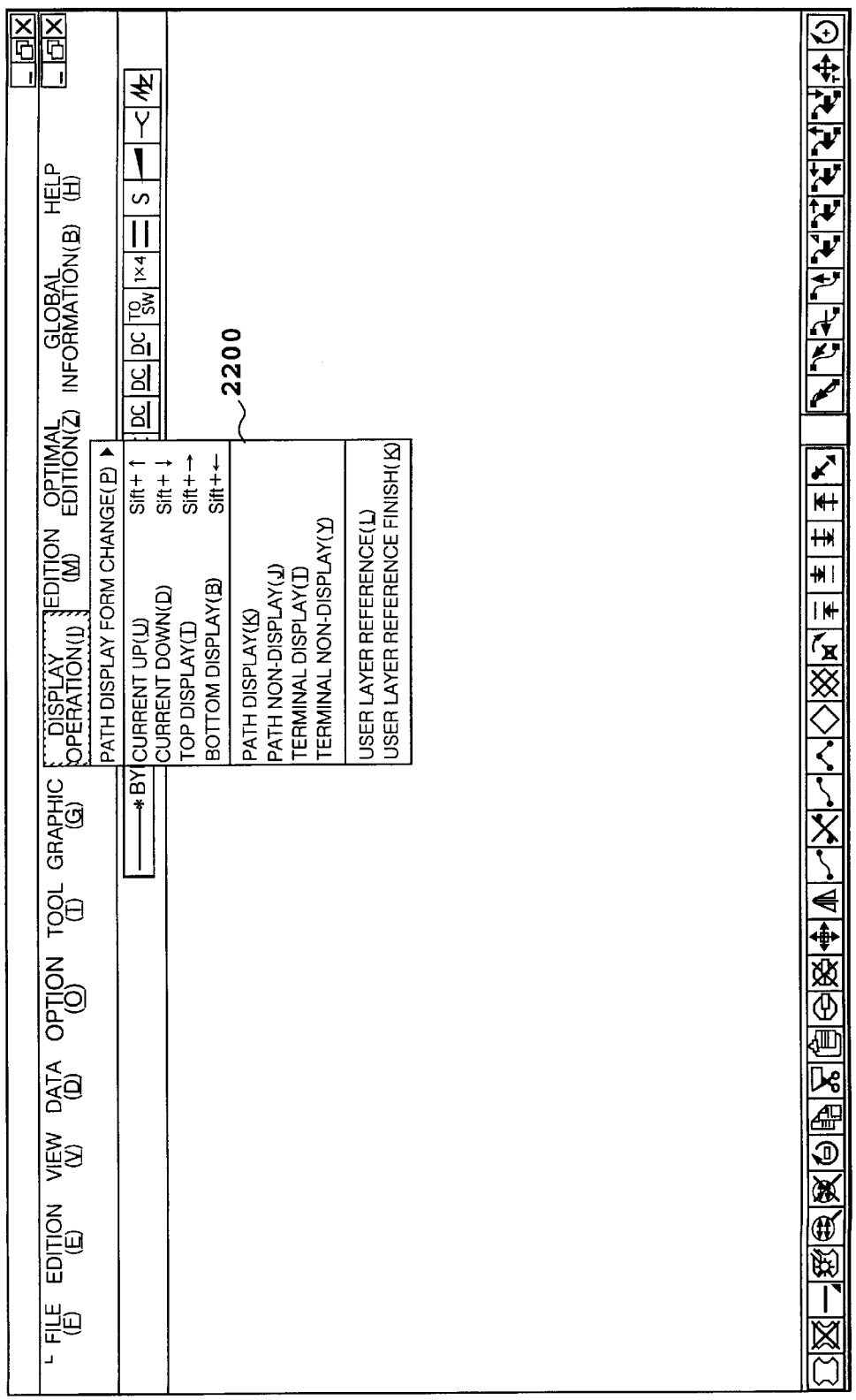
FIG. 48 is an explanatory drawing showing the contents of a popup menu for a display operation mode.

Next, a display layer switching function for connection terminal parts or blocks is explained. The operator can indicate four types of display layers in the popup menu in FIG. 48. As described in the first embodiment, the operator integrates multiple standard parts into a single block that is located in the next higher display layer. Thus, to enable easy transfer between display layers, this embodiment provides a total of four movement modes including two types of modes that move blocks upward or downward one display layer and two other types of modes that cause a jump to the top or the bottom display layer. When the operator operates the mouse to indicate any mode and a block, the CPU 101 extracts standard parts associated with the indicated block or a block in a different display layer based on information on graphics and parts stored in the HDD 105, information that is added to such information to indicate the positions of the display layers, and information indicating the association between blocks and parts in adjacent display layers.

For example, to detect an associated block in the top display layer, the associated blocks are sequentially followed upward starting with the current display layer based on the information on the association between blocks and parts. Upon detecting a block or a standard part in the specified display layer, the CPU 101 determines the shape of the graphic from the geometry of that block or standard part and displays it on the display screen.

Figure 49:
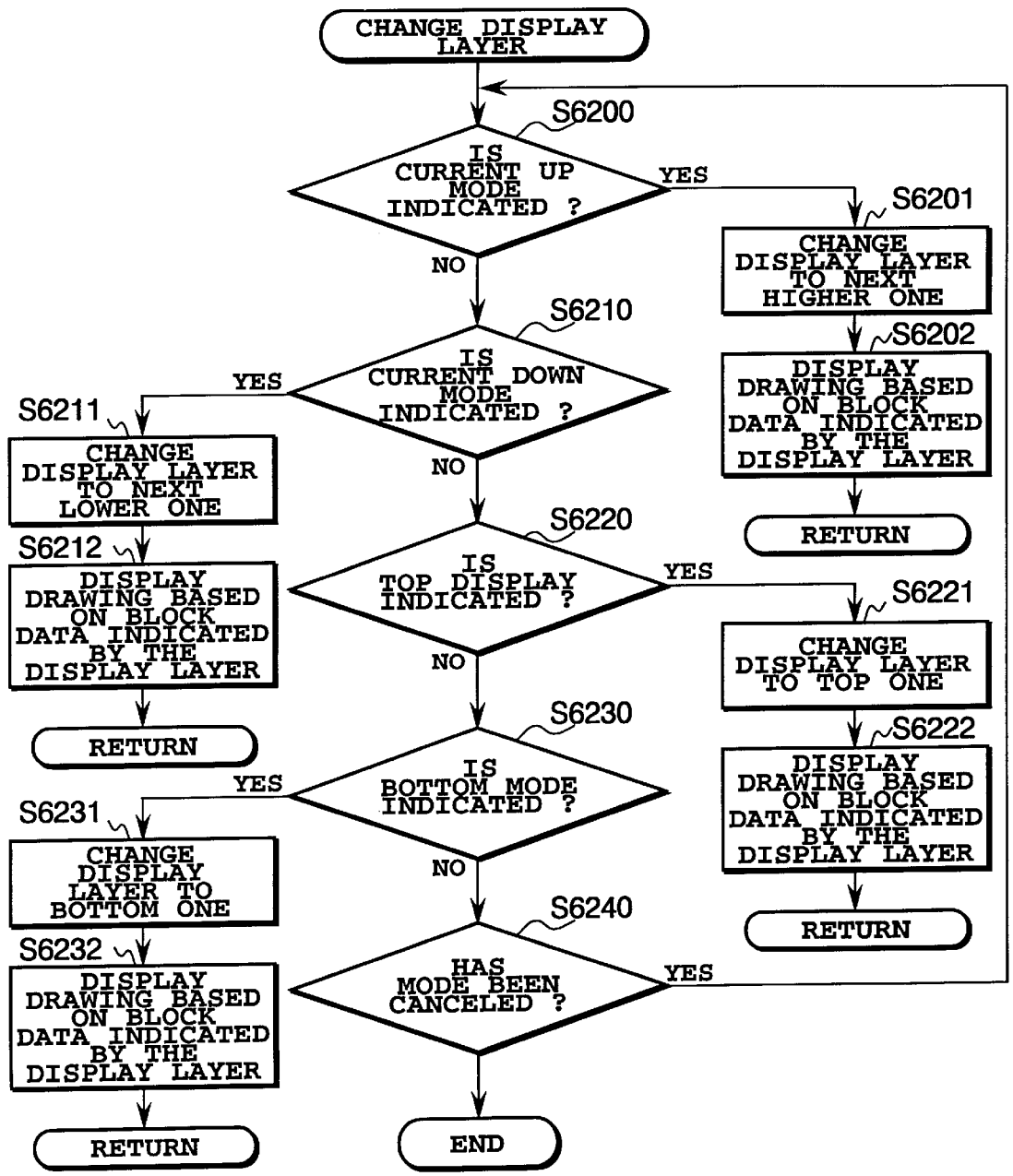
FIG. 49 is a flowchart showing the contents of a processing for changing layers.

The series of processing described above is shown in FIG. 49. In FIG. 49, the processing from step S6200 to step S6230 identifies which display layer specification mode in the popup menu has been indicated. The display layer specification mode is identified based on the position indicated by the mouse, and the display is then changed to the block in the specified display layer based on the results of the identification.

Next, a connection terminal registering function is described. The operator may desire to register the connection terminals of two block graphics that are laid out proximate to each other. In this case, delicate positioning is difficult in manually aligning two connection terminals using the mouse. Thus, the second embodiment uses the mouse to specify, for example, only one point on the X axis (that is horizontal on the display screen) to be positioned by the operator. The CPU 101 moves a connection terminal so that the X coordinate at the center of the two connection terminals will be the X coordinate of the specified point. In this case, the overall block including the connection terminal may be moved in parallel or only the connection terminal may be moved to re-form the path in the block.

Figure 51:
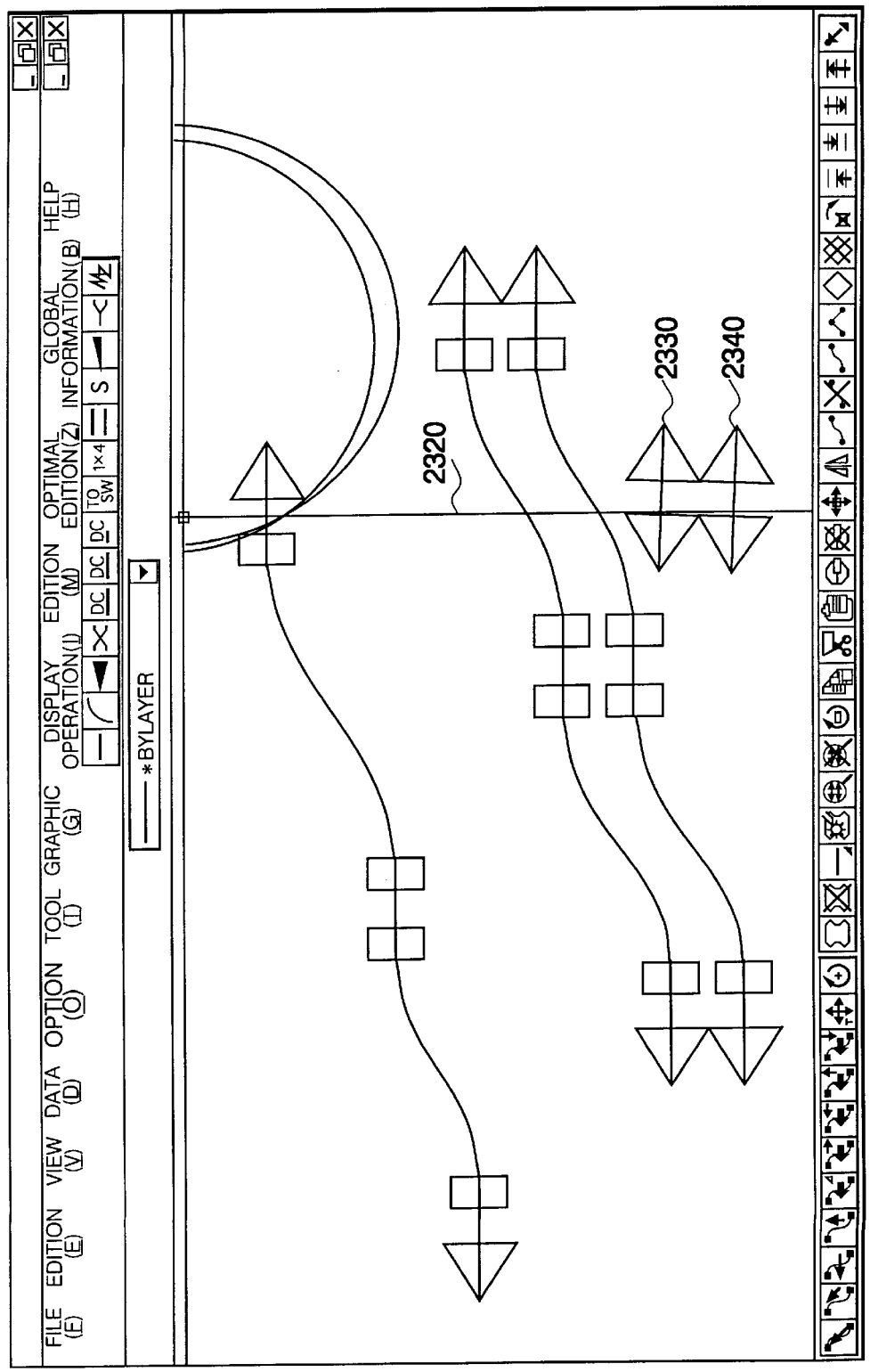
FIG. 51 is an explanatory drawing for describing a registering processing.
Figure 52:
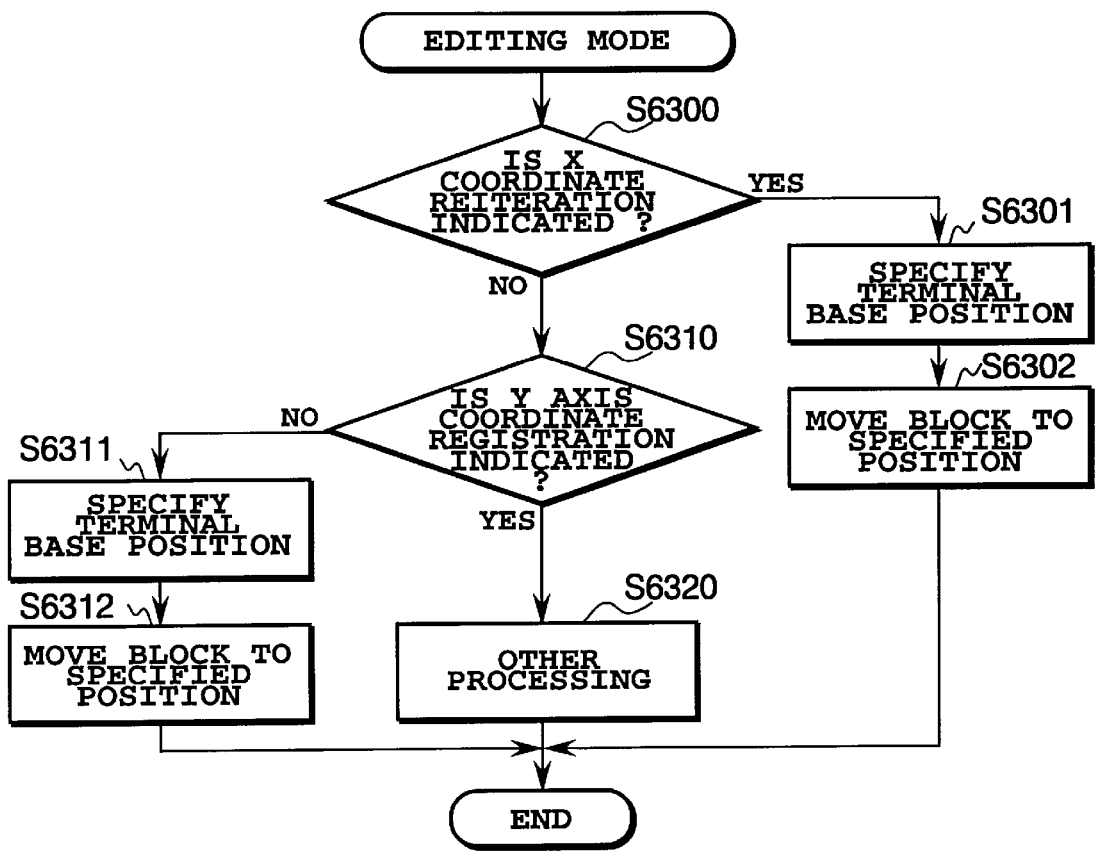
FIG. 52 is a flowchart showing a registering procedure.

According to this embodiment, the number of connection terminals for registration is not limited to two, but more than two connection terminals may be used. In addition, registration is possible on both the X axis and the Y axis (that is vertical to the display screen). Furthermore, to carry out registration, a base line 2320 is moved to specify the positions of coordinates for registration, as shown in FIG. 51. This allows the operator to specify optimal positions for registration while visually checking a part 2330 to be registered and a part 2340. FIG. 52 shows the processing procedure for the registering function described above.

Figure 50:
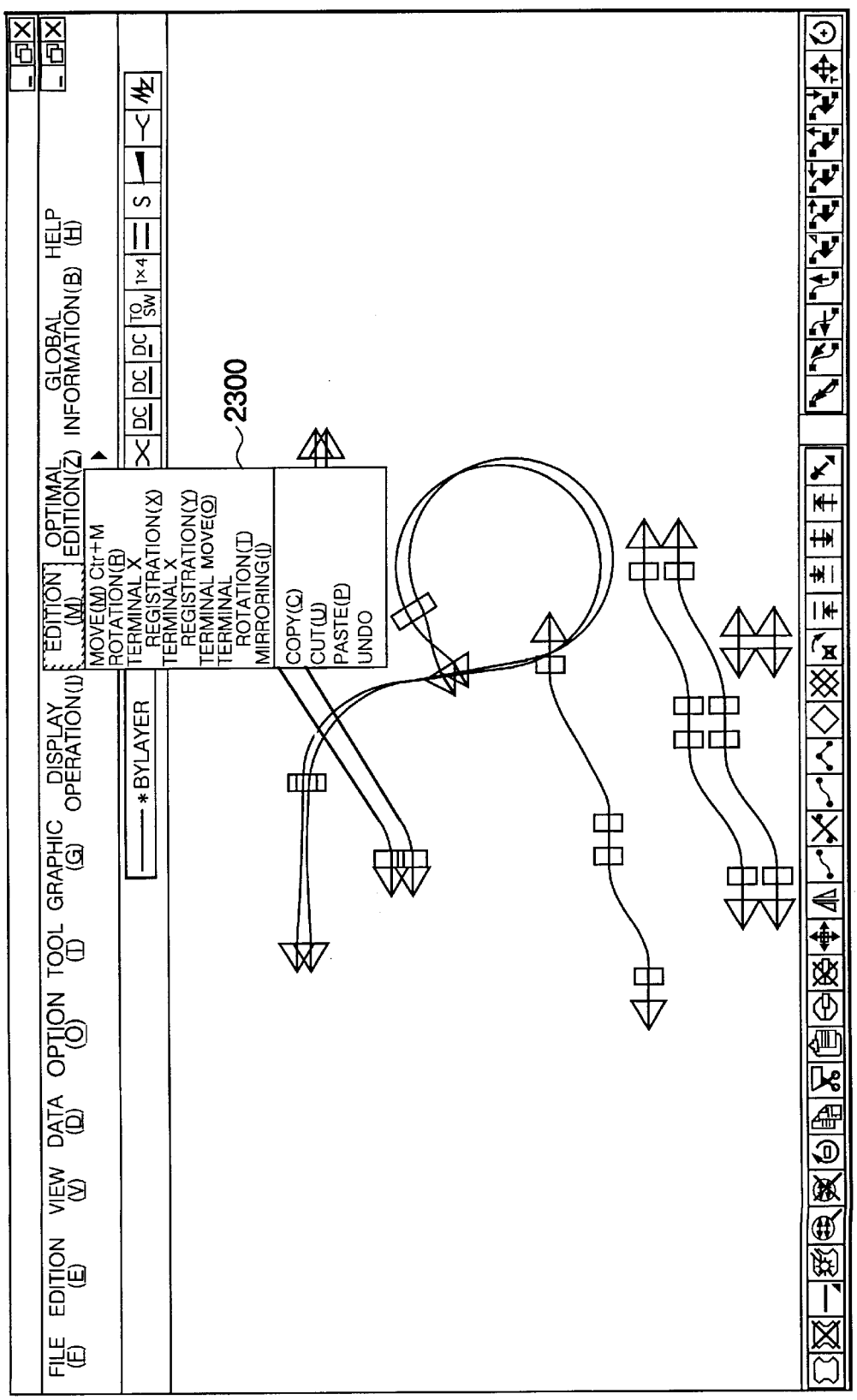
FIG. 50 is an explanatory drawing showing the contents of a popup menu in an editing mode.

The specification of registration in a popup menu 2300 in FIG. 50 is detected through the determination processing from steps S6300 and S6310. If the alignment on the X axis is indicated, the procedure proceeds from step S6300 to step S6301, in which the base line 2330 is displayed on the screen. Two lines in the directions of the X and the Y axes are displayed as base lines as shown in FIG. 51. The operator can move the base line by placing the mouse cursor on the line and moving the mouse while dragging the click button of the mouse. The operator moves the base line to a desired alignment position and then specifies connection terminals for alignment. The connection terminals may be sequentially and individually specified or simultaneously specified by enclosing them with a rectangular frame.

In response to the specification by the mouse, the CPU 101 obtains the positions of the specified base line and the displayed connection terminals and moves the displayed connection terminals in parallel with the X axis and relative to the base line (step S6301 to step S6302). Specifically, the coordinate positions to which the terminals are to be moved are set and the current display images on the RAM 103 are removed. Next, display images of tangential graphics are drawn so as to correspond to the positions on the display screen to which the connection terminals are moved. The drawing images are sent to the display 107 for display. The alignment of the base line in parallel with the Y axis is the same as the registration of the X axis except for the moving directions of the connections terminals to be processed, so its detailed description is not required. A connected path is newly and automatically regenerated as the position of a connection terminal is changed.

Next, the global function is described. The global function means a function that stores in the RAM (the storage means) 103, frequently shared parameter values and that uses a stored parameter as an input value as indicated by the user.

Figure 53:
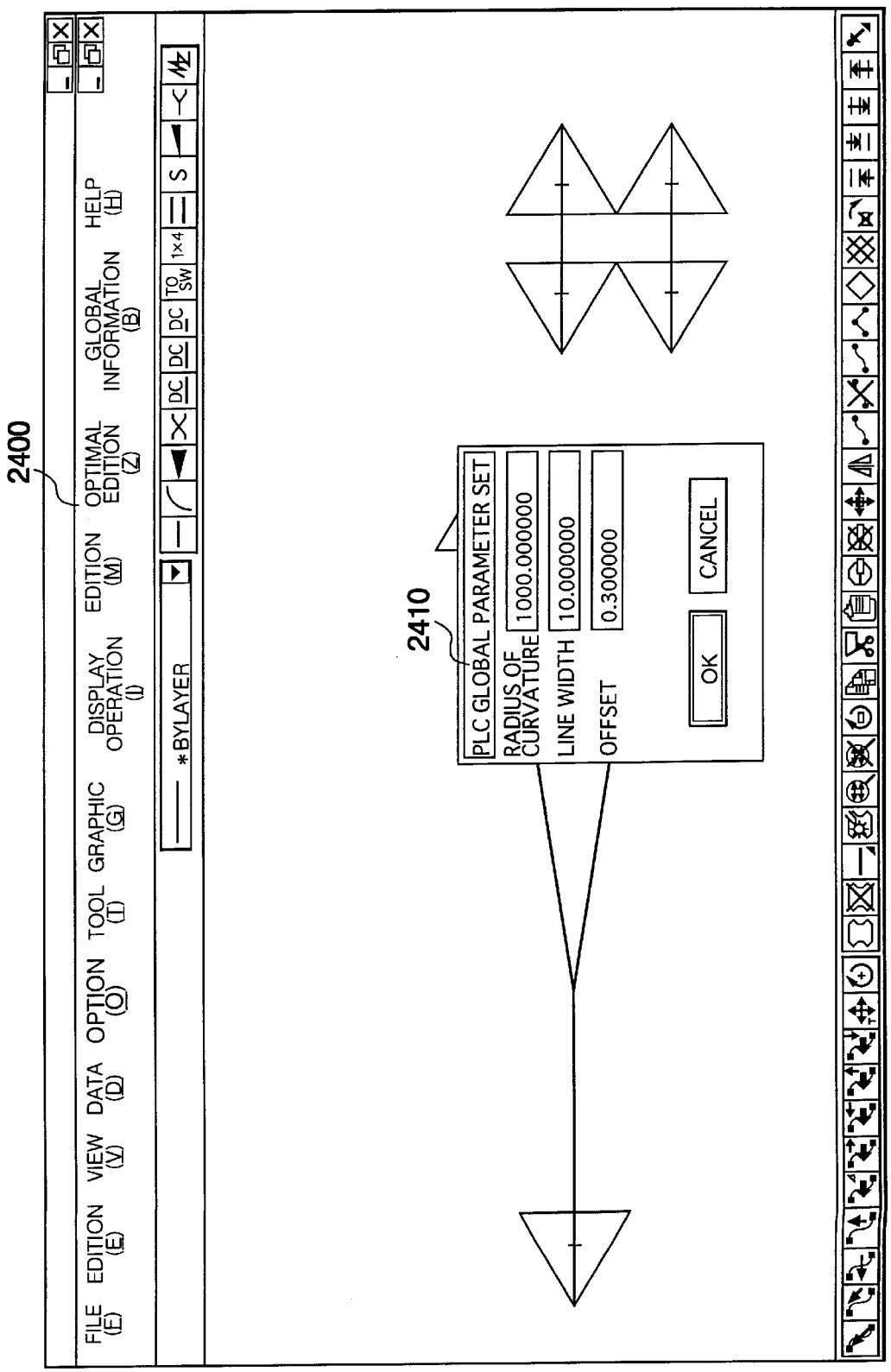
FIG. 53 is an explanatory drawing showing a screen for global edition.

When the operator specifies the global function (not shown) within the popup menu 2400 using the mouse, a setting screen 2410 is displayed. In the example in FIG. 53, four types of parameters can be stored. A first parameter is the radius of curvature, that is, the radius of the vertical circle described above. Thus, the radius of curvature of a circular portion of a displayed path has a value set in this setting screen unless otherwise specified.

A second parameter is the width of a waveguide. A third parameter is an offset. The offset has been described in the first embodiment and does not need to be explained. The values of the parameters set in the setting screen 2410 are saved to the HDD 105 via the RAM 103 for backup and are not lost even if the power supply to the image processor is interrupted. While power is being supplied to the image processor, the values stored in the RAM 103 are used, and as a value in the RAM 103 is modified, the corresponding value saved to the HDD 105 is updated. Since the RAM normally operates faster, this saving method enables fast image processing and prevents information in the RAM 103 from being lost when the power supply is interrupted.

Figure 54:
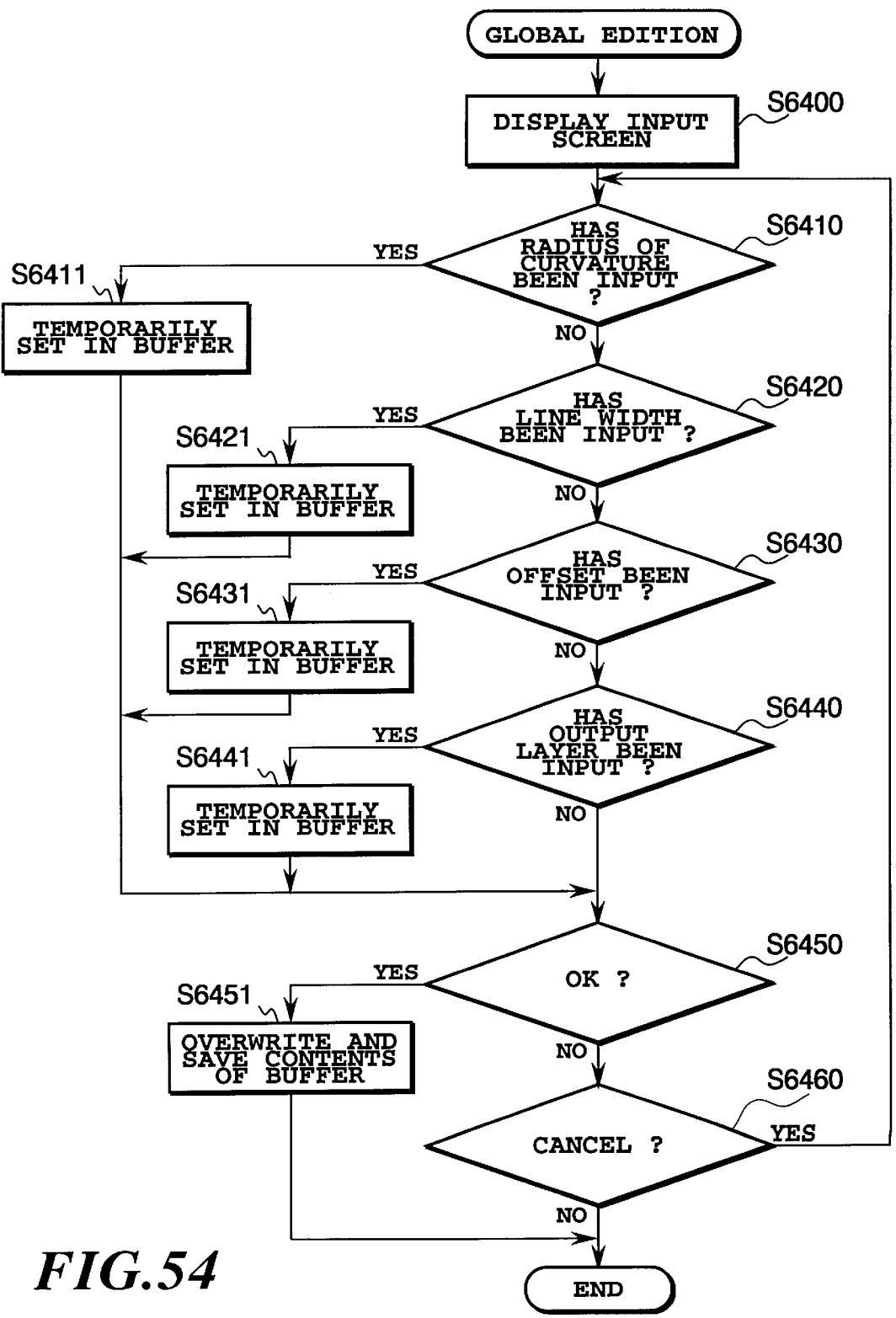
FIG. 54 is a flowchart showing the contents of global edition.

FIG. 54 shows the procedure for executing the above processing. In response to the specification of the global function within the popup menu 2400, a program describing the processing procedure in FIG. 54 is activated. At step S6400, the setting screen 2410 first appears, and during initial processing subsequent to a power on operation, the parameter values stored in a buffer (a specific exclusive storage region) within the RAM 103 are read by the CPU 101 and displayed on the display screen.

When, for example, the operator input a value of radius of curvature from the keyboard, that is, the input device 108, the corresponding value stored on the RAM 103 is changed to the input value and the currently displayed value is also changed to this value (step S6410 to step S6411). When the operator modifies the value, since the OK button has not been operated, the procedure passes from S6410 through steps S6411 and S6450 to step S6410 to accept the modify data input by the operator.

If another parameter, for example, an offset is input, the procedure passes from S6410 through steps S6420 and S6430 to step S6431 to update both the corresponding value stored on the RAM 103 and the corresponding displayed value. When the operator operates the OK button, a positive determination is obtained in the determination processing at step S6450, so the CPU 101 saves to the exclusive region of the HDD 105 for backup, the four parameter values stored in the RAM 103 (step S6451).

Figure 55:
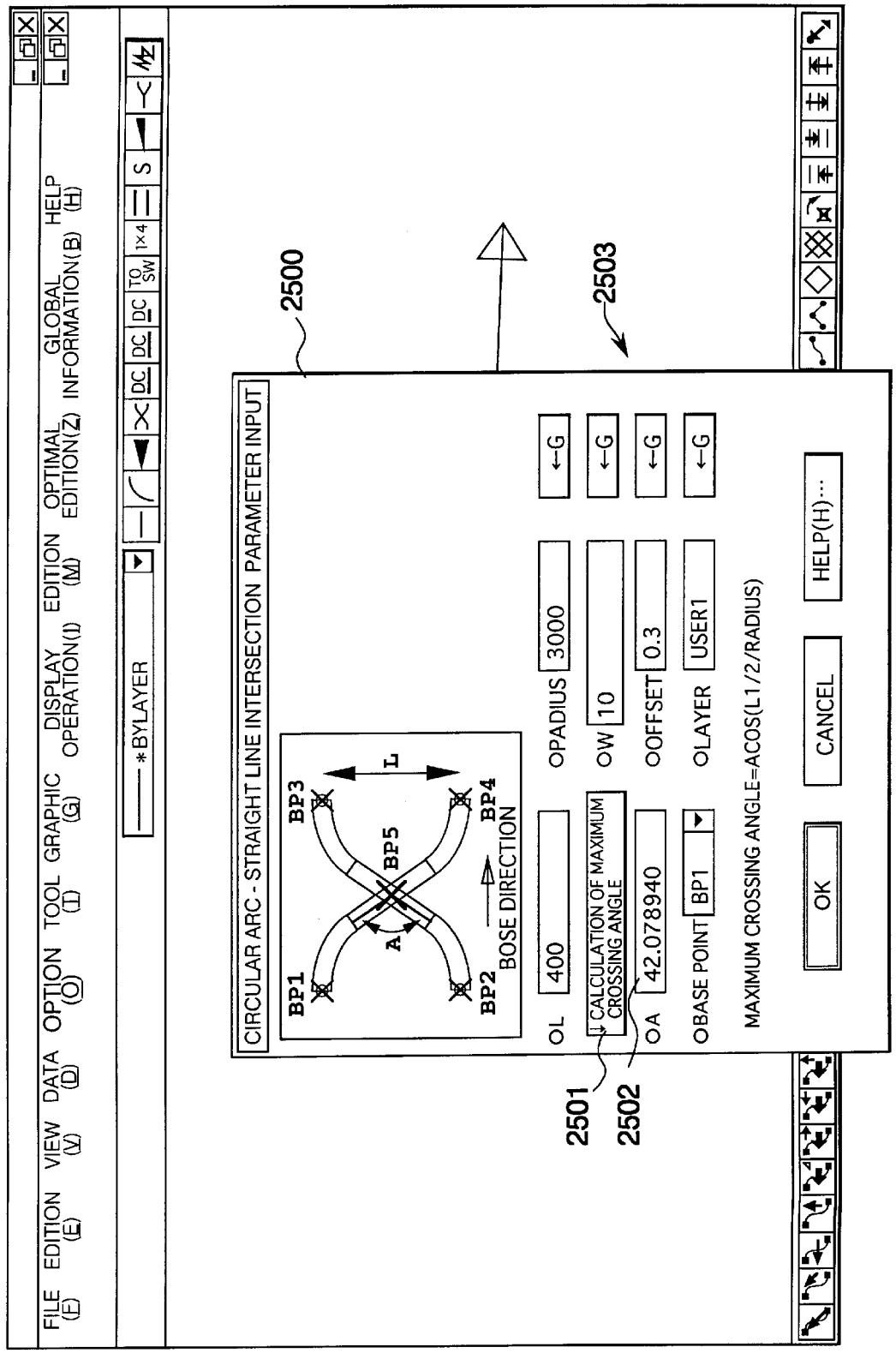
FIG. 55 is an explanatory drawing showing an example of the display of a display part setting screen.

An example of the parameters set in this manner is explained below. FIG. 55 is a standard part setting screen that is displayed by an instruction from an icon or the popup menu.

When the four buttons designated by reference numeral 2503 (each represented as "G") are operated, the values of the four parameters stored in the RAM are initially displayed. The operator then modifies the displayed initial values as required to set a radius of curvature, a line width of waveguides, an offset, and a relevant layer which are all unique to this standard part.

This setting screen also enables the setting of two types of parameters unique to this standard part, that is, the length between two waveguides represented by L in the figure and the crossing angle of the waveguides represented by A in the figure. The operator, however, must set only one of the parameters, and once the value of one of the parameters has been set, the value of the other parameter is calculated using a predetermined equation with the results of the calculation displayed. This equation includes a constraint unique to the standard part. For example, the length of the standard part perpendicular to the direction of length L in the figure cannot be set by the operator and always has a constant value. Consequently, the crossing angle is determined by the radius of curvature and L, whereas length L is determined by the radius of curvature and the crossing angle.

This inputting form enables one of the values to be set as an integral value as described in the description of the first embodiment.

Figure 56:
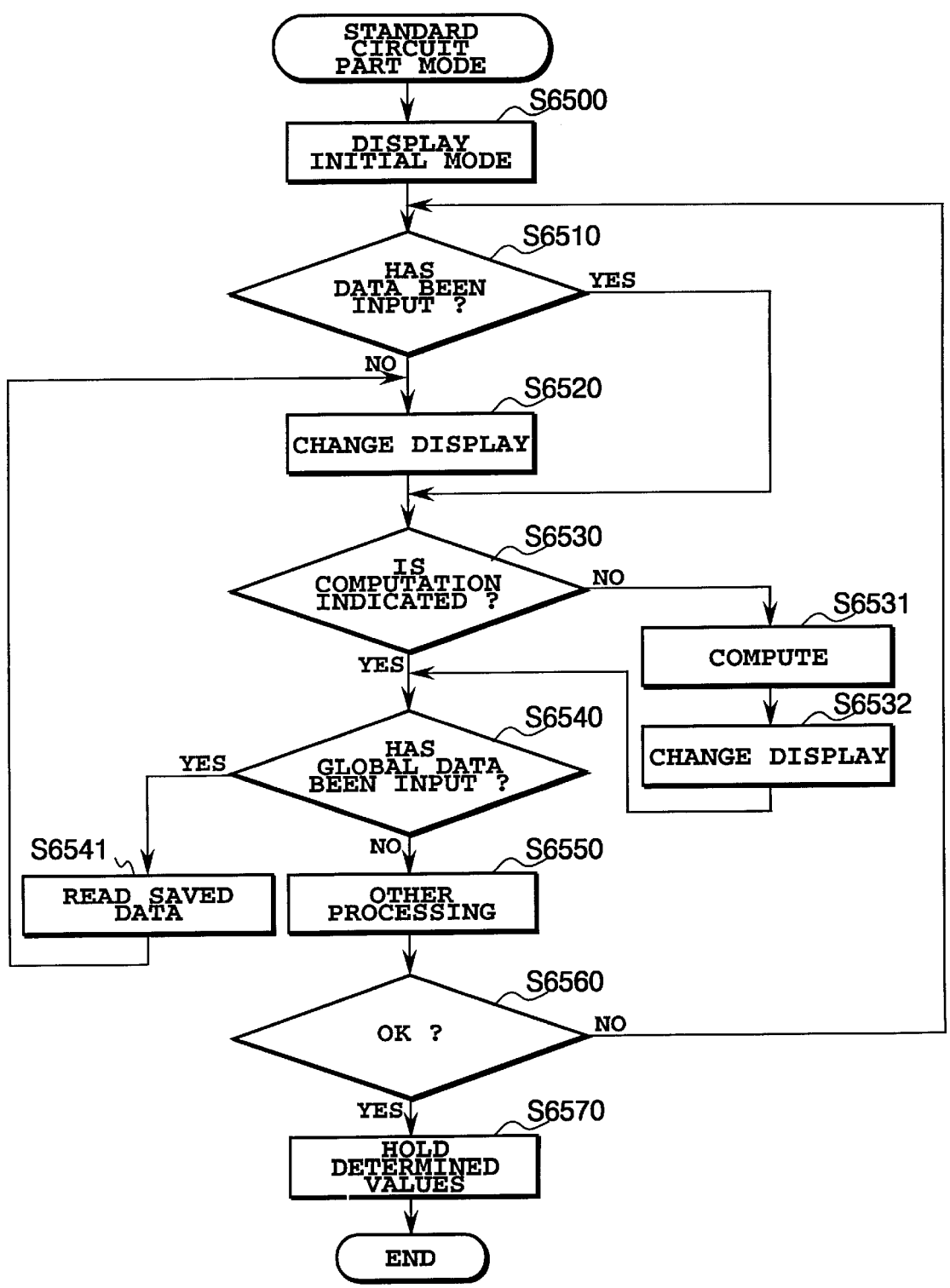
FIG. 56 is a flowchart showing a detailed procedure for setting standard parts.

FIG. 56 shows the procedure for setting the parameters of a standard part. Upon receiving the indication of the type of the standard and the indication that the parameters will be set, the CPU 101 activates the processing procedure in FIG. 56 to display a setting screen corresponding to the type of the standard part (step S6500). At this point, if the global function is used, the values of the parameters stored on the RAM 103 are displayed. The user inputs a desired parameter (in the example in FIG. 55, the value of L) and operates a button 2501 indicating a calculation for a maximum crossing angle. This causes the procedure to pass from step S6510 to step S6520 and displays the input value. In addition, in response to an instruction for execution of a calculation (step S6530), the CPU 101 computes the maximum crossing angle (determined from one of the parameters) and displays the result of the computation as an input value (step S6532).

On the other hand, to use the value of the radius of curvature of the standard part stored in the RAM 103, which is thus shared, the operator operates one of the group of buttons 2503 which relates to the radius of curvature. Then, the data saved to the RAM 103 is displayed in the section in which set values are input (step S6540 to step S6541). If the shared value is to be modified, the operator specified a modified portion of the currently displayed value, removes that digit, and inputs a new digit (step S6541 through steps S6520 to S6560 and step S6510 to step 6520). After this modification processing, to set the displayed value, the operator operates the OK button. In response to this operation, the procedure passes from step S6560 to step S6570 and the currently displayed parameter values are saved to the HDD 105 as set values (step S6570).

According to the second embodiment, the block graphics in the top layer (those parts or block graphics which have no higher layer) are displayed with a color different from that of the other block graphics for distinction. This distinction can be achieved by highlighting the display, showing the graphics with broken lines, or displaying identification characters.

Figure 57:
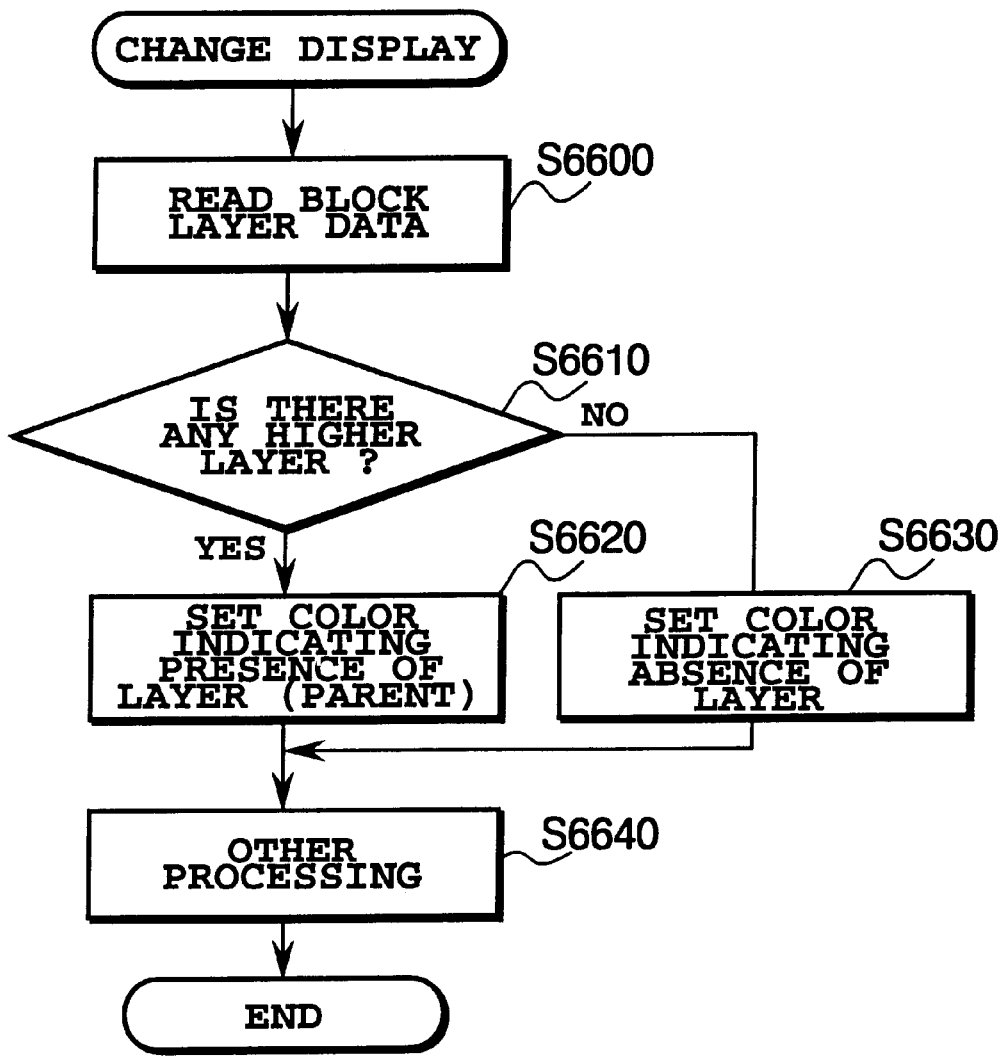
FIG. 57 is a flowchart showing a processing procedure for indicating whether there is a higher layer.

FIG. 57 shows the relevant processing procedure. In this example, each time new block graphic is displayed, the processing procedure in FIG. 57 is executed to reference the layer information on the block graphic in order to determine whether it has a higher layer (step S6600 to step S6610). Depending on the results of this determination, the display color of the block graphic to be newly displayed is determined (steps S6620 and S6630).

As described above, the image processing method described in the second embodiment enables the manual layout operation to be automated, thereby reducing the labor required for the operation and improving the degraded accuracy in positioning and the delayed determination of a layout associated with the manual operation.

Although this embodiment has been described in conjunction with an optical circuit that uses light as information-propagating medium, this invention is applicable to a microwave monolithic integrated circuit (MMIC) that uses microwaves as an information-propagating medium.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A circuit design system that represents as graphic images a plurality of parts of a circuit and waveguides connecting connection terminals of the parts to lay out the graphic images on a display screen in order to lay out and design a circuit including the plurality of parts and said waveguides, comprising:

a storage device for storing information of correlationship which is previously determined and identifies correlationships among line information describing shapes of graphic images selectively using a straight line and a curved line, and positions and directions of two end points of the graphic image which represents a waveguide;

an indicator for indicating positions and directions of said two end points for a waveguide in the form of the positions and the directions of the connection terminals of said parts to be connected by the waveguide;

a data processor for obtaining the line information from the indicated positions and directions of the two end points based on the correlationship information stored in said storage device;

an image processor for generating the graphic image for the waveguide indicated by the line information obtained; and a display for associating the generated graphic image of the waveguide with the graphic image of the part for display; wherein said graphic image is formed of a straight line and a circular arc; and said image processor assumes two virtual circles having the positions of said connection terminals as first contacts, draws a virtual straight line contacting the two virtual circles to obtain two second contacts between the straight line and said two virtual circles, and forms said graphic image from a segment connecting said two second contacts together and two circular arcs leading from said two connection terminals to the first contacts of said two virtual circles.

2. A circuit design system according to claim 1, wherein said waveguides propagate light and wherein said correlationship meets optical constraints required of said waveguides.

3. A circuit design system according to claim 2, wherein said optical constraints are that the directions of said connection terminals are aligned with the directions of said end points and that curvature of the curved line of said graphic image is within a predetermined range.

4. A circuit design system according to claim 1, further including a connection terminal specifying logic for indicating a connection terminal of the graphic image of a part to be registered; a position indicator for indicating a position for registration; and an image processing graphic image moving logic for moving the graphic image of said part with the connection terminal in such a way that the connection terminal is placed at the indicated position.

5. A circuit design system according to claim 1, wherein said system predetermines optimization conditions for changing the shape of a laid-out graphic image composed selectively of the straight line and the curved line and includes a graphic image specifying logic for specifying one of said graphic images composed selectively of the straight lines and the curved lines displayed on said display screen which is to be processed, wherein the shape of the specified graphic image composed selectively of the straight line and the curved line is changed according to said optimization conditions, and wherein, based on the position of one of the two graphic images of parts connected to said graphic image composed selectively of the straight line and the curved line obtained after re-shaping and the other part connected to said graphic image composed selectively of the straight line and/or the curved line are re-arranged.

6. A circuit design system according to claim 1, further including a number indicator for indicating the number of said circular arcs wherein said image processor generates the graphic image including an indicated number of circular arcs.

7. A circuit design system according to claim 1, further including a radius of curvature indicator for indicating the radii of curvature of said circular arcs and wherein said image processor generates the graphic image including arcs with the indicated radii of curvature.

8. A circuit design system according to claim 1, wherein there are a plurality of graphic images determined by said correlationship information and wherein said image processor calculates the lengths of the plurality of graphic images and determines a shortest graphic image to be displayed.

9. A circuit design system according to claim 1, wherein there are a plurality of graphic images determined by said correlationship information and wherein said image processor calculates a sum of the angles subtended by circular arcs included in the plurality of graphic images and identifies one of the graphic images with a minimum sum of the arc angles to be displayed.

10. A circuit design system according to claim 1, further including a changed position indicator for indicating a changed position on the display screen for said part, wherein, in response to an indication from said changed position indicator, said image processor changes said position on the display screen.

11. A circuit design system according to claim 10, wherein there is a correlationship between the position of said part and the positions of the connection terminals of the part, wherein said system further includes a determination logic responsive to an indication from said changed position indicator to determine whether said graphic image is connected to the connection terminal of the part for which the changed position has been indicated, and wherein when the result of the determination is positive, said image processor obtains the changed position of said connection terminal and regenerates a graphic image composed selectively of a straight line and a curved line in such a way that it is connected to the connection terminal, based on the position of the part after change.

12. A circuit design system according to claim 11, wherein said changed position is generated by editing the graphic image of said part.

13. A circuit design system according to claim 1, further including a grouping indicator for indicating grouping and graphic images of a plurality of parts to be grouped, and wherein said image processor integrates the indicated graphic images of the plurality of parts into a single graphic image.

14. A circuit design system according to claim 13, further including an ungrouping indicator for indicating ungrouping and graphic images of parts to be ungrouped, wherein said image processor stores layout information on the part graphic images that have been integrated when said single graphic image has been generated in response to the indication from said grouping means, and wherein when said ungrouping indicator indicates ungrouping, said image processor recovers the graphic images of the plurality of parts present prior to the integration based on said layout information, with said display displaying the graphics of the recovered parts instead of said single graphic image.

15. A circuit design system according to claim 1, further including a guide and display logic for guiding and displaying a plurality of different parts and a part selection logic for selecting those of the plurality of different guided and displayed parts which are to be laid out, wherein said image processor generates graphic images of the selected parts for display.

16. A circuit design system according to claim 15, further including an input logic for inputting dimensional information indicating the shapes of the parts selected by said part selection logic, wherein said image processor shapes the graphic images of the selected parts based on the input dimensional information.

17. A circuit design system according to claim 1, further including a cut indicator for indicating cutting and a graphic image composed selectively of a straight line and a curved line to be cut, wherein, in response to the cut indication, the straight line graphic image is removed from the display screen.

18. A circuit design system according to claim 1, further including a waveguide graphic image conversion indicator for indicating a conversion from a graphic image composed selectively of a straight line and a curved line into a waveguide graphic image indicating the shape of a waveguide, wherein, in response to the image conversion indication, said display changes said graphic image composed selectively of a straight line and a curved line to a predetermined waveguide graphic image for display.

19. A circuit design system according to claim 18, further including a graphic image conversion indicator for indicating a conversion from said waveguide graphic image into the converted graphic image, wherein, in response to the indication, said display changes said waveguide graphic image to said graphic image composed selectively of a straight line and a curved line for display.

20. A circuit design system according to claim 1, wherein a first graphic image indicating that said graphic composed selectively of a straight line and a curved line is connected to a connection terminal and a second graphic image indicating that said graphic image composed selectively of a straight line and a curved line is not connected to the connection terminal are provided as the graphic images of said connection terminal beforehand, and wherein when said image processor generates said graphic image composed selectively of a straight line and a curved line, said display changes the displayed graphic image of the connection terminal to which the graphic image composed of a straight line and a curved line is connected, from said second graphic to said first graphic.

21. A circuit design system according to claim 1, wherein waveguides the shape of which is predetermined are treated as said parts, and wherein the graphic image composed selectively of the straight line and the curved line of the waveguide is provided as a graphic image of the part beforehand.

22. A circuit design system according to claim 1, further including a directional compaction indicator for indicating directional compaction; a moving direction input logic for inputting a moving direction in response to an indication from the directional compaction indicator; a part indicator for indicating the graphic image of a part to be moved using directional compaction; a mathematics processor operative when the graphic image of the indicated part is moved in said moving direction to obtain the moving distance of the part with which the sum of the distances of the graphic images selectively using a straight line and a curved line connected between the graphic image of the part and the graphic image of another part is minimized; and a graphic image moving logic for moving the graphic image of said part on said display screen over the obtained moving distance in said moving direction.

23. A circuit design system according to claim 22, wherein said graphic image selectively using a straight line and a curved line is formed of a straight line and a circular arc, and wherein said mathematics processor assumes virtual circles having as first contacts the positions of the connection terminals of two parts that are connected together with the graphic image selectively using a straight line and a curved line, draws a virtual straight line contacting the two virtual circles to obtain second contacts between the straight line and said two virtual circles, determines the shape of the graphic image of said straight line based on the segment connecting said two second contacts together, determines the shapes of the graphics image of two circular arcs leading from said two connection terminals to the first contacts of said two virtual circles based on these two circular arcs, moves in said moving direction the virtual circles contacting the connection terminals of the parts to be moved to obtain the positions of the virtual circles with which a length of said graphic image selectively using a straight line and a curved line is minimized.

24. A circuit design system according to claim 23, wherein said system predetermines a plurality of specific positions along said moving direction, and obtains a shortest one of the graphics images selectively using a straight line and a curved line obtained when said virtual circles are moved to and placed at the plurality of specific positions.

25. A circuit design system according to claim 24, wherein an equation for obtaining the length of said graphic image selectively using a straight line and a curved line using the positions of said moved virtual circles as parameters is provided beforehand, and wherein the positions corresponding to minimal point of distances of said graphic images selectively using a straight line and a curved line which are determined by the equation, are said plurality of specific positions.

26. A circuit design system according to claim 1, further including a directional compaction indicator for indicating directional compaction; a moving direction input logic for inputting a moving direction in response to an indication from the directional compaction indicator; a part indicator for indicating the graphic images of a plurality of parts to be moved using directional compaction; a mathematics processor operative when the graphic images of the indicated a plurality of parts are moved in said moving direction to obtain the moving distance of the parts with which the sum of the distances of the graphic images selectively using a straight line and a curved line connected between the graphic image of each of the plurality of parts and the graphic image of another part is minimized; and a graphic image moving logic for moving the graphic images of the plurality of parts on said display screen over the obtained distance in said moving direction.

27. A circuit design system according to claim 1, further including a grouping indicator for indicating grouping and graphic images of a plurality of parts to be grouped, wherein said image processor includes a logic for integrating the plurality of indicated parts into a graphic image of a single part; a storage device for associating locational information indicating the layer positions of the graphic images of the plurality of parts that have been integrated, with the graphic images of the plurality of parts for storage; a part graphic image specifying unit for indicating the layer positions of the specified part graphic images; and a display controller for displaying the plurality of part graphic images associated with the indicated layer positions on said display screen based on the locational information on said storage device.

28. An image processing method for a circuit design system that represents as graphic images, a plurality of parts of a circuit and waveguides connecting connection terminals of the parts to lay out the graphic images on a display screen in order to lay out and design a circuit including a plurality of parts and said waveguides, comprising:

representing said waveguides as a graphic image selectively using a straight line and a curved line;

predetermining the correlationship among line information indicating shapes of said graphic images selectively using straight lines and curved lines, and positions and directions of two end points;

storing information representing said correlationships in a storage device in an image processor and indicating the positions and directions of two end points to said image processor in the form of the positions and the directions of the connection terminals of a part;

in said image processor, obtaining line information based on the indicated positions and directions of the two end points based on said stored correlationship information and generating a graphic image selectively using a straight line and a curved line indicated by the line information obtained; and associating the generated graphic image with said graphic image of the part to display it on said display screen; wherein said graphic image is formed of a straight line and a circular arc; and said image processor assumes two virtual circles having the positions of said connection terminals as first contacts, draws a virtual straight line contacting the two virtual circles to obtain two second contacts between the straight line and said two virtual circles, and forms said graphic image from a segment connecting said two second contacts together and two circular arcs leading from said two connection terminals to the first contacts of said two virtual circles.

29. An image processing method for a circuit design system according to claim 28, wherein when graphic images of a plurality of parts to be grouped is indicated to said image processor, said image processor integrates the plurality of indicated parts into a graphic image of a single part, associates locational information indicating the layer positions of the graphic images of the plurality of parts that have been integrated, with the graphic images of the plurality of parts, stores the information in the storage device, determines, based on the locational information in said storage device, whether the graphic images of the parts that are displayed on said display screen belong to the top layer, and adds to the displayed graphic images of the parts, information indicating whether the graphic images belong to the top layer, based on the results of the determination.

30. An image processing method for a circuit design system according to claim 29, including adding information indicating that the graphic images of said parts belong to the top layer by using for the graphic images, a color different from those of the graphic images of the other parts.

31. An image processing method for a circuit design system according to claim 28, wherein said waveguides propagate light and wherein said correlationships meet the optical constraints required of said waveguides.

32. An image processing method for a circuit design system according to claim 31, wherein said optical constraints are that the directions of said connection terminals are aligned with the directions of said end points and that a curvature of the curve of said graphic image is within an allowable range.

33. An image processing method for a circuit design system according to claim 31, wherein there are a plurality of graphic images determined by said correlationship and wherein said image processor excludes from selection those of the graphic images which overlap another.

34. An image processing method for a circuit design system according to claim 28, wherein when a connection terminal of the graphic image of a part to be registered and a position for registration are indicated, said image processor moves the graphic image of said part with the connection terminal in such a way that the connection terminal is placed at the indicated position.

35. An image processing method for a circuit design system according to claim 28, wherein said image processor accepts an indication of the number of said circular arcs and generates the graphic image including an indicated number of circular arcs.

36. An image processing method for a circuit design system according to claim 28, wherein said image processor accepts an indication of radii of curvature of said circular arcs and generates the graphic image including arcs with the indicated radii of curvature.

37. An image processing method for a circuit design system according to claim 28, wherein there are a plurality of graphic images determined by said correlationship and wherein said image processor calculates the lengths of the plurality of graphic images and determines the shortest graphic image as the one to be displayed.

38. An image processing method for a circuit design system according to claim 28, wherein said image processor accepts the geometries of said plurality of parts, wherein when the shape of a particular part is set, a first and a second geometry can be input, a correlationship being established between said first geometry and said second geometry beforehand, and wherein when either said first geometry or said second geometry is input, the value of the other geometry is obtained based on the input value and said correlationship.

39. An image processing method for a circuit design system according to claim 28, wherein there are a plurality of graphic images determined by said correlationship and wherein said image processor calculates a sum of angles subtended by circular arcs included in the plurality of graphic images and determines one of the graphic images with the minimum sum of the arc angles as the one to be displayed.

40. An image processing method for a circuit design system according to claim 28, wherein the image processor accepts an indication of a changed position on the display screen for said part and in response to the indication, changes said position on the display screen.

41. An image processing method for a circuit design system according to claim 40, wherein there is a correlationship between the position of said part and the positions of the connection terminals of the part, wherein said image processor determines whether said graphic image is connected to the connection terminal of the part for which the changed position has been indicated, and when the result of the determination is positive, obtains the changed position of said connection terminal and regenerates a graphic image selectively using a straight line and a curved line in such a way that it is connected to the connection terminal, based on the position of the part after change.

42. An image processing method for a circuit design system according to claim 41, wherein said changed position is generated by editing the graphic image of said part.

43. An image processing method for a circuit design system according to claim 41, wherein said changed position is generated by moving the graphic image of said part.

44. An image processing method for a circuit design system according to claim 41, wherein said changed position is generated by changing the shape of the graphic image of said part.

45. An image processing method for a circuit design system according to claim 28, wherein said image processor accepts an indication of grouping and graphic images of a plurality of parts to be grouped and integrates the graphic images of the indicated plurality of parts into a single graphic image.

46. An image processing method for a circuit design system according to claim 45, wherein said single graphic image includes a graphic image selectively using a straight line and a curved line connecting said graphic images of the parts together.

47. An image processing method for a circuit design system according to claim 45, wherein said image processor displays said single integrated graphic image instead of the graphic images of the parts present prior to the integration.

48. An image processing method for a circuit design system according to claim 45, wherein the same graphic images of the connection terminals of the plurality of parts that have been integrated are externally added to said single graphic image for display.

49. An image processing method for a circuit design system according to claim 45, wherein said image processor accepts an indication of ungrouping and graphic images of a plurality of parts to be ungrouped and internally stores layout information on the part graphic images that have been integrated when said single graphic image has been generated in response to said indication of grouping, and upon receiving an indication of ungrouping, recovers the graphic images of the plurality of parts present prior to the integration based on said internally stored layout information, followed by the display of the graphics of the recovered parts instead of said single graphic image.

50. An image processing method for a circuit design system according to claim 28, wherein said image processor guides and displays a plurality of different parts and part selection logic for selecting those of the plurality of different guided and displayed parts which are to be laid out in order to generate graphic images of the selected parts for display.

51. An image processing method for a circuit design system according to claim 50, wherein said image processor guides and displays graphic images indicating the shapes of said parts.

52. An image processing method for a circuit design system according to claim 50, wherein dimensional information indicating the shapes of the parts selected by said part selection logic is input to said image processor, and wherein said image processor shapes the graphic images of the selected parts based on the input dimensional information.

53. An image processing method for a circuit design system according to claim 52, wherein standard shapes of said selected parts are guided and displayed on said display screen using graphic images and numerical values, and wherein dimensional information used to modify the guided and displayed numerical values is input to said image processor.

54. An image processing method for a circuit design system according to claim 53, wherein the standard sizes of said graphic images have a fixed portion that allows no changes and a varying portion that allows changes, and wherein a modifying numerical value is input to the varying portion.

55. An image processing method for a circuit design system according to claim 28, wherein when cutting and the graphic image selectively using a straight line and a curved line to be cut are indicated to said image processor, in response to the indication, said display removes the graphic image composed selectively of the straight line and the curved line from the display screen.

56. An image processing method for a circuit design system according to claim 28, wherein when a display mode in which said graphic image selectively using a straight line and a curved line is displayed or a non-display mode in which said graphic image selectively using a straight line and a curved line is not displayed is indicated to said image processor, said image processor displays or does not display said graphic image selectively using a straight line and a curved line depending on the display mode indicated.

57. An image processing method for a circuit design system according to claim 28, wherein a conversion from the graphic image composed selectively of a straight line and a curved line into a waveguide graphic image indicating the shape of the waveguide is indicated to said image processor, in response to the indication, said image processor changes said graphic image composed of a straight line and a curved line to a predetermined waveguide graphic image for display.

58. An image processing method for a circuit design system according to claim 57, wherein when a conversion from said waveguide graphic image into said graphic image selectively using a straight line and a curved line is indicated to said image processor, in response to the indication, said image processor changes said waveguide graphic image to said graphic image composed selectively of the straight line and the curved line for display.

59. An image processing method for a circuit design system according to claim 57, wherein said waveguide graphic image is a graphic image indicating an offset of the waveguide.

60. An image processing method for a circuit design system according to claim 28, wherein a first graphic image indicating that said graphic image selectively using a straight line and a curved line is connected to the connection terminal and a second graphic image indicating that said graphic image selectively using a straight line and a curved line is not connected to the connection terminal are provided as the graphic images of said connection terminal beforehand, and wherein if said graphic image selectively using a straight line and a curved line is generated, said image processor changes the displayed graphic image of the connection terminal to which the graphic image selectively using a straight line and a curved line is connected, from said second graphic image to said first graphic image.

61. An image processing method for a circuit design system according to claim 28, wherein waveguides, the shape of which is predetermined, are treated as said parts, and wherein the graphic image selectively using a straight line and a curved line of the waveguide is provided as a graphic image of the part beforehand.

62. An image processing method for a circuit design system according to claim 28, wherein when directional compaction is indicated to said image processor, a moving direction is input in response to the indication, the graphic image of a part to be moved using directional compaction is indicated, and the graphic image of the indicated part is moved in said moving direction, then said image processor obtains the moving distance of the part with which the sum of the distances of the graphic images composed of the straight lines and curved lines connected between the graphic image of the part and the graphic image of another part is minimized and moves the graphic image of said part on said display screen over the obtained moving distance in said moving direction.

63. An image processing method for a circuit design system according to claim 62, wherein said graphic image selectively using a straight line and a curved line is formed of a straight line and a circular arc, and wherein said image processor assumes virtual circles having as first contacts the positions of the connection terminals of two parts that are connected together with the graphic image selectively using a straight line and a curved line, draws a virtual straight line contacting the two virtual circles to obtain second contacts between the straight line and said two virtual circles, determines the shape of the graphic image of said straight line based on the segment connecting said two second contacts together, determines the shapes of the graphic images of two circular arcs leading from said two connection terminals to the first contacts of said two virtual circles based on these two circular arcs, moves in said moving direction the virtual circles contacting the connection terminals of the parts to be moved to obtain the positions of the virtual circles with which the distance of said graphic image selectively using a straight line and a curved line is minimized.

64. An image processing method for a circuit design system according to claim 63, including predetermining a plurality of specific positions along said moving direction, and obtaining the shortest one of said graphic images composed selectively of the straight lines and the curved lines obtained when said virtual circles are moved to and placed at the plurality of specific positions.

65. An image processing method for a circuit design system according to claim 64, including providing beforehand an equation for obtaining the distance of said graphic image selectively using a straight line and a curved line using the positions of said moved virtual circles as parameters, wherein the positions corresponding to minimal point of distances of said graphic image selectively using a straight line and a curved line which are determined by the equation are said plurality of specific positions.

66. An image processing method for a circuit design system according to claim 28, wherein a plurality of specific directions can be specified for said image processor and wherein the plurality of directions are selectively indicated.

67. An image processing method for a circuit design system according to claim 66, wherein said image processor includes a graphical interface with a plurality of icons used to specify said plurality of directions and wherein said plurality of icons are assigned to said plurality of specific directions.

68. An image processing method for a circuit design system according to claim 67, wherein said plurality of icons are laid out within a single window, which can be moved on said display screen.

69. An image processing method for a circuit design system according to claim 66, wherein said plurality of specific directions are the horizontal direction in said display screen and the vertical direction in said display screen.

70. An image processing method for a circuit design system according to claim 28, wherein when directional compaction is indicated to said image processor, a moving direction is input in response to the indication, the graphic images of a plurality of parts to be moved using directional compaction are indicated, and the graphic images of the indicated plurality of parts are moved in said moving direction, then said image processor obtains the moving distance of the parts with which the sum of the distances of the graphic images selectively using straight lines and curved lines connected between the graphic image of each of the plurality of parts and the graphic image of another part is minimized, and moves the graphic images of the plurality of parts on said display screen over the obtained distance in said moving direction.

71. An image processing method for a circuit design system according to claim 70, wherein a plurality of specific directions can be specified for said image processor and wherein the plurality of directions are selectively indicated.

72. An image processing method for a circuit design system according to claim 71, wherein said image processor includes a graphical interface with a plurality of icons used to specify said plurality of directions and wherein said plurality of icons are assigned to said plurality of specific directions.

73. An image processing method for a circuit design system according to claim 72, wherein said plurality of icons are laid out within a single window, which can be moved on said display screen.

74. An image processing method for a circuit design system according to claim 71, wherein said plurality of specific directions are the horizontal direction in said display screen and the vertical direction in said display screen.

75. An image processing method for a circuit design system according to claim 28, wherein when graphic images of a plurality of parts to be grouped are indicated to said image processor, said image processor integrates the plurality of indicated parts into a graphic image of a single part, associates locational information indicating the layer positions of the graphic images of the plurality of parts that have been integrated, with the graphic images of the plurality of, and stores the information in the storage device, and wherein when graphic images of parts on said display screen and the layer positions of the specified part graphic images are indicated to said image processor, said image processor displays the plurality of part images associated with the indicated layer positions on said display screen based on the locational information on said storage device.

76. An image processing method for a circuit design system according to claim 75, wherein the layer indicated to said image processor is the next higher layer compared to the layer of the graphic images of the specified parts.

77. An image processing method for a circuit design system according to claim 75, wherein the layer indicated to said image processor is the next lower layer compared to the layer of the graphic images of the specified parts.

78. An image processing method for a circuit design system according to claim 75, wherein the layer indicated to said image processor is the top layer.

79. An image processing method for a circuit design system according to claim 75, wherein the layer indicated to said image processor is the bottom layer.

80. An image processing method for a circuit design system according to claim 28, wherein common information that is commonly used is input to said image processor, the input common information being stored in the a storage device, wherein design information on the design of a circuit is input to said image processor, the common information on said storage device is specified, and wherein said image processor treats the indicated common information as input design information.

81. An image processing method for a circuit design system according to claim 80, wherein said image processor accepts the input of said design information by accepting changes in given initial values, which comprise said common information.

82. An image processing method for a circuit design system according to claim 81, including predetermining optimization conditions for changing the shape of a laid-out graphic image selectively using a straight line and a curved line, wherein one of the graphic images selectively using straight lines and curved lines displayed on said display screen which is to be processed is specified, said image processor changes the shape of the specified graphic image selectively using a straight line and a curved line according to said optimization conditions, and based on the position of one of the two graphic images of parts connected to the graphic image selectively using a straight line and a curved line, re-arranges the graphic image selectively using a straight line and a curved line obtained after re-shaping and the other part connected to the graphic image selectively using a straight line and a curved line.

83. An image processing method for a circuit design system according to claim 82, wherein said graphic image selectively using a of the straight line and a curved line prior to the change is formed of a straight line and a circular arc, and wherein said image processor assumes virtual circles having as first contacts the positions of the connection terminals of two parts that are connected together with said graphic image selectively using a straight line and a curved line, draws a virtual straight line contacting the two virtual circles to obtain second contacts between the straight line and said two virtual circles, determines the shape of the graphic image of said straight line based on the segment connecting said two second contacts together, determines the shapes of the graphic images of two circular arcs leading from said two connection terminals to the first contacts of said two virtual circles based on these two circular arcs, and changes the shape of said graphic image selectively using a straight line and a curved line so that the length of the circular portion connected to said base part will be zero and that the direction of the connection terminal of the base part is aligned with the direction of said straight line.

84. An image processing method for a circuit design system according to claim 83, wherein said graphic image selectively using a straight line and a curved line prior to the change is formed of a straight and a circular arc, and wherein said system assumes virtual circles having as first contacts the positions of the connection terminals of two parts that are connected together with the graphic image selectively using a straight line and a curved line, draws a virtual straight line contacting the two virtual circles to obtain second contacts between the straight line and said two virtual circles, determines the shape of the graphic image of said straight line based on the segment connecting said two second contacts together, determines the shapes of the graphic images of two circular arcs leading from said two connection terminals to the first contacts of said two virtual circles based on these two circular arcs, and changes the shape of said graphic image selectively using a straight line and a curved line so that the length of the circular portion connected to said base part will be zero and that the directions of the connected portions of said two circular arcs will be aligned with each other.

85. A recording medium that can be set in a circuit design system including a computer and in which said computer reads and executes a program stored on the recording medium to lay out and design a circuit comprising a plurality of parts and waveguides connecting connection terminals of the plurality of parts together, represents the plurality of parts and waveguides as graphic images, and lays out the graphic images on a display screen, said program comprising:

a storing procedure for storing information of correlationship in a storage device, which is previously determined and shows the correlationship among line information showing a shape of a graphic image selectively using a straight line and a curved line, and positions and directions of two end points of the graphic image which represent a waveguide;

an indicating procedure for indicating the positions and directions of said two end points in the form of the positions and the directions of the connection terminals of said part;

a data processing procedure for obtaining line information based on the indicated positions and directions of the two end points based on the information of the correlationship stored in said storage device;

an image processing procedure for generating a graphic image selectively using a straight line and a curved line indicated by the line information obtained; and a display procedure for associating the generated graphic image composed selectively of the straight line and the curved line with the graphic image of the part for display; wherein said graphic image is formed of a straight line and a circular arc; and said image processing procedure assumes two virtual circles having the positions of said connection terminals as first contacts, draws a virtual straight line contacting the two virtual circles to obtain two second contacts between the straight line and said two virtual circles, and forms said graphic image from a segment connecting said two second contacts together and two circular arcs leading from said two connection terminals to the first contacts of said two virtual circles.

86. A recording medium according to claim 85, further including a common information input procedure for inputting common information that is commonly used; a storing procedure for storing the input common information; a design information input procedure for inputting design information on the design of a circuit; a common information specifying procedure for specifying common information in said storage device; and a data processing procedure for treating the indicated common information as design information input from said design information input procedure.

87. A recording medium according to claim 85, wherein optimization conditions for changing the shape of a laid-out graphic image composed selectively of a straight line and a curved line is predetermined, wherein said medium includes a graphic image specifying procedure for specifying one of the graphic images composed selectively of straight lines and curved lines displayed on said display screen which is to be processed, wherein the shape of the specified graphic image composed selectively of straight lines and curved lines is changed according to said optimization conditions, and wherein, based on the position of one of the two graphic images of parts connected to the graphic image composed of straight lines and curved lines, the graphic image composed selectively of the straight lines and curved lines obtained after re-shaping and the other part connected to the graphic image composed selectively of straight lines and curved lines are rearranged.

88. A recording medium according to claim 87, wherein said graphic image composed selectively of the straight lines and the curved lines prior to the change is formed of a straight line and a circular arc, and wherein the process assumes virtual circles having as first contacts the positions of the connection terminals of two parts that are connected together with the graphic image composed selectively of straight lines and curved lines, draws a virtual straight line contacting the two virtual circles to obtain second contacts between the straight line and said two virtual circles, determines the shape of the graphic image of said straight line based on the segment connecting said two second contacts together, determines the shapes of the graphic images of two circular arcs leading from said two connection terminals to the first contacts of said two virtual circles based on these two circular arcs, and changes the shape of said graphic image composed selectively of straight lines and curved lines so that the length of the circular portion connected to said base part will be zero and that the direction of the connection terminal of the reference part is aligned with the direction of said straight line.

89. A recording medium according to claim 87, wherein said graphic image composed selectively of straight lines and curved lines prior to the change is formed of a straight line and a circular arc, and wherein the process assumes virtual circles having as first contacts the positions of the connection terminals of two parts that are connected together with the graphic image composed selectively of straight lines and curved lines, draws a virtual straight line contacting the two virtual circles to obtain second contacts between the straight line and said two virtual circles, determines the shape of the graphic image of said straight line based on the segment connecting said two second contacts together, determines the shapes of the graphic images of two circular arcs leading from said two connection terminals to the first contacts of said two virtual circles based on these two circular arcs, and changes the shape of said graphic image composed selectively of straight lines and curved lines so that the length of the circular portion connected to said base part will be zero and that the directions of the connected portions of said two circular arcs will be aligned with each other.

90. A recording medium according to claim 85, wherein said waveguides propagate light and wherein said correlationship meets the optical constraints required of said waveguides.

91. A recording medium according to claim 90, wherein said optical constraints are that the directions of said connection terminals are aligned with the directions of said end points and that a curvature of the curve of said graphic image is within an allowable range.

92. A recording medium according to claim 85, further including a plurality of setting procedures for setting the geometries of said plurality of parts, wherein a particular one of the plurality of shape setting procedures comprises a first input procedure that can input a first geometry; a second input procedure that can input a second geometry, a correlationship being predetermined between said first geometry and said second geometry; and a calculation procedure operative when either said first input procedure or said second input procedure inputs a value to obtain a value to be input from the other input procedure based on the input value and said correlationship.

93. A recording medium according to claim 85, further including a connection terminal specifying procedure for indicating a connection terminal of the graphic image of a part to be registered; a position indicating procedure for indicating a position for registration; and an image-processing graphic image moving procedure for moving the graphic image of said part with the connection terminal in such a way that the connection terminal is placed at the indicated position.

94. A recording medium according to claim 85, further including a number indicating procedure for indicating the number of said circular arcs wherein said image processing procedure generates the graphic image including an indicated number of circular arcs.

95. A recording medium according to claim 85, further including a radius of curvature indicating procedure for indicating radii of curvature of said circular arcs and wherein said image processing procedure generates the graphic image including arcs with the indicated radii of curvature.

96. A recording medium according to claim 85, wherein there are a plurality of graphic images determined by said correlationship and wherein said image processing procedure calculates the lengths of the plurality of graphic images and determines the shortest graphic image as the one to be displayed.

97. A recording medium according to claim 85, wherein there are a plurality of graphic images determined by said correlationship and wherein said image processing procedure excludes from selection candidates those of the graphic images which overlap another.

98. A recording medium according to claim 85, wherein there are a plurality of graphic images determined by said correlationship and wherein said image processing procedure calculates a sum of angles subtended by circular arcs included in the plurality of graphic images and determines one of the graphic images with the minimum sum of the arc angles as the one to be displayed.

99. A recording medium according to claim 85, further including a changed position indicating procedure for indicating a changed position on the display screen for said part, wherein, in response to an indication from the indicating procedure, said image processing procedure changes said position on the display screen.

100. A recording medium according to claim 99, wherein there is a correlationship between the position of said part and the positions of the connection terminals of the part, wherein said system further includes a determination procedure responsive to an indication from said changed position indicating procedure to determine whether said graphic image is connected to the connection terminal of the part for which the changed position has been indicated, and wherein when the result of the determination is positive, said image processing procedure obtains the changed position of said connection terminal and regenerates a graphic image composed selectively of a straight line and a curved line in such a way that it is connected to the connection terminal, based on the position of the part after change.

101. A recording medium according to claim 85, further including a grouping indicating procedure for indicating grouping and images of a plurality of parts to be grouped, wherein said image processing procedure integrates the indicated graphic images of the plurality of parts into a single graphic.

102. A recording medium according to claim 101, wherein said single graphic image includes a graphic image composed selectively of a straight line and a curved line connecting said graphic images of the parts together.

103. A recording medium according to claim 101, wherein said display procedure displays said single integrated graphic image instead of the graphic images of the parts present prior to the integration.

104. A recording medium according to claim 101, wherein the same graphic images of the connection terminals of the plurality of parts that have been integrated are externally added to said single graphic image for display.

105. A recording medium according to claim 101, further including an ungrouping indicating procedure for indicating ungrouping and graphic images of parts to be ungrouped, wherein said image processing procedure internally stores layout information on the part graphic images that have been integrated when said single graphic image has been generated in response to the indication from said grouping indicating procedure, and wherein when said ungrouping indicating procedure indicates ungrouping, said image processing procedure recovers the graphic images of the plurality of parts present prior to the integration based on said layout information, with said display procedure displaying the graphic images of the recovered parts instead of said single graphic image.

106. A recording medium according to claim 85, further including a guide and display procedure for guiding and displaying a plurality of different parts and a part selection procedure for selecting those of the plurality of different guided and displayed parts which are to be laid out, wherein said image processing procedure generates graphic images of the selected parts for display.

107. A recording medium according to claim 106, wherein said guide and display procedure guides and displays graphic images indicating the shapes of said parts.

108. A recording medium according to claim 106, further including an input procedure for inputting dimensional information indicating the shapes of the parts selected by said part selection procedure, wherein said image processing procedure shapes the graphic images of the selected parts based on the input dimensional information.

109. A recording medium according to claim 108, further including a part guiding procedure for guiding and displaying standard shapes of the parts selected by said selection procedure using graphic images and numerical values, wherein said input means inputs dimensional information used to modify the guided and displayed numerical values.

110. A recording medium according to claim 109, wherein the standard sizes of said graphic images have a fixed portion that allows no changes and a varying portion that allows changes, and wherein said input procedure inputs a modifying numerical value to the varying portion.

111. A recording medium according to claim 85, further including a cut indicating procedure for indicating cutting and a graphic image composed selectively of the straight line and a curved line to be cut, wherein, in response to the indication, said display procedure removes the graphic image composed selectively of a straight line and a curved line from the display screen.

112. A recording medium according to claim 85, further including a graphic image display mode indicating procedure for indicating either a display mode in which a graphic image composed selectively of straight line and curved line is displayed or a non-display mode in which a graphic image composed selectively of a straight line and the curved line is not displayed, wherein said display procedure displays or does not display said graphic image composed of a straight line and a curved line depending on the display mode indicated by the graphic image display mode indicating procedure.

113. A recording medium according to claim 85, further including a waveguide graphic image conversion indicating procedure for indicating a conversion from a graphic image composed selectively of a straight line and a curved line into a waveguide graphic image indicating the shape of a waveguide, wherein, in response to the indication, said display procedure changes said graphic image composed selectively of a straight line and a curved line to a predetermined waveguide graphic image for display.

114. A recording medium according to claim 113, further including a linear graphic image conversion indicating procedure for indicating a conversion from said waveguide graphic image into a graphic image composed selectively of a straight line and a curved line, wherein, in response to the indication, said display procedure changes said waveguide graphic image to said graphic image composed selectively of a straight line and a curved line for display.

115. A recording medium according to claim 113, wherein said waveguide graphic image is a graphic image indicating an offset of the waveguide.

116. A recording medium according to claim 85, wherein a first graphic image indicating that a graphic image composed selectively of a straight line and the curved line is connected to the connection terminal and a second graphic image indicating that said graphic image composed selectively of a straight line and a curved line is not connected to the connection terminal are provided as the graphic images of said connection terminal beforehand, and wherein if said image processing procedure generates said graphic image composed selectively of a straight line and a curved line, said display procedure changes the displayed graphic image of the connection terminal to which the graphic image composed selectively of a straight line and a curved line is connected, from said second graphic image to said first graphic image.

117. A recording medium according to claim 85, wherein waveguides the shape of which is predetermined are treated as said parts, and wherein the graphic image composed selectively of a straight line and a curved line of the waveguide is provided as a graphic image of the part beforehand.

118. A recording medium according to claim 85, further including a directional compaction indicating procedure for indicating directional compaction; a moving direction input procedure for inputting a moving direction in response to an indication from the directional compaction indicating procedure; a part indicating procedure for indicating the graphic image of a part to be moved using directional compaction; a mathematics processing procedure operative when the graphic image of the indicated part is moved in said moving direction to obtain the moving distance of the part with which the sum of the distances of the graphic images selectively using a straight line and a curved line connected between the graphic image of the part and the graphic image of another part is minimized; and a graphic image moving procedure for moving the graphic image of said part on said display screen over the obtained distance in said moving direction.

119. A recording medium according to claim 118, wherein said graphic image selectively using a straight line and a curved line is formed of a straight line and a circular arc, and wherein said mathematics processing procedure assumes virtual circles having as first contacts the positions of the connection terminals of two parts that are connected together with the graphic image selectively using a of the straight line and a curved line, draws a virtual straight line contacting the two virtual circles to obtain second contacts between the straight line and said two virtual circles, determines the shape of the graphic image of said straight line based on the segment connecting said two second contacts together, determines the shapes of the graphic images of two circular arcs leading from said two connection terminals to the first contacts of said two virtual circles based on these two circular arcs, moves in said moving direction the virtual circles contacting the connection terminals of the parts to be moved to obtain the positions of the virtual circles with which the distance of said graphic image selectively using a straight line and a curved line is shortest.

120. A recording medium according to claim 119, wherein a plurality of specific positions along said moving direction are predetermined, and wherein the shortest one of said graphic images selectively using of a straight line and a curved line obtained when said virtual circles are moved to and placed at the plurality of specific positions is obtained.

121. A recording medium according to claim 120, wherein an equation for obtaining the distance of said graphic image selectively using a straight line and a curved line using the positions of said moved virtual circles as parameters is provided beforehand, and wherein the positions corresponding to minimal point of distances of said graphic image selectively using a straight line and a curved line which are determined by the equation are said plurality of specific positions.

122. A recording medium according to claim 85, further including a directional compaction indicating procedure for indicating directional compaction; a moving direction input procedure for inputting a moving direction in response to an indication from the directional compaction indicating procedure; a part indicating procedure for indicating graphic images of a plurality of parts to be moved using directional compaction; a mathematics processing procedure operative when the graphic images of the indicated plurality of parts are moved in said moving direction to obtain the moving distance of the parts with which the sum of the distances of the graphic images selectively using straight lines and curved lines connected between the graphic image of each of the plurality of parts and the graphic image of another part is minimized; and a graphic image moving procedure for moving the graphic images of the plurality of parts on said display screen over the obtained distance in said moving direction.

123. A recording medium according to claim 85, further including a grouping indicating procedure for indicating grouping and graphic images of a plurality of parts to be grouped, wherein said image processing procedure includes a procedure for integrating the plurality of indicated parts into a graphic image of a single part; a storing procedure for associating locational information indicating the layer positions of the graphic images of the plurality of parts that have been integrated, with the graphic images of the plurality of parts for storage; a part graphic image specifying means for indicating the layer positions of the specified part graphic images; and a display controlling procedure for displaying the plurality of part graphic images associated with the indicated layer positions on said display screen based on the locational information on said storage device.

124. A recording medium according to claim 85, further including a grouping indicating procedure for indicating grouping and graphic images of a plurality of parts to be grouped, wherein said image processing procedure includes a procedure for integrating the plurality of indicated parts into a graphic image of a single part; a storing procedure for associating locational information indicating the layer positions of the images of the plurality of parts that have been integrated, with the images of the plurality of parts for storage; a determination procedure for determining, based on the locational information in said storage device, whether the graphic images of the parts that are displayed on said display screen belong to the top layer; and a display controlling procedure for adding to the displayed graphic images of the parts information indicating whether the graphic images belong to the top layer, based on the results of the determination by the determination procedure.

* * * * *